US011322533B2

(12) United States Patent
Yamakawa

(10) Patent No.: US 11,322,533 B2
(45) Date of Patent: May 3, 2022

(54) SOLID STATE IMAGE SENSOR TOLERANT TO MISALIGNMENT AND HAVING A HIGH PHOTOELECTRIC CONVERSION EFFICIENCY

(71) Applicant: SONY CORPORATION, Tokyo (JP)

(72) Inventor: Shinya Yamakawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 100 days.

(21) Appl. No.: 14/773,269

(22) PCT Filed: Feb. 28, 2014

(86) PCT No.: PCT/JP2014/055008
§ 371 (c)(1),
(2) Date: Sep. 4, 2015

(87) PCT Pub. No.: WO2014/141900
PCT Pub. Date: Sep. 18, 2014

(65) Prior Publication Data
US 2016/0020237 A1 Jan. 21, 2016

(30) Foreign Application Priority Data
Mar. 14, 2013 (JP) .............................. JP2013-052076

(51) Int. Cl.
H01L 27/146 (2006.01)
H04N 5/374 (2011.01)
H04N 5/361 (2011.01)

(52) U.S. Cl.
CPC .... H01L 27/14612 (2013.01); H01L 27/1464 (2013.01); H01L 27/14603 (2013.01);
(Continued)

(58) Field of Classification Search
CPC ......... H01L 27/14603; H01L 27/14643; H01L 27/14609; H01L 27/14641; H01L 27/1464;
(Continued)

(56) References Cited

U.S. PATENT DOCUMENTS

2006/0145215 A1* 7/2006 Paik ................... H01L 27/14603
257/293
2008/0197387 A1* 8/2008 Itonaga ............. H01L 27/14609
257/292
(Continued)

FOREIGN PATENT DOCUMENTS

JP 2005-223084 A 8/2005
JP 2006-311515 A 11/2006
(Continued)

Primary Examiner — David Chen
(74) Attorney, Agent, or Firm — Chip Law Group

(57) ABSTRACT

There is provided a solid state image sensor including a photoelectric conversion unit formed and embedded in a semiconductor substrate, an impurity region that retains an electric charge generated by the photoelectric conversion unit, and a transfer transistor that transfers the electric charge to the impurity region. A gate electrode of the transfer transistor is formed in a depth direction toward the photoelectric conversion unit in the semiconductor substrate, from a surface of the semiconductor substrate on which the impurity region is formed. A channel portion of the transfer transistor is surrounded by the gate electrode in two or more directions other than a direction of the impurity region, as seen from the depth direction.

10 Claims, 41 Drawing Sheets

(52) U.S. Cl.
CPC .. *H01L 27/14614* (2013.01); *H01L 27/14638* (2013.01); *H01L 27/14641* (2013.01); *H01L 27/14643* (2013.01); *H01L 27/14647* (2013.01); *H01L 27/14689* (2013.01); *H04N 5/361* (2013.01); *H04N 5/374* (2013.01); *H01L 27/14621* (2013.01); *H01L 27/14627* (2013.01)

(58) Field of Classification Search
CPC ........... H01L 27/14689; H01L 27/1463; H01L 27/14614; H01L 27/14638; H01L 27/14612
USPC .......... 257/292, E27.131, E27.132, E27.133, 257/E31.073
See application file for complete search history.

(56) References Cited

U.S. PATENT DOCUMENTS

| | | | | |
|---|---|---|---|---|
| 2008/0210992 | A1* | 9/2008 | Kim | H01L 27/14609 257/292 |
| 2009/0166693 | A1* | 7/2009 | Kim | H01L 27/14603 257/292 |
| 2009/0251582 | A1 | 10/2009 | Oike | |
| 2010/0117126 | A1* | 5/2010 | Takahashi | H01L 27/14609 257/292 |
| 2010/0308385 | A1* | 12/2010 | Manda | H01L 27/14612 257/292 |
| 2011/0049590 | A1* | 3/2011 | Itonaga | H01L 27/14603 257/292 |
| 2011/0108897 | A1* | 5/2011 | Koo | H01L 27/14609 257/292 |
| 2012/0199882 | A1* | 8/2012 | Shin | H01L 27/14607 257/222 |
| 2013/0076934 | A1* | 3/2013 | Maeda | H01L 27/14603 348/222.1 |

FOREIGN PATENT DOCUMENTS

| | | |
|---|---|---|
| JP | 2007-503722 A | 2/2007 |
| JP | 2009-268083 A | 11/2009 |
| JP | 2010-114273 A | 5/2010 |
| JP | 2011-159756 A | 8/2011 |
| JP | 2012-004443 A | 1/2012 |
| JP | 2012-164971 A | 8/2012 |
| JP | 2013-026264 A | 2/2013 |

\* cited by examiner

SOLID STATE IMAGE SENSOR TOLERANT TO MISALIGNMENT AND HAVING A HIGH PHOTOELECTRIC CONVERSION EFFICIENCY

TECHNICAL FIELD

The present technology relates to a solid state image sensor, its manufacturing method, and an electronic device, and particularly to a solid state image sensor, its manufacturing method, and an electronic device that configure a solid state image sensor tolerant to misalignment during manufacturing and having a high conversion efficiency of photoelectric conversion.

BACKGROUND ART

In a solid state image sensor (image sensor) using semiconductor (Si), a photo diode (PD) utilizing p-n junction of semiconductor is known as a photoelectric conversion element that converts a received light to an electrical signal. The element utilizing a photo diode is mounted on many electronic devices, such as a digital camera, a video camera, a monitoring camera, a copy machine, and a facsimile.

In recent years, what is called CMOS solid state image sensor, which is manufactured by a complementary metal oxide semiconductor (CMOS) process including peripheral circuits, is used frequently as the solid state image sensor.

In this CMOS solid state image sensor, an electric charge accumulated in each pixel or each row of photo diode is read, and thus a difference occurs between the time periods during which optical charges are accumulated, which results in a distortion generated on an imaged subject when the subject is moving. To prevent the distortion of the subject, a global shutter function for performing light exposure simultaneously in all pixels is necessary.

As means for configuring the global shutter, there is a mechanical shutter method that provides a mechanical shutter. This method is a method in which the light that enters into the solid state image sensor is turned on and off by the mechanical shutter, so that light exposure is performed simultaneously in all pixels. The electric charge accumulated in the photo diode is read sequentially in the same way as the CMOS solid state image sensor of the past.

However, in the mechanical shutter method, the mechanical shutter is necessary, and thus reduction in size is difficult, and mechanical drive limits the shutter speed.

Thus, to compensate the drawback of the mechanical shutter method, an electrical global shutter method is reported (for example, Patent Literatures 1 to 3). In the electrical global shutter method, the electric charges accumulated in the photo diode are simultaneously and transiently transferred to electric charge accumulating parts with respect to all pixels, and the electric charges accumulated in the electric charge accumulating parts are read by scanning each row sequentially.

Here, the electric charge accumulating parts need to be shaded, to prevent the noise due to the photoelectric conversion during the period for reading the accumulation electric charges sequentially. Thus, the photo diode areas in all pixel regions are made smaller by the shaded region. Also, the electric charge accumulating parts and a pixel circuit unit are arranged close to the front side of the semiconductor substrate, there is a problem that the photo diode has a low aperture ratio.

To compensate this drawback, for example, Patent Literature 4 proposes a device that uses the electrical global shutter method and receives light with its back side, so that the light amount entering into the photo diode does not decrease by the shading film. Also, in Patent Literature 4, the light is prevented from entering into the electric charge accumulating part, by forming a shading film functioning as a photoelectric conversion film at a position close to the back side, to prevent the occurrence of the noise.

However, in the technology disclosed in Patent Literature 4, the photo diode is arranged on a top layer surface (surface) of the back side of the semiconductor substrate, and thus the photo diode area is difficult to be arranged.

Thus, for example, Patent Literatures 5, 6 report a technology that maximizes the photo diode area by allowing a light to enter from the back side of the semiconductor substrate and embedding the photo diode in the semiconductor.

CITATION LIST

Patent Literature

Patent Literature 1: JP 2007-503722T
Patent Literature 2: JP 2006-311515A
Patent Literature 3: JP 2009-268083A
Patent Literature 4: JP 2012-004443A
Patent Literature 5: JP 2005-223084A
Patent Literature 6: JP 2012-164971A

SUMMARY OF INVENTION

Technical Problem

FIG. 1 illustrates a pixel structure of a CMOS solid state image sensor described in Patent Literature 5.

A pixel 1 of the CMOS solid state image sensor illustrated in FIG. 1 is formed such that a photo diode 3 is embedded in a substrate of a p-type semiconductor substrate 2. The photo diode 3 includes a p-type semiconductor region (p+ region) 11 of a high impurity concentration formed at the front side of the semiconductor substrate 2, and an n-type semiconductor region 12 consisting of a high concentration impurity region (n+ region) 12A, which is in contact with the p-type semiconductor region 11, and a low impurity concentration region (n region) 12B formed in the depth direction toward the back side of the semiconductor substrate 2.

Then, at the front side of the semiconductor substrate 2, a gate electrode 5 of a transfer transistor for transferring electric charge to an n+ region 4 as a floating diffusion region (FD) is embedded in the depth direction from the substrate surface to the photo diode 3. The outer periphery of the gate electrode 5 is covered by a gate insulating film 6 such as a silicon dioxide film, for example.

In addition, a pixel separating region 8 and a gate electrode 9 of a reset transistor are formed at the front side of the semiconductor substrate 2, for example.

The p+ region 11 of the photo diode 3 is formed to maximize the electric charge capacity for accumulation in the photo diode 3, and a p-type semiconductor region (p− region) 13 of a lower impurity concentration than the p+ region 11 is formed in the vicinity of the gate electrode 5.

In this pixel structure, the electric charge accumulated in the photo diode 3 flows around the gate electrode 5, and creates a potential barrier when the p+ region 11 of the high impurity concentration is too close to the gate electrode 5 so as to cause a trouble in electric charge transfer. Thus, this pixel structure is vulnerable to the misalignment between the p+ region 11 of the high impurity concentration and the gate electrode 5 of the photo diode 3, and therefore it is necessary to dilute the concentration of the p+ region 11 of the high impurity concentration, or to arrange the p+ region 11 sufficiently away from the gate electrode 5. However, this makes the saturation electric charge amount of the photo diode 3 smaller.

Thus, FIG. 2 illustrates a pixel structure disclosed in Patent Literature 6, which is tolerant to the misalignment between the p+ region 11 of the high impurity concentration and the gate electrode 5 of the photo diode 3.

FIG. 2 A illustrates a cross-sectional view of the pixel 1, and FIG. 2 B illustrates a plan view of the pixel 1.

In this pixel structure, the gate electrode 5 is formed in a square shape, as seen in the depth direction, as illustrated in FIG. 2B, and the n+ region 4 is formed as a floating diffusion region (FD) inside the gate electrode 5. Thereby, the electric charge accumulated in the photo diode 3 flows inside the gate electrode 5 of a square shape, and thus is tolerant to the misalignment between the p+ region 11 of the high impurity concentration and the gate electrode 5 of the photo diode 3.

However, since the n+ region 4 as the floating diffusion region (FD) is surrounded by the gate electrode 5, the capacity between the floating diffusion region and the gate electrode 5 becomes large, deteriorating the conversion efficiency for converting the electric charge accumulated in the floating diffusion region to the output voltage.

The present technology is made in view of the above situation, to configure a solid state image sensor that is tolerant to misalignment during manufacturing and having a high conversion efficiency of photoelectric conversion.

Solution to Problem

A solid state image sensor according to a first embodiment of the present technology includes: a photoelectric conversion unit formed and embedded in a semiconductor substrate; an impurity region that retains an electric charge generated by the photoelectric conversion unit; and a transfer transistor that transfers the electric charge to the impurity region. A gate electrode of the transfer transistor is formed in a depth direction toward the photoelectric conversion unit in the semiconductor substrate, from a surface of the semiconductor substrate on which the impurity region is formed. A channel portion of the transfer transistor is surrounded by the gate electrode in two or more directions other than a direction of the impurity region, as seen from the depth direction.

A manufacturing method of a solid state image sensor according to the first embodiment of the present technology includes the steps of: forming a photoelectric conversion unit by embedding the photoelectric conversion unit in a semiconductor substrate; forming a gate electrode of a transfer transistor that transfers an electric charge generated by the photoelectric conversion unit, in a depth direction toward the photoelectric conversion unit in the semiconductor substrate, from a surface of the semiconductor substrate; and forming an impurity region that retains the electric charge transferred by the transfer transistor, on the surface of the semiconductor substrate. A channel portion of the transfer transistor is surrounded by the gate electrode in two or more directions other than a direction of the impurity region, as seen from the depth direction.

An electronic device according to the first embodiment of the present technology includes: a solid state image sensor including a photoelectric conversion unit formed and embedded in a semiconductor substrate, an impurity region that retains an electric charge generated by the photoelectric conversion unit, and a transfer transistor that transfers the electric charge to the impurity region. A gate electrode of the transfer transistor is formed in a depth direction toward the photoelectric conversion unit in the semiconductor substrate, from a surface of the semiconductor substrate on which the impurity region is formed. A channel portion of the transfer transistor is surrounded by the gate electrode in two or more directions other than a direction of the impurity region, as seen from the depth direction.

According to the first embodiment of the present technology, a photoelectric conversion unit is formed and embedded in a semiconductor substrate, a gate electrode of a transfer transistor that transfers an electric charge generated by the photoelectric conversion unit is formed in a depth direction toward the photoelectric conversion unit in the semiconductor substrate, from a surface of the semiconductor substrate, and an impurity region that retains the electric charge transferred by the transfer transistor is formed on the surface of the semiconductor substrate. A channel portion of the transfer transistor is surrounded by the gate electrode in two or more directions other than a direction of the impurity region, as seen from the depth direction.

A solid state image sensor according to a second embodiment of the present technology includes: a photoelectric conversion unit formed and embedded in a semiconductor substrate; a memory unit that retains an electric charge generated by the photoelectric conversion unit; a transfer transistor that transfers the electric charge to the memory unit; and a discharge transistor that discharges an unnecessary electric charge generated by the photoelectric conversion unit. A gate electrode of the transfer transistor and a gate electrode of the discharge transistor are adjacent to each other in parallel in a depth direction of the semiconductor substrate, via an insulating film or an impurity region having a higher impurity concentration than a channel portion which forms an electrical current path.

A manufacturing method of a solid state image sensor according to the second embodiment of the present technology includes the steps of: forming a photoelectric conversion unit by embedding the photoelectric conversion unit in a semiconductor substrate; forming a gate electrode of a transfer transistor that transfers to a memory unit an electric charge generated by the photoelectric conversion unit, and a gate electrode of a discharge transistor that discharges an unnecessary electric charge generated by the photoelectric conversion unit, in parallel in a depth direction from a surface of the semiconductor substrate, toward the photoelectric conversion unit in the semiconductor substrate; and forming an insulating film or an impurity region having a higher impurity concentration than a channel portion which forms an electrical current path, between the gate electrode of the transfer transistor and the gate electrode of the discharge transistor.

An electronic device according to the second embodiment of the present technology includes: a solid state image sensor including a photoelectric conversion unit formed and embedded in a semiconductor substrate, a memory unit that retains an electric charge generated by the photoelectric conversion unit, a transfer transistor that transfers the electric charge to the memory unit, and a discharge transistor that discharges an unnecessary electric charge generated by the photoelectric conversion unit. A gate electrode of the transfer transistor and a gate electrode of the discharge transistor are adjacent to each other in parallel in a depth direction of the semiconductor substrate, via an insulating film or an impurity region having a higher impurity concentration than a channel portion which forms an electrical current path.

According to the second embodiment of the present technology, photoelectric conversion unit is formed and embedded in a semiconductor substrate, a gate electrode of a transfer transistor that transfers to a memory unit an electric charge generated by the photoelectric conversion unit, and a gate electrode of a discharge transistor that discharges an unnecessary electric charge generated by the photoelectric conversion unit are formed in parallel in a depth direction from a surface of the semiconductor substrate, toward the photoelectric conversion unit, and an insulating film or an impurity region having a higher impurity concentration than a channel portion which forms an electrical current path is formed between the gate electrode of the transfer transistor and the gate electrode of the discharge transistor.

A solid state image sensor according to a third embodiment of the present technology includes: a photoelectric conversion unit formed and embedded in a semiconductor substrate; a memory unit that retains an electric charge generated by the photoelectric conversion unit; a transfer transistor that transfers the electric charge to the memory unit; and a discharge transistor that discharges an unnecessary electric charge generated by the photoelectric conversion unit. End portions, close to the photoelectric conversion unit, of a gate electrode of the transfer transistor and a gate electrode of the discharge transistor are located at adjacent positions in a formation plane of the photoelectric conversion unit. As a depth from a surface of the semiconductor substrate becomes shallower, the gate electrode of the transfer transistor and the gate electrode of the discharge transistor gradually get away from each other.

A manufacturing method of a solid state image sensor according to the third embodiment of the present technology includes the steps of: forming a photoelectric conversion unit by embedding the photoelectric conversion unit in a semiconductor substrate; and forming a gate electrode of a transfer transistor that transfers to a memory unit an electric charge generated by the photoelectric conversion unit, and a gate electrode of a discharge transistor that discharges an unnecessary electric charge generated by the photoelectric conversion unit, in a depth direction from a surface of the semiconductor substrate, toward the photoelectric conversion unit in the semiconductor substrate. End portions, close to the photoelectric conversion unit, of the gate electrode of the transfer transistor and the gate electrode of the discharge transistor are located at adjacent positions in a formation plane of the photoelectric conversion unit. As a depth from the surface of the semiconductor substrate becomes shallower, the gate electrode of the transfer transistor and the gate electrode of the discharge transistor gradually get away from each other.

An electronic device according to the third embodiment of the present technology includes: a solid state image sensor including a photoelectric conversion unit formed and embedded in a semiconductor substrate, a memory unit that retains an electric charge generated by the photoelectric conversion unit, a transfer transistor that transfers the electric charge to the memory unit, and a discharge transistor that discharges an unnecessary electric charge generated by the photoelectric conversion unit. End portions, close to the photoelectric conversion unit, of a gate electrode of the transfer transistor and a gate electrode of the discharge transistor are located at adjacent positions in a formation plane of the photoelectric conversion unit. As a depth from a surface of the semiconductor substrate becomes shallower, the gate electrode of the transfer transistor and the gate electrode of the discharge transistor gradually get away from each other.

According to the third embodiment of the present technology, a photoelectric conversion unit is formed and embedded in a semiconductor substrate, and a gate electrode of a transfer transistor that transfers to a memory unit an electric charge generated by the photoelectric conversion unit, and a gate electrode of a discharge transistor that discharges an unnecessary electric charge generated by the photoelectric conversion unit are formed in a depth direction from a surface of the semiconductor substrate, toward the photoelectric conversion unit. End portions, close to the photoelectric conversion unit, of the gate electrode of the transfer transistor and the gate electrode of the discharge transistor are located at adjacent positions in a formation plane of the photoelectric conversion unit. As a depth from the surface of the semiconductor substrate becomes shallower, the gate electrode of the transfer transistor and the gate electrode of the discharge transistor gradually get away from each other.

The solid state image sensor and the electronic device may be an independent device, or may be a module built in another device.

Advantageous Effects of Invention

According to the first to third aspect of the present technology, a solid state image sensor that is tolerant to misalignment during manufacturing and having a high conversion efficiency of photoelectric conversion is configured.

DESCRIPTION OF EMBODIMENTS

Figure 1:
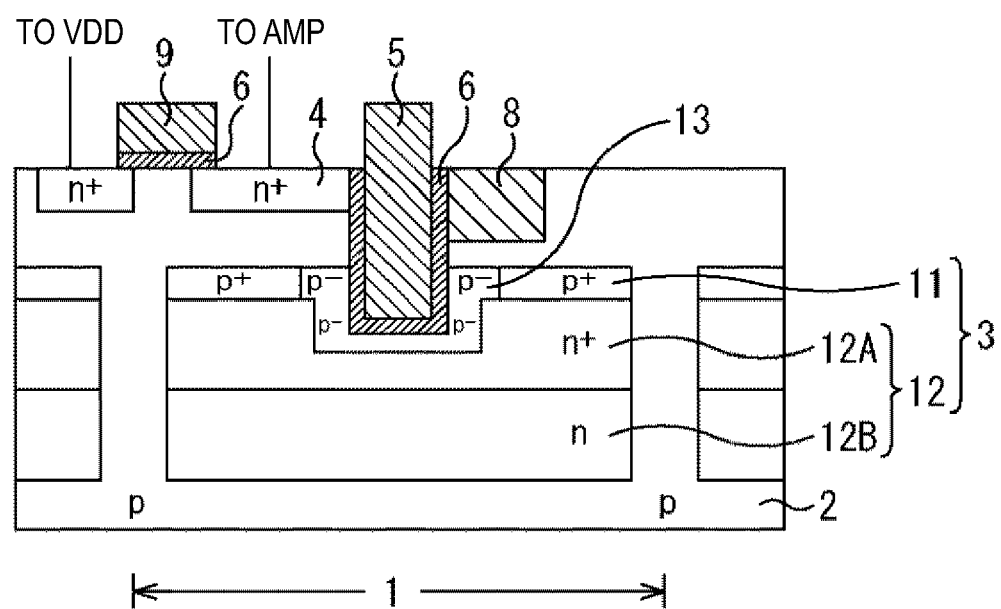
FIG. 1 is a diagram illustrating a pixel structure of past of a CMOS solid state image sensor.
Figure 2:
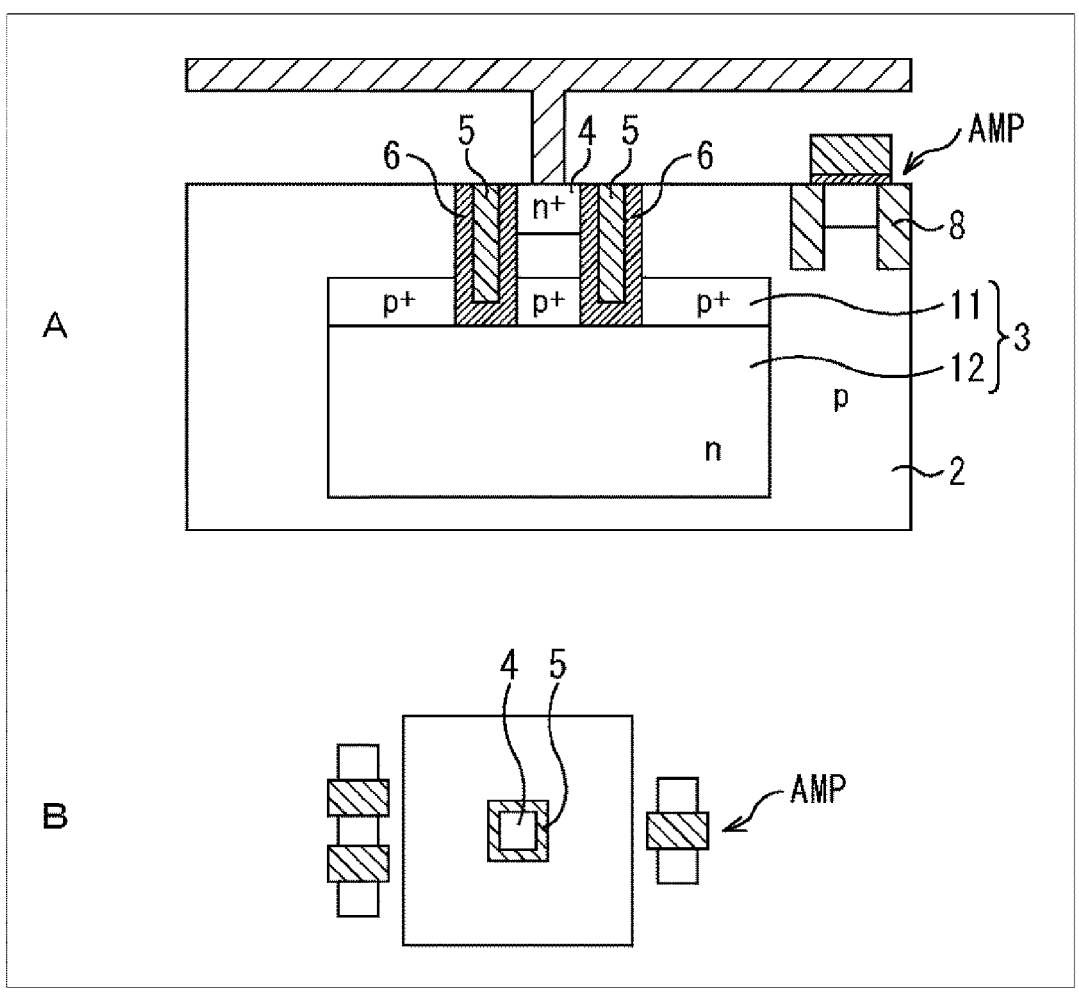
FIG. 2 is a diagram illustrating a pixel structure of past of a CMOS solid state image sensor.

In the following, embodiments for carrying out the present technology (hereinafter, referred to as embodiment) will be described. Note that, description will be made in the following order.
1. An overall configuration example of a solid state image sensor employing the present technology
2. First to sixth configurations of a pixel of a solid state image sensor
3. A manufacturing method of a pixel of the third configuration
4. Seventh to thirteenth configurations of a pixel of a solid state image sensor
5. A manufacturing method of a pixel of the seventh configuration
6. A manufacturing method of a pixel of the tenth configuration
7. An exemplary configuration of an electronic device employing the present technology <Overall Configuration Example of Solid State Image Sensor>

Figure 3:
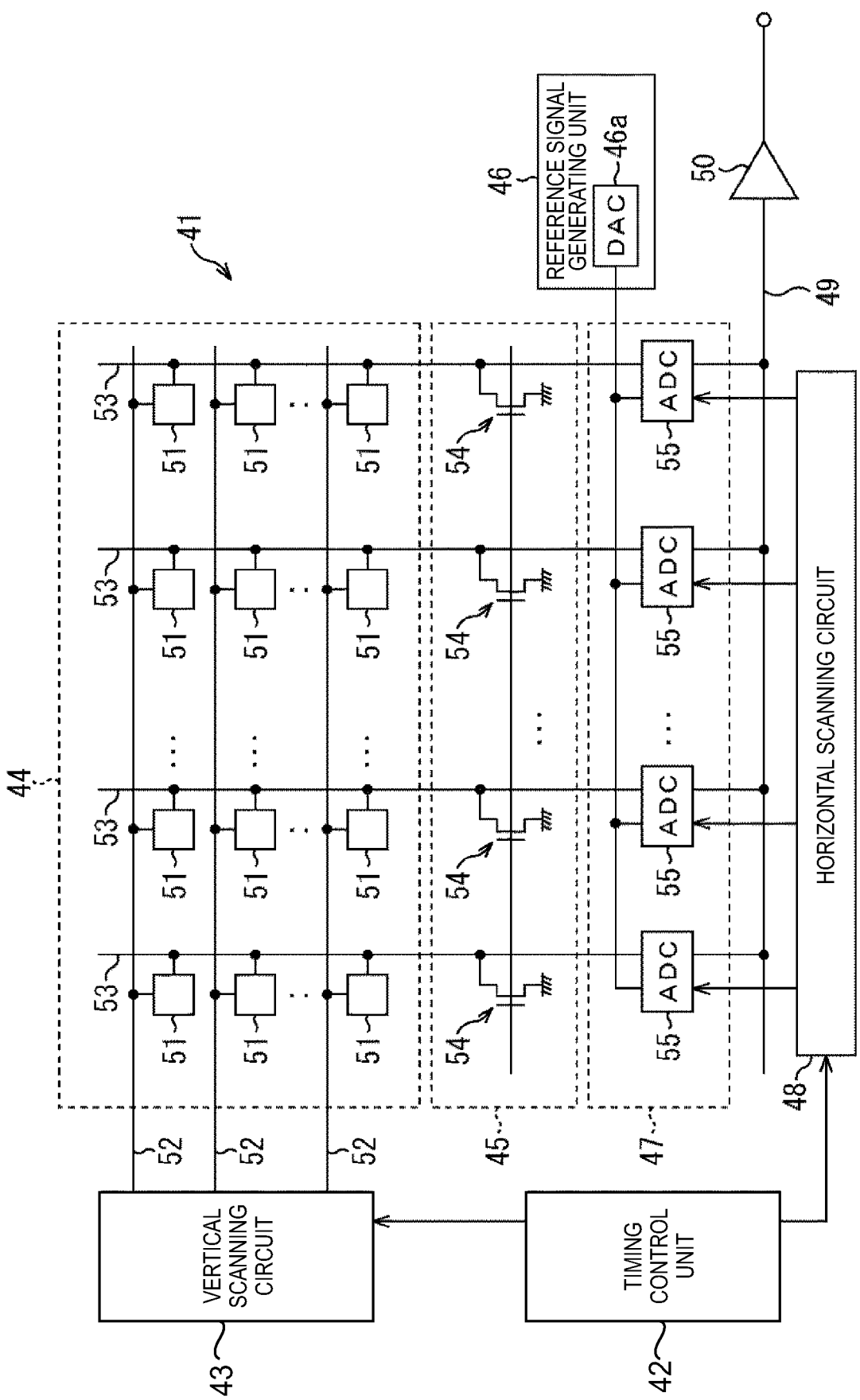
FIG. 3 is a block diagram illustrating an exemplary configuration of a solid state image sensor employing the present technology.

FIG. 3 is a block diagram illustrating an overall configuration example of a solid state image sensor employing the present technology.

The solid state image sensor 41 of FIG. 3 includes a timing control unit 42, a vertical scanning circuit 43, a pixel array unit 44, a constant electrical current source circuit unit 45, a reference signal generating unit 46, a column AD conversion unit 47, a horizontal scanning circuit 48, a horizontal output line 49, and an output circuit 50.

The timing control unit 42 supplies a clock signal and a timing signal necessary for a predetermined operation, to the vertical scanning circuit 43 and the horizontal scanning circuit 48, on the basis of the master clock of a predetermined frequency. For example, the timing control unit 42 supplies the timing signal of the shutter operation and the read operation of the pixels 51, to the vertical scanning circuit 43 and the horizontal scanning circuit 48. Also, although not depicted, the timing control unit 42 supplies the clock signal and the timing signal necessary for a predetermined operation, to the reference signal generating unit 46 and the column AD conversion unit 47 as well.

The vertical scanning circuit 43 sequentially supplies a signal for controlling the output of a pixel signal, to the pixels 51 arrayed in the vertical direction of the pixel array unit 44, at a predetermined time.

In the pixel array unit 44, a plurality of pixels 51 are located in a two-dimensional array manner (matrix manner).

A plurality of pixels 51 located in the two-dimensional array manner are connected, row by row, to the vertical scanning circuit 43 by the horizontal signal lines 52. In other words, a plurality of pixels 51 located on the same row in the pixel array unit 44 are connected to the vertical scanning circuit 43 by a same horizontal signal line 52. Although, in FIG. 3, the horizontal signal lines 52 are illustrated as a wired line, it is not limited to one line.

Also, a plurality of pixels 51 located in the two-dimensional array manner are connected, column by column, to the horizontal scanning circuit 48 by the vertical signal lines 53. In other words, a plurality of pixels 51 located on a same column in the pixel array unit 44 are connected to the horizontal scanning circuit 48 by a same vertical signal lines 53.

Each pixels 51 in the pixel array unit 44 outputs a pixel signal according to the electric charge accumulated in the inside, to the vertical signal line 53 in accordance with the signal supplied from the vertical scanning circuit 43 via the horizontal signal line 52. The detailed configuration of the pixels 51 will be described later with reference to FIG. 4, for example.

The constant electrical current source circuit unit 45 includes a plurality of load MOSs 54, and one load MOS 54 is connected to one vertical signal line 53. In the load MOSs 54, the bias voltage is applied to the gate, and the source is grounded, in order to configure a source follower circuit in cooperation with the transistors in the pixels 51 connected via the vertical signal lines 53.

The reference signal generating unit 46 includes a digital to analog converter (DAC) 46a, and generates a reference signal of a ramp waveform in response to the clock signal from the timing control unit 42, and supplies it to the column AD conversion unit 47.

The column AD conversion unit 47 includes a plurality of analog-digital converters (ADC) 25, which is provided one for each column of the pixel array unit 44. Thus, one vertical signal line 53 is connected to a plurality of pixels 51, one load MOS 54, and one ADC 55.

The ADC 55 performs correlated double sampling (CDS) on the pixel signal supplied from the pixels 51 of the same column via the vertical signal line 53, and further performs the AD conversion.

Each of ADCs 55 temporarily stores the pixel data after the AD conversion, and outputs it to the horizontal output line 49 in accordance with the control of the horizontal scanning circuit 48.

The horizontal scanning circuit 48 sequentially outputs the pixel data stored in a plurality of ADCs 55, to the horizontal output line 49 at a predetermined time.

The horizontal output line 49 is connected to the output circuit (amplifier circuit) 50, and the pixel data after AD conversion output from each ADC 55 is output to the outside of the solid state image sensor 1 from the output circuit 50 via the horizontal output line 49. In some cases, the output circuit 50 performs only buffering for example, and in other cases various types of digital signal processes, such as black level adjustment and column variation correction, are performed.

The solid state image sensor 41 configured as described above is a CMOS image sensor which is referred to as column AD type in which the ADC 55 that executes the CDS process and the AD conversion process is provided for each vertical column.

<First Configuration of Pixel 51>

Figure 4:
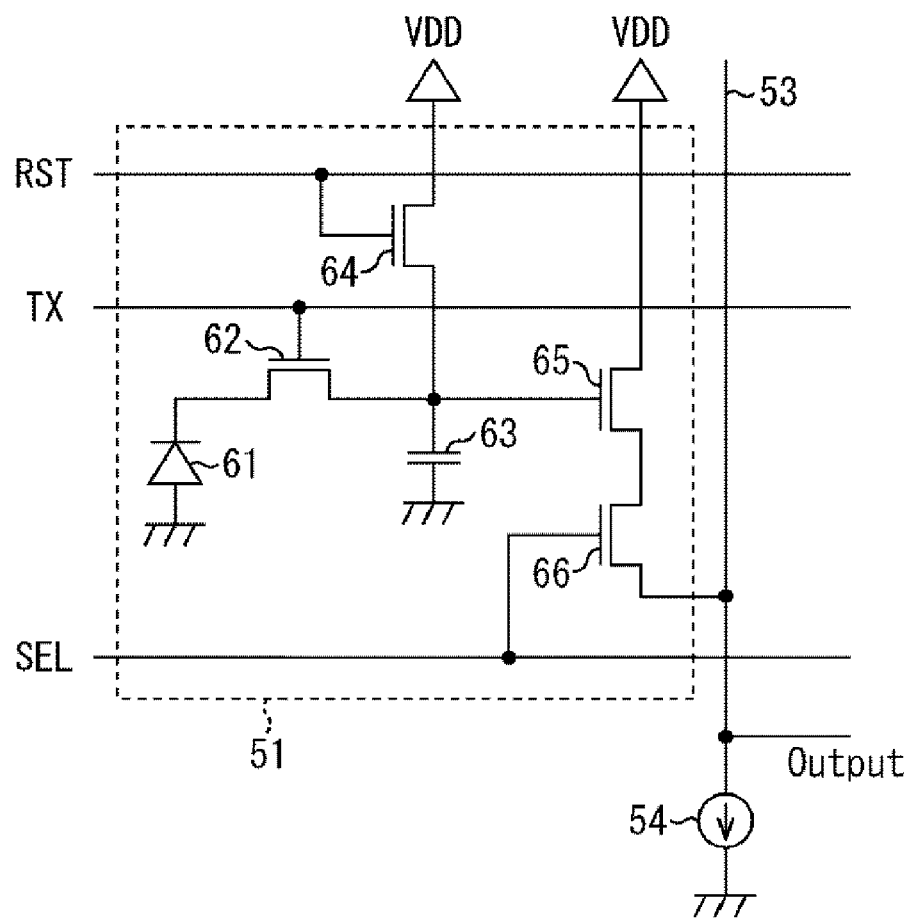
FIG. 4 is a diagram illustrating an equivalent circuit of a first configuration of a pixel.

FIG. 4 illustrates an equivalent circuit of a first configuration of the pixel 51.

The pixel 51 includes a photo diode 61 as a photoelectric conversion element, a transfer transistor 62, a floating diffusion region (FD) 63, a reset transistor 64, an amplification transistor 65, and a selection transistor 66.

The photo diode 61 is a photoelectric conversion unit that generates and accumulates electric charge (signal electric charge) according to the received light amount. In the photo diode 61, the anode terminal is grounded, and the cathode terminal is connected to the FD 63 via the transfer transistor 62.

When turned on by a transferred signal TX, the transfer transistor 62 reads the electric charge generated by the photo diode 61, and transfers it to the FD 63.

The FD 63 retains the electric charge read from the photo diode 61. When turned on by a reset signal RST, the reset transistor 64 resets the electric potential of the FD 63, by discharging the electric charge accumulated in the FD 63 to the constant voltage source VDD.

The amplification transistor 65 outputs a pixel signal according to the electric potential of the FD 63. That is, the amplification transistor 65 configures the load MOS 54 and the source follower circuit as the constant current source, and the pixel signal indicating a level according to the electric charge accumulated in the FD 63 is output to the ADC 55 via the selection transistor 66 from the amplification transistor 65.

The selection transistor 66 is turned on when the pixel 51 is selected by the selection signal SEL, and outputs the pixel signal of the pixel 51 to ADC 55 via the vertical signal line 53. The transferred signal TX, the reset signal RST, and the selection signal SEL are supplied from the vertical scanning circuit 43 via the horizontal signal line 52 (FIG. 3).

<Cross-Sectional View of Pixel 51 of First Configuration>

Figure 5:
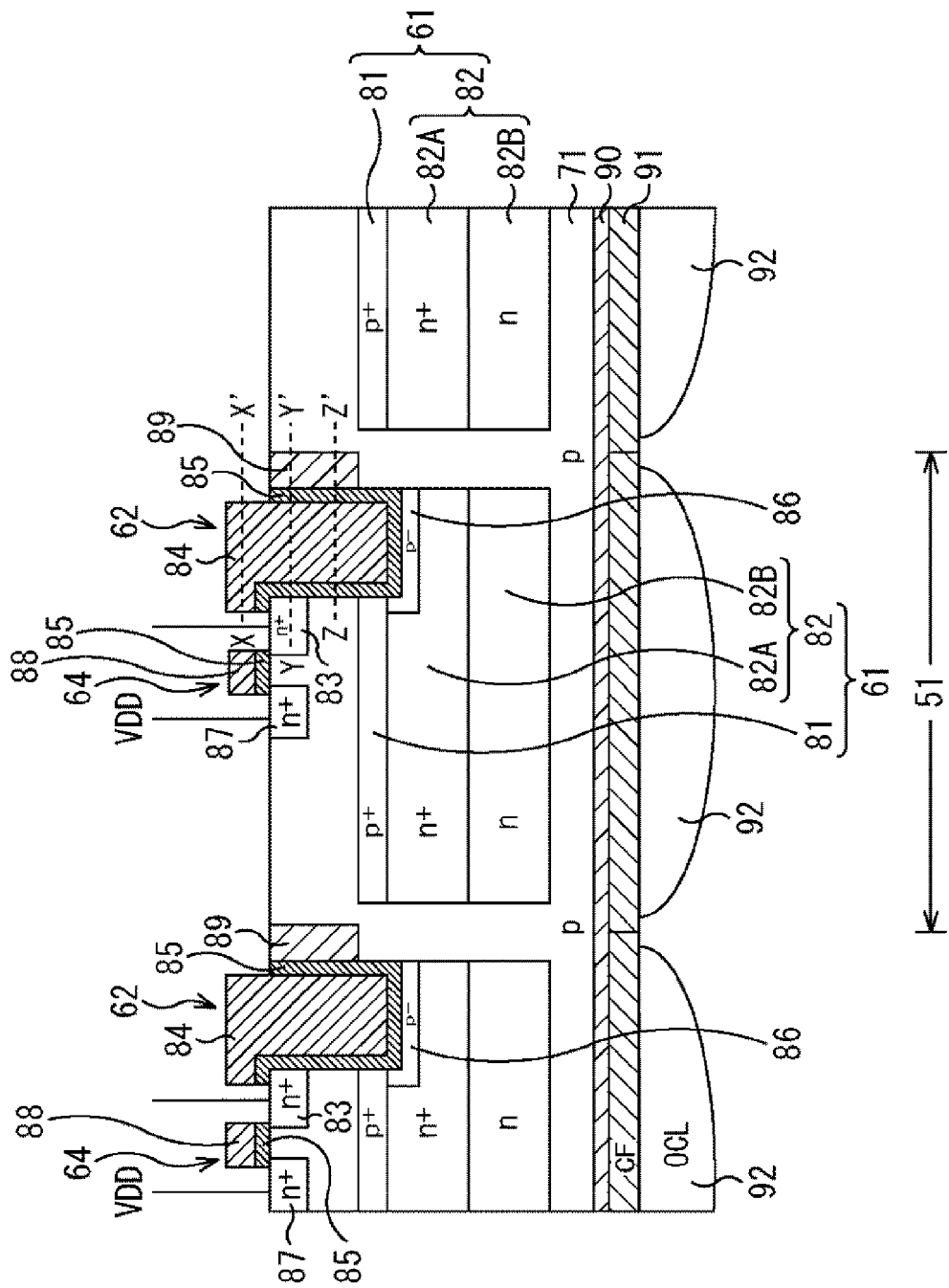
FIG. 5 is a cross-sectional view illustrating a structure of a pixel of a first configuration.

FIG. 5 is a cross-sectional view illustrating the structure of the pixel 51 of the first configuration illustrated in FIG. 4.

The pixel 51 is formed such that the photo diode 61 is embedded in the substrate of a first conductivity type, for example, p-type semiconductor substrate 71. The photo diode 61 is configured by a p-type semiconductor region (p+ region) 81 of the high impurity concentration formed at the front side of the semiconductor substrate 71, and a second conductivity type, for example, n-type semiconductor region (n-type semiconductor region) 82. The n-type semiconductor region 82 is configured by an n-type semiconductor region (n+ region) 82A of the high impurity concentration in contact with the p+ region 81, and an n-type semiconductor region (n region) 82B of the low impurity concentration formed in the deeper direction toward the back side of the semiconductor substrate 71 than the n-type semiconductor region 82A.

Then, at the front side of the semiconductor substrate 71, an n+ region 83 is formed as the FD 63, and a gate electrode 84 of the transfer transistor 62 for transferring the electric charge to the n+ region 83 is embedded in the depth direction from the substrate surface to the photo diode 61 in the semiconductor substrate 71. For example, the gate electrode 84 of the transfer transistor 62 formed of polysilicon is embedded to the same depth as the p-n junction plane between the p+ region 81 and the n+ region 82A of the photo diode 61. Note that the gate electrode 84 of the transfer transistor 62 may be embedded to a deeper position than the p-n junction plane, or a slightly shallower position than the p-n junction plane, depending on the concentration of the impurity region.

The outer circumference of the gate electrode 84 in the substrate of the transfer transistor 62 is covered by a gate insulating film 85, such as a silicon dioxide film, for example. In the lower portion of the gate electrode 84 of the transfer transistor 62, a p-type semiconductor region (p− region) 86 of a lower impurity concentration than the p+ region 81 is formed via the gate insulating film 85.

At the front side of the semiconductor substrate 71, an n+ region 87 is formed as one source-drain region of the reset transistor 64, and the n+ region 83 as the FD 63 serves as the other source-drain region of the reset transistor 64 as well. Then, the gate electrode 88 of the reset transistor 64 is formed at the upper portion between the n+ region 87 as one source-drain region of the reset transistor 64 and the n+ region 83 as the other source-drain region, via the gate insulating film 85.

The n+ region 83 as the FD 63 is connected to the gate electrode of the amplification transistor 65 via the interconnecting line of the undepicted upper portion, and the n+ region 87 as one source-drain region of the reset transistor 64 is connected to the constant voltage source VDD via the interconnecting line of the undepicted upper portion.

At the right side of the drawing which is the opposite side to the n+ region 83 as seen from the gate electrode 84 of the transfer transistor 62, a separation region 89 for separating each pixel 51 of the pixel array unit 44 is formed by an insulator such as oxide silicon, for example.

A flattening film 90 is formed at the back side of the semiconductor substrate 71, and a color filter 91 and an on-chip lens (OCL) 92 are formed in this order on the flattening film 90 (the downward direction of the drawing).

The pixel 51 having the above cross-sectional configuration has a structure of type having a back side exposed to light, in which the light enters from the back side of the semiconductor substrate 71 which is the downward direction of the drawing.

<Plan View of Pixel 51 of First Configuration>

Figure 6:
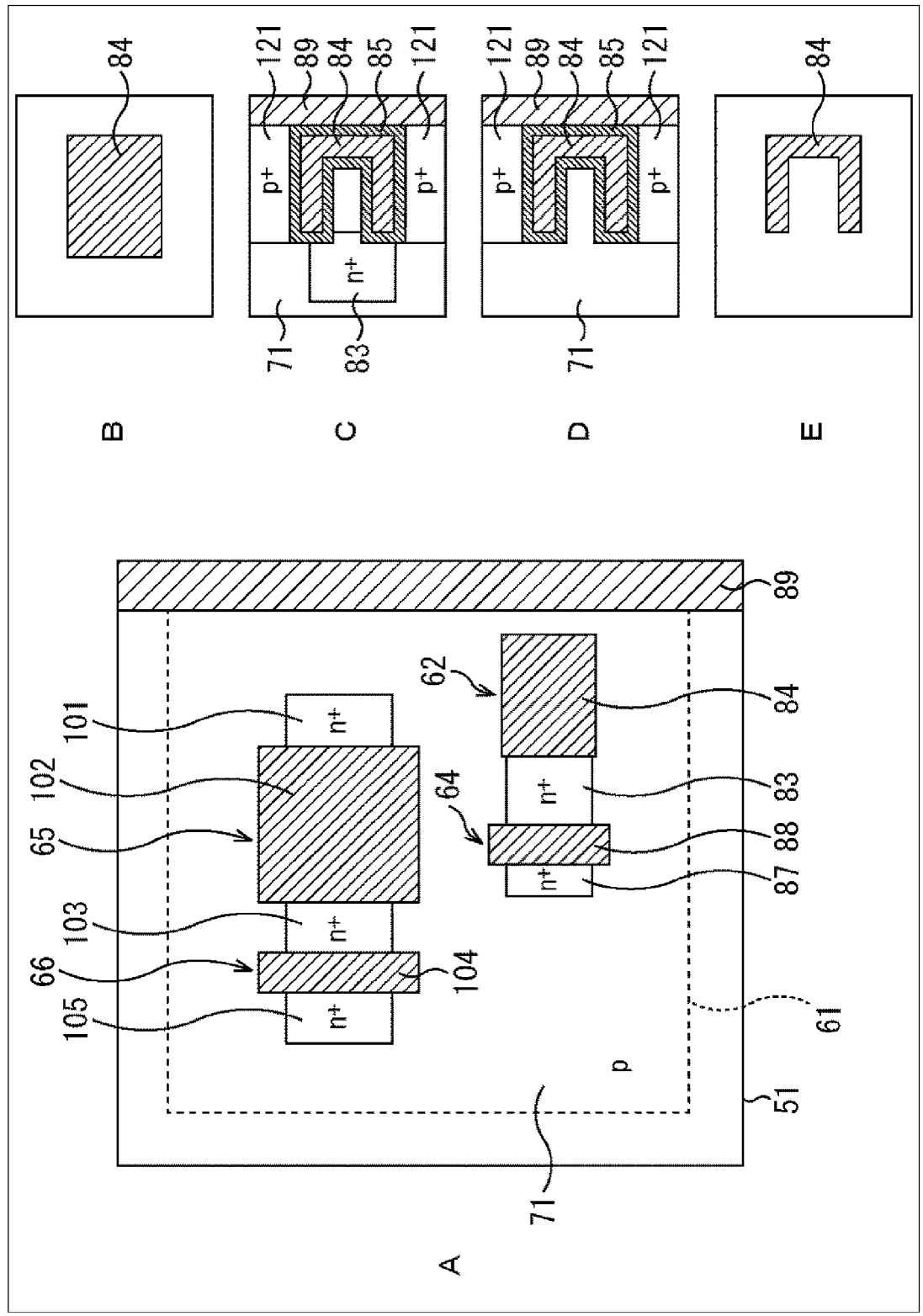
FIG. 6 is a plan view illustrating a structure of a pixel of a first configuration.

FIG. 6 A is a plan view of the surface of the semiconductor substrate 71 on which each transistor of the pixel 51 of the first configuration is formed, seen from upward.

As illustrated in FIG. 6 A, the transfer transistor 62 and the reset transistor 64 are formed in a shape that shares the n+ region 83 as one source-drain region of each.

Also, in another region different from the transfer transistor 62 and the reset transistor 64 of the pixel 51, the amplification transistor 65 and the selection transistor 66 are formed in a shape that shares the n+ region 103 as one source-drain region of each. More specifically, the amplification transistor 65 is configured by a gate electrode 102, and an n+ region 101 and an n+ region 103 located at the both sides, and the selection transistor 66 is configured by a gate electrode 104, and an n+ region 103 and an n+ region 105 located at the both sides.

Also, FIG. 6 B, FIG. 6 C, and FIG. 6 D are cross-sectional views of the vicinity of the transfer transistor 62 of the pixel 51, which are cut off by the X-X' line, the Y-Y' line, and the Z-Z' line of FIG. 5, respectively.

The transfer transistor 62 serves to connect the photo diode 61 embedded in the semiconductor substrate 71, with the n+ region 83 formed on the substrate surface as the FD 63.

In the cut surface of the Z-Z' line illustrated in FIG. 6 D, the gate electrode 84 of the transfer transistor 62 is formed in a U shape to surround three directions. The outer circumference of the gate electrode 84 of the U shape is covered by the gate insulating film 85.

A p-type semiconductor region (the p+ region) 121 of the high impurity concentration is formed at the upper side and the lower side of the drawing of the gate electrode 84 via the gate insulating film 85, and the separation region 89 is formed at the right side of the drawing of the gate electrode 84, using an insulator such as oxide silicon, for example.

Note that all of three directions of the upper side, the lower side, and the right side of the drawing of the gate electrode 84 via the gate insulating film 85 may be the p+ region 121 or the separation region 89.

In view of the cut surface of the Y-Y' line illustrated in FIG. 6 C, the n+ region 83 is formed as the FD 63 in the opening direction of the gate electrode 84 of the U shape. When a predetermined control voltage is applied to the gate electrode 84 of the transfer transistor 62, a channel portion, which forms the electrical current path, is formed at the inside of the U shape of the gate electrode 84 formed in the depth direction. The concentration (p) of the impurity region which forms the channel portion is lower than the impurity concentration (p+ of the p+ region 121) of an outside of the gate electrode 84.

FIG. 6 B is a cross-sectional view of the further upper side than the substrate surface on which the n+ region 83 is formed as the FD 63. As illustrated in FIG. 6 B, at the upper side than the substrate surface, the gate electrode 84 is formed in the shape that covers the channel portion inside the U shape as well.

Note that, as illustrated in FIG. 6 E, the gate electrode 84 may be formed in the U shape, in the same way as the substrate inside, at the upper side than the substrate surface as well.

As above, the gate electrode 84 of the transfer transistor 62 is formed in the depth direction in the U shape, as seen from the depth direction, so that the channel portion which forms the electrical current path contacts the gate electrode 84 via the gate insulating film 85 from three directions, improving the controllability of the electric field and performing the transfer of the electric charge smoothly.

In particular, even when the p+ region 81 formed at the upper portion of the photo diode 61 is formed at the vicinity of the gate electrode 84 as illustrated in FIG. 5, the electric charge converted photoelectrically by the modulation effect by the gate electrode 84 of the U shape is carried efficiently to the n+ region 83 which is the FD 63.

Thus, even if a misalignment occurred between the p+ region 81 and the gate electrode 84 formed at the upper portion of the photo diode 61 in the manufacture procedure of the solid state image sensor 41, robust transfer would be achieved.

Also, there is no concern about the misalignment between the p+ region 81 and the gate electrode 84, and therefore the impurity concentration of the p+ region 81 is made high, and the saturation electric charge amount is increased by enlarging the p-n junction capacity value of the photo diode 61.

<Exemplary Variant of Gate Electrode Shape>

Figure 7:
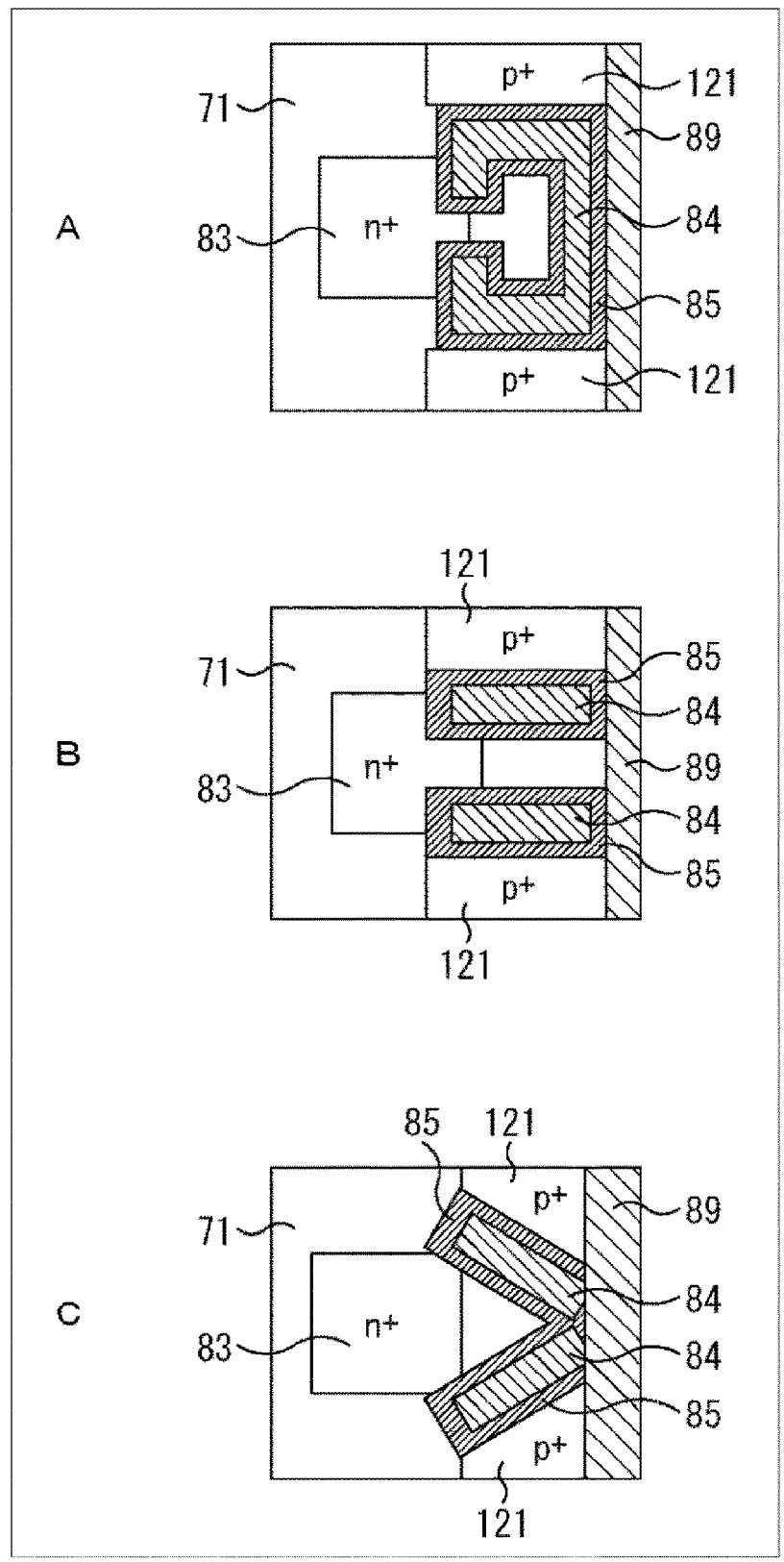
FIG. 7 is a diagram illustrating an exemplary variant of a gate electrode shape.

FIG. 7 A to FIG. 7 C illustrate exemplary variants of the shape of the gate electrode 84 of the transfer transistor 62. Note that each of FIG. 7 A to FIG. 7 C is the cross-sectional view when cutting off by the Y-Y' line of FIG. 5, in the same way as FIG. 6 C.

In FIG. 7 A, the width of one direction to which the gate electrode 84 of the U shape opens is made narrower than the shape illustrated in FIG. 6 C. As described above, the opening width of the gate electrode 84 is made narrow, to further improve the potential controllability of the channel portion, and further weaken the effect of the potential barrier formation by the p+ region 81 of the photo diode 61, thereby transferring the electric charge stably.

Also, in FIG. 7 B, the gate electrode 84 of the transfer transistor 62 does not have the U shape surrounding three directions, but opens at the n+ region 83, which is the FD 63, and the separation region 89, to form a "=" shape that include two parallel plate. In this case, the potential controllability of the channel portion is slightly inferior to the U shape, but the manufacturability improves because of the simple shape of the gate electrode 84.

The gate electrode 84 of FIG. 7 C is formed such that two plate interval, same as FIG. 7 B, is wide in the n+ region 83 which is the FD 63 and is narrow in the separation region 89, so as to arrange in a funnel-like shape. In this case as well, the separation region 89 is closed by the gate electrode 84, and the n+ region 83 is opened, and therefore the controllability of the electric field increases, performing the transfer of the electric charge smoothly.

Note that the flat surface shape of the gate electrode 84 of the transfer transistor 62 as seen from the depth direction is not limited to the U shape illustrated in FIG. 6 and the shapes illustrated in FIG. 7 A to FIG. 7 C, but may be a shape that opens toward the n+ region 83 which is the FD 63 at least, and the potential controllabilities of other three directions are higher than that of the opening side.

Also, the upper side than the substrate surface correspond to the cross section of the X-X' line of FIG. 5 may have the same shape as the shape in the substrate illustrated in FIG. 7 A to FIG. 7 C, or the shape that covers the channel portion as illustrated in FIG. 6 B.

<Second Configuration of Pixel 51>

Figure 8:
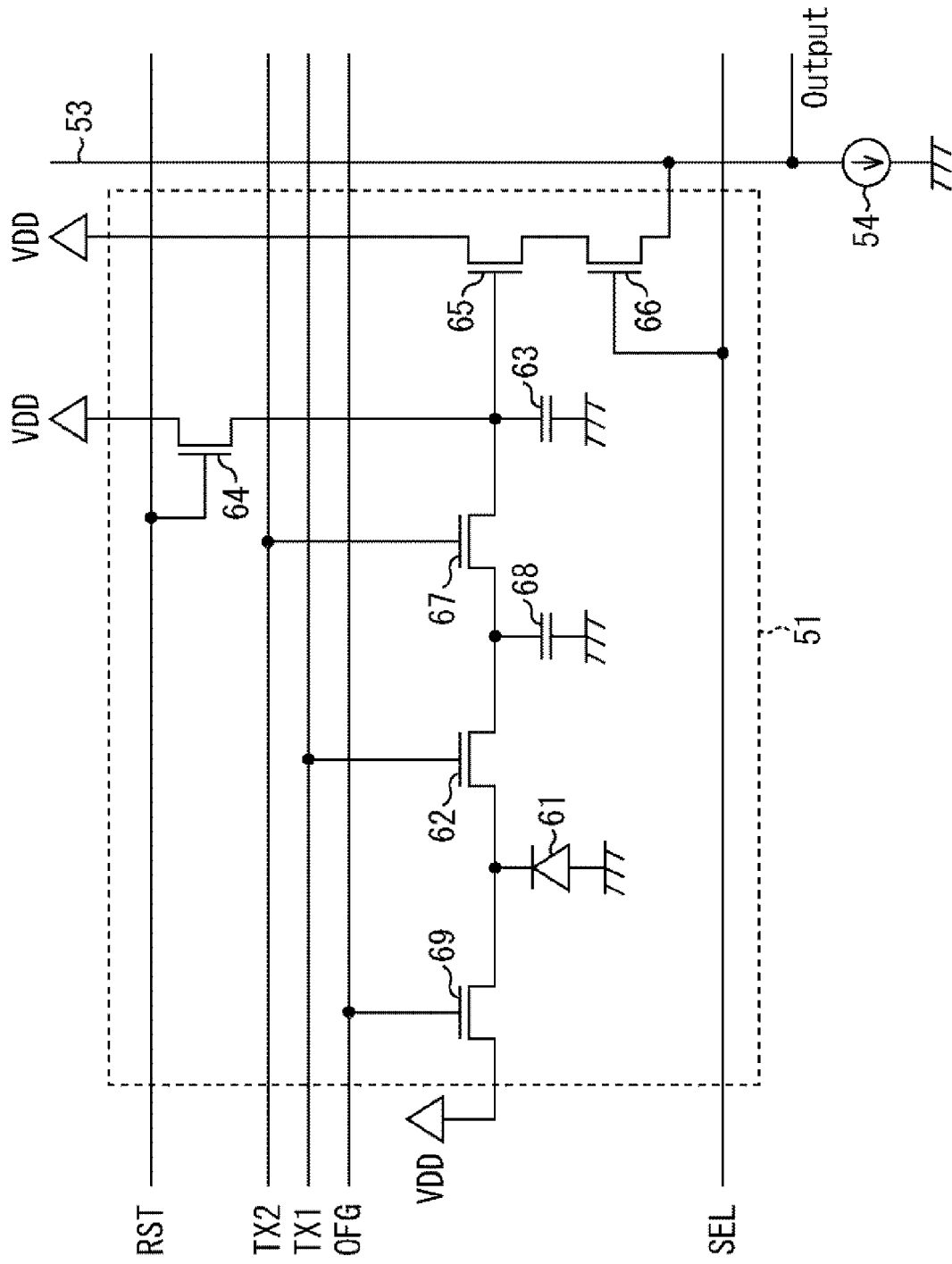
FIG. 8 is a diagram illustrating an equivalent circuit of a second configuration of a pixel.

FIG. 8 illustrates an equivalent circuit of the second configuration of the pixel 51.

The pixel 51 illustrated in FIG. 8 illustrates a pixel configuration for realizing the electronic global shutter function. Note that, in FIG. 8, parts corresponding to FIG. 4 are denoted with the same reference signs, and their description will be omitted as appropriate.

As compared to the above pixel 51 of the first configuration, the pixel 51 of the second configuration further includes another transfer transistor 67 for transferring the electric charge, and the memory unit (MEM) 68 that temporarily retains the electric charge before transferring the electric charge to the FD 63, between the transfer transistor 62 and the FD 63. In the following, the transfer transistor 62 is referred to as the first transfer transistor 62, and the transfer transistor 67 is referred to as the second transfer transistor 67.

Also, in the pixel 51 of the second configuration, the photo diode 61 is newly connected to the discharge transistor 69 for discharging the unnecessary electric charge.

The operation of the pixel 51 of FIG. 8 will be described briefly.

First, before starting the light exposure, a discharge signal OFG of high level is supplied to the discharge transistor 69 to turn on the discharge transistor 69, and the electric charge accumulated in the photo diode 61 is discharged to the constant voltage source VDD to reset the photo diode 61.

When the discharge transistor 69 is turned off by the discharge signal OFG of low level after the reset of the photo diode 61, the light exposure is started at all pixels.

When a predetermined light exposure time set in advance is elapsed, the first transfer transistor 62 is turned on by the first transferred signal TX1, and the electric charge accumulated in the photo diode 61 is transferred to the memory unit 68, in all pixels of the pixel array unit 44.

After the first transfer transistor 62 is turned off, the row unit reads out the electric charge retained in the memory unit 68 of each pixel 51 to the ADC 55 sequentially. The read operation is same as the above first configuration, and the second transfer transistor 67 of the pixel 51 of the read row is turned on by the second transferred signal TX2, and the electric charge retained in the memory unit 68 is transferred to the FD 63. Then, the selection transistor 66 is turned on by the selection signal SEL, so that a signal indicating the level according to the electric charge accumulated in the FD 63 is output to the ADC 55 via the selection transistor 66 from the amplification transistor 65.

<Cross-Sectional View of Pixel 51 of Second Configuration>

Figure 9:
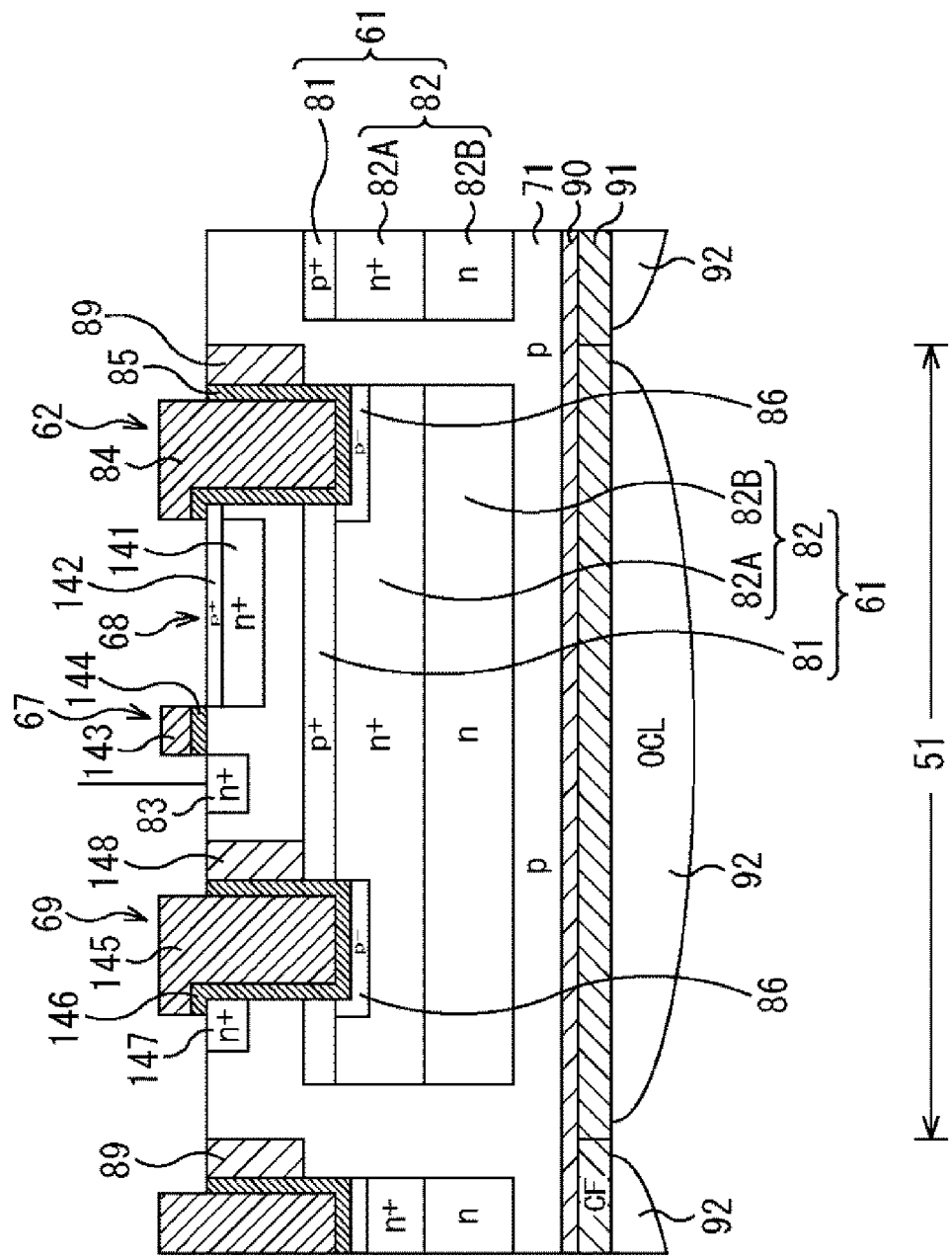
FIG. 9 is a cross-sectional view illustrating a structure of a pixel of a second configuration.

FIG. 9 is a cross-sectional view illustrating the structure of the pixel 51 of the second configuration illustrated in FIG. 8.

In each drawing in or after FIG. 9 as well, parts corresponding to the above diagram are denoted with the same reference signs, and their description will be omitted as appropriate.

In the cross-sectional view of the pixel 51 of FIG. 9, on the substrate surface of the p-type semiconductor substrate 71, the memory unit 68 is formed between the gate electrode 84 of the first transfer transistor 62 and the n+ region 83 as one source-drain region of the second transfer transistor 67.

The memory unit 68 is formed in the n-type semiconductor region (the n+ region) 141 of the high impurity concentration which accumulates the electric charge, and the p-type layer 142 for reducing the dark current is formed on the top face.

Also, at the opposite side to the side at which the first transfer transistor 62 of the memory unit 68 is located, the gate electrode 143 of the second transfer transistor 67 is formed on the substrate surface via the gate insulating film 144.

At the opposite side to the memory unit 68 of the second transfer transistor 67, the n+ region 83 is formed as the FD 63.

At another region of the upper side of the photo diode 61 where the gate electrode 84, the memory unit 68, the second transfer transistor 67, and the n+ region 83 as the FD 63 of the first transfer transistor 62 are not formed, a gate electrode 145 of the discharge transistor 69 is embedded to the same depth as the p-n junction plane of the photo diode 61 in the same way as the gate electrode 84 of the first transfer transistor 62.

The outer circumference of the gate electrode 145 in the substrate of the discharge transistor 69 is covered by the gate insulating film 146, such as the silicon dioxide film, for example. At the lower portion of the gate electrode 145 of the discharge transistor 69, the p-type semiconductor region (the p− region) 86 of a lower impurity concentration than the p+ region 81 is formed via the gate insulating film 146.

An n+ region 147 as one source-drain region of the discharge transistor 69 is formed on the surface of the semiconductor substrate 71 of the left side in the drawing of the gate electrode 145 of the discharge transistor 69. Also, at the opposite side to the n+ region 147 of the gate electrode 145 of the discharge transistor 69, a separation region 148 is formed by the insulator, such as the oxide silicon for example.

The shape of the gate electrode 145 of the discharge transistor 69 as seen from the depth direction is a U shape in the same way as the shape of the gate electrode 84 of the first transfer transistor 62 illustrated in FIG. 6 B to FIG. 6 D. Also, the periphery in the plan view direction of the gate electrode 145 of the discharge transistor 69 is formed in the p+ region 121 and the separation region 148, in the same way as the gate electrode 84 of the first transfer transistor 62.

<Plan View of Pixel 51 of Second Configuration>

Figure 10:
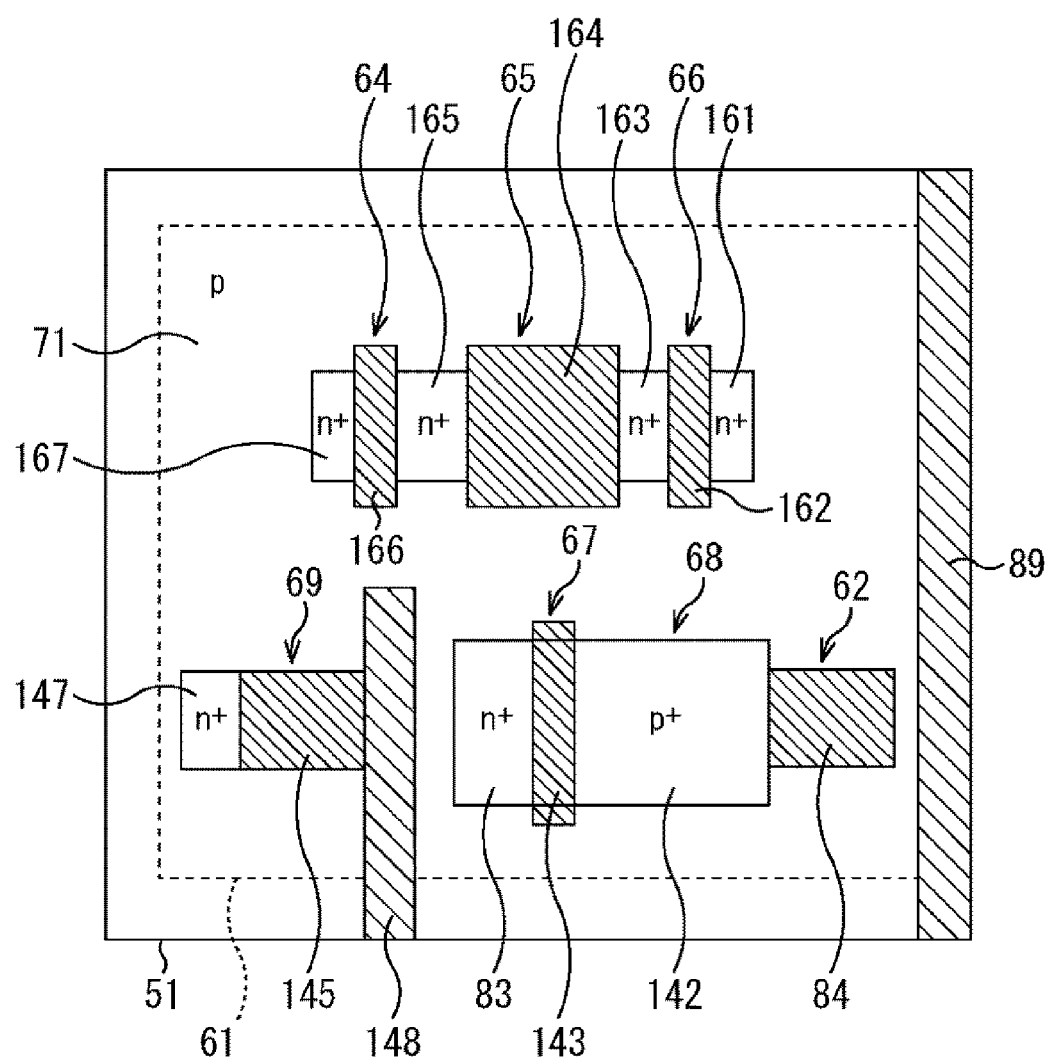
FIG. 10 is a plan view illustrating a structure of a pixel of a second configuration.

FIG. 10 is the plan view of the substrate surface on which each transistor of the pixel 51 of the second configuration is formed, as seen from upward.

As illustrated in FIG. 10, in a predetermined region of the pixel 51, the first transfer transistor 62, the memory unit 68, the second transfer transistor 67, and the n+ region 83 as the FD 63 are located in juxtaposition.

Also, in another region of the pixel 51, the gate electrode 145 of the discharge transistor 69, the n+ region 147 which is one of the source-drain regions, and the separation region 148 are located.

Further, in another region of the pixel 51, the selection transistor 66, the amplification transistor 65, and the reset transistor 64 are located in juxtaposition, sharing one source-drain region with another adjacent transistor. More specifically, the selection transistor 66 is configured by the gate electrode 162, and the n+ region 161 and the n+ region 163 located at the both sides, and the amplification transistor 65 is configured by the gate electrode 164, and the n+ region 163 and the n+ region 165 located at the both sides, and the reset transistor 64 is configured by the gate electrode 166, and the n+ region 165 and the n+ region 167 located at the both sides.

<Third Configuration of Pixel 51>

Figure 11:
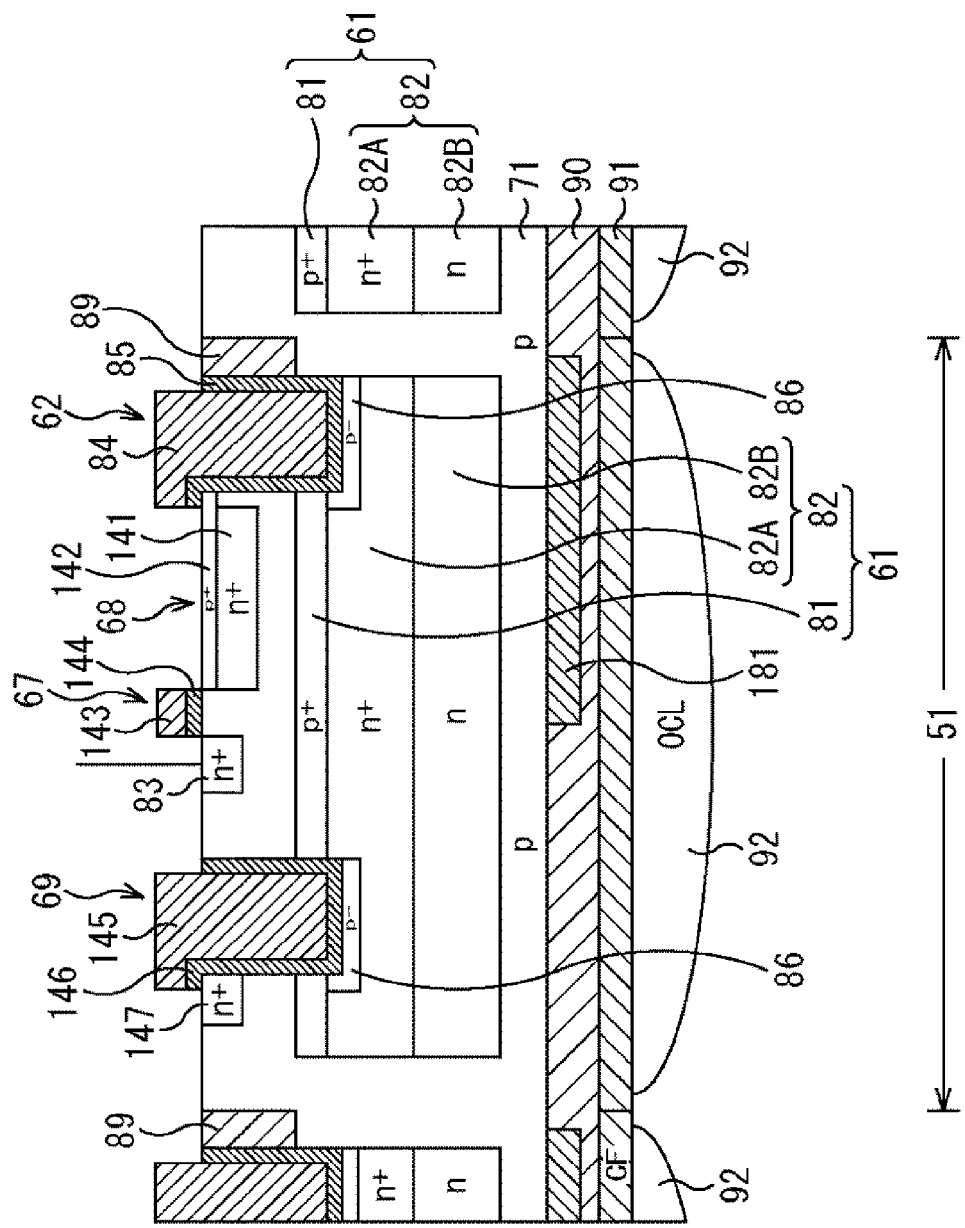
FIG. 11 is a cross-sectional view illustrating a structure of a pixel of a third configuration.

FIG. 11 is a cross-sectional view illustrating the third configuration of the pixel 51.

The pixel structure of the pixel 51 of the third configuration illustrated in FIG. 11 is different in that the shading film 181 is formed in a predetermined region of the layer in which the flattening film 90 is formed, as compared to the pixel structure of the second configuration illustrated in FIG. 9. Also, the separation region 148 between the gate electrode 145 of the discharge transistor 69 and the n+ region 83 as the FD 63 is omitted.

Figure 12:
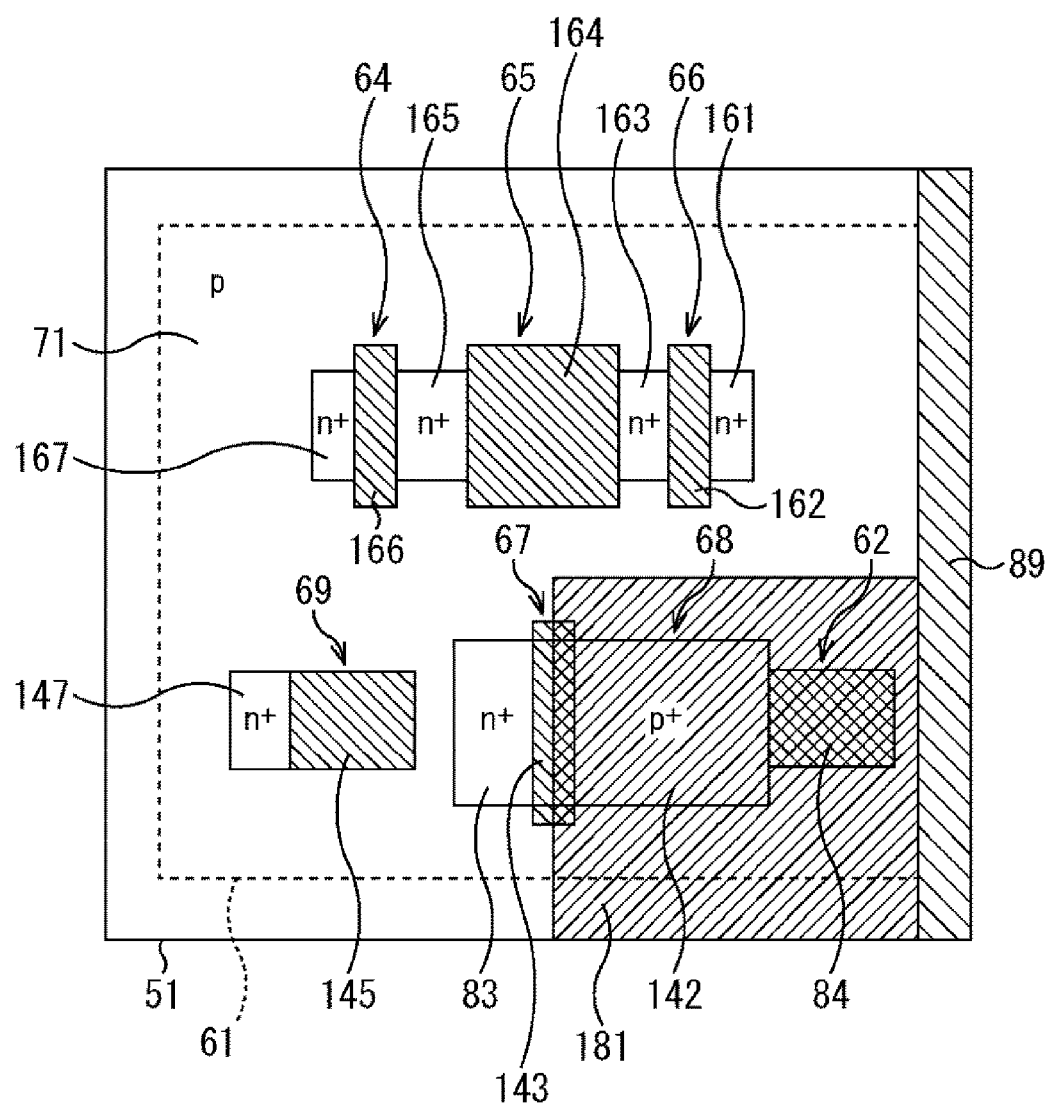
FIG. 12 is a plan view illustrating a structure of a pixel of a third configuration.

FIG. 12 is a plan view of the pixel 51 of, the third configuration illustrated in the same way as FIG. 10.

When the pixel 51 of the third configuration is seen from the plan view direction, the shading film 181 is arranged in the shape that covers the memory unit 68 and the first transfer transistor 62, as illustrated in FIG. 12. Thereby, the light that enters into the memory unit 68 is blocked, and the noise contamination is reduced while accumulating the electric charge.

<Fourth Configuration of Pixel 51>

Figure 13:
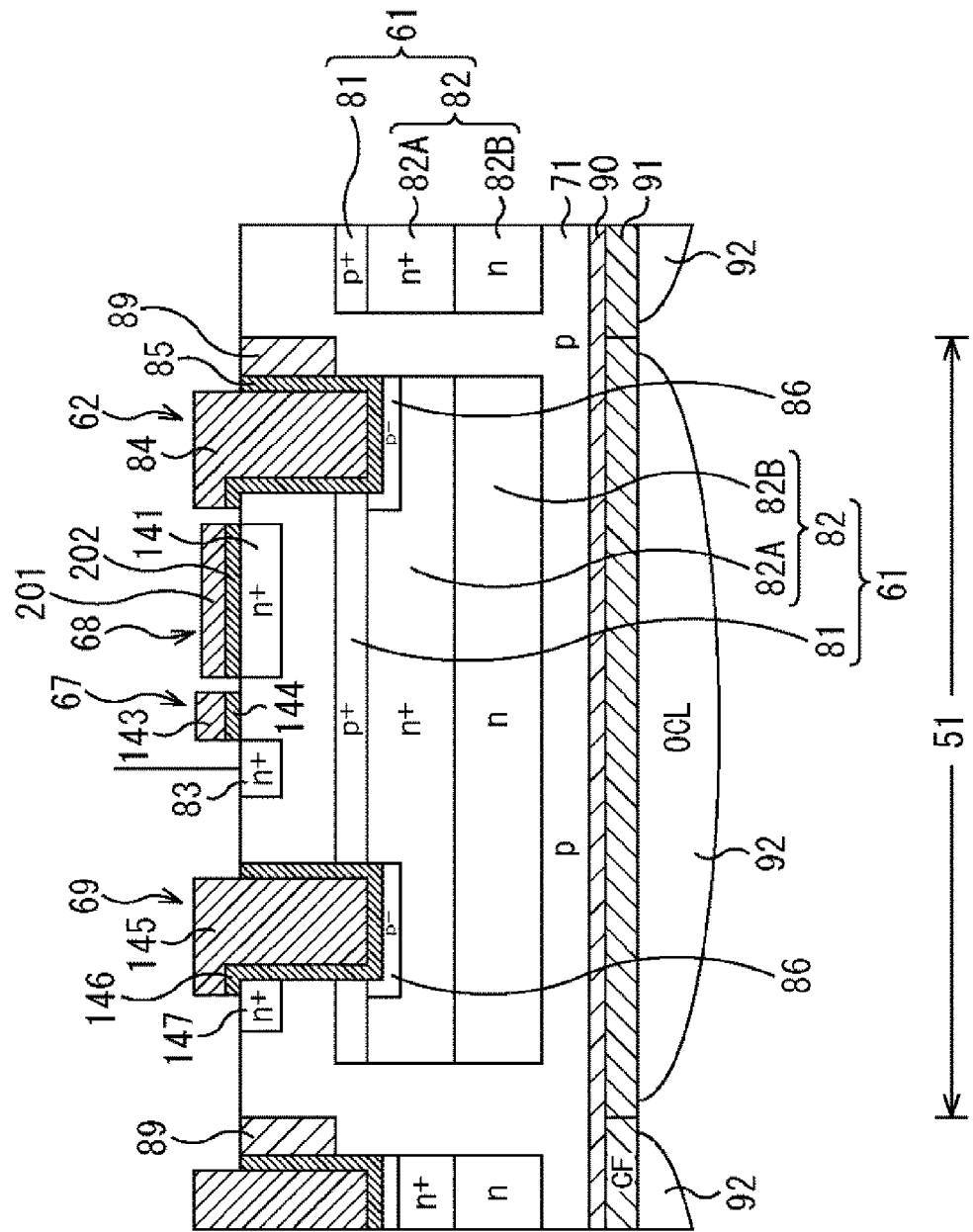
FIG. 13 is a cross-sectional view illustrating a structure of a pixel of a fourth configuration.

FIG. 13 is a cross-sectional view illustrating the fourth configuration of the pixel 51.

As compared to the pixel structure of the second configuration illustrated in FIG. 9, the pixel structure of the pixel 51 of the fourth configuration illustrated in FIG. 13 is such that the p-type layer 142 formed at the upper portion of the n+ region 141 that functions as the memory unit 68 is omitted, and instead the gate electrode 201 made of polysilicon for example is formed via the gate insulating film 202. Also, the separation region 148 between the gate electrode 145 of the discharge transistor 69 and the n+ region 83 as the FD 63 is omitted.

Although, in the pixel structure illustrated in FIG. 13, the shading film 181 is not formed in the layer in which the flattening film 90 is formed, the shading film 181 may be located in the same way as FIG. 11.

Figure 14:
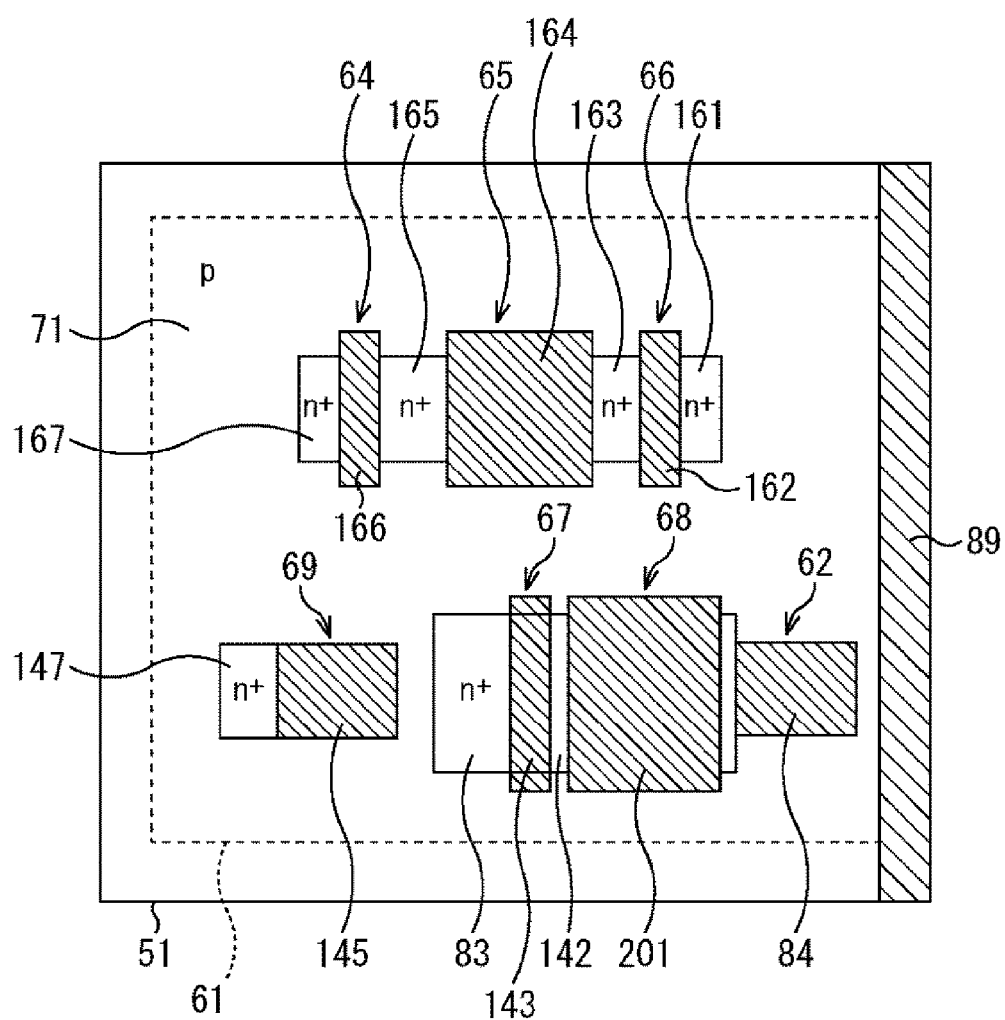
FIG. 14 is a plan view illustrating a structure of a pixel of a fourth configuration.

FIG. 14 is a plan view of the pixel 51 of the fourth configuration illustrated in the same way as FIG. 10.

When the pixel 51 of the fourth configuration is seen in the plan view direction, the gate electrode 201 is located at the upper portion of the memory unit 68, as illustrated in FIG. 14.

While the memory unit 68 is accumulating the electric charge, the negative electric potential is applied to the gate electrode 201, to reduce the dark current that occurs in the memory unit 68.

<Fifth Configuration of Pixel 51>

Figure 15:
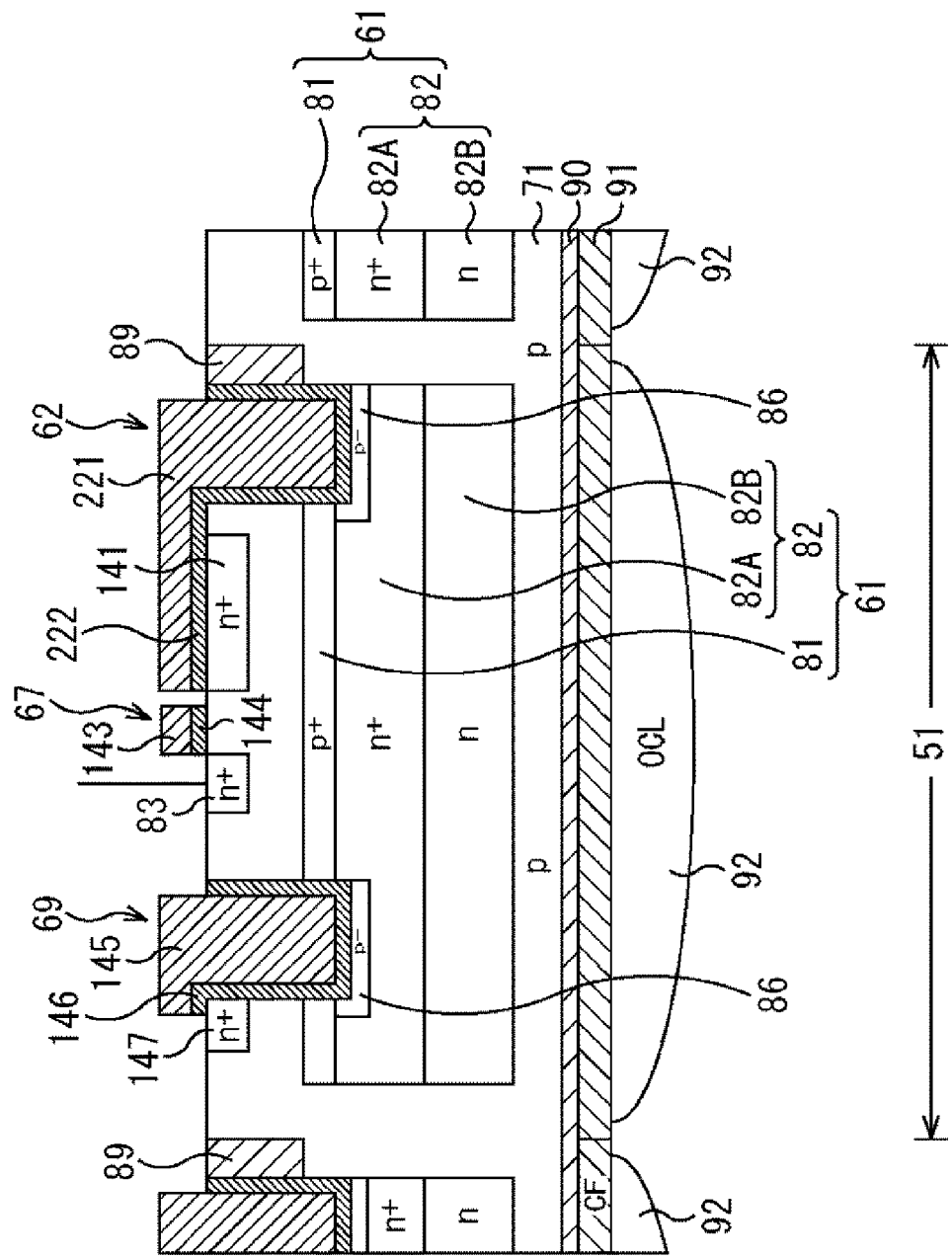
FIG. 15 is a cross-sectional view illustrating a structure of a pixel of a fifth configuration.

FIG. 15 is a cross-sectional view illustrating the fifth configuration of the pixel 51.

The pixel structure of the pixel 51 of the fifth configuration illustrated in FIG. 15 is different in that the gate electrode 84 of the first transfer transistor 62 in FIG. 13 is integrated with the gate electrode 201 for applying the negative electric potential to the memory unit 68, as compared to the pixel structure of the fourth configuration illustrated in FIG. 13. That is, the gate electrode 221 of the first transfer transistor 62 of the pixel 51 of the fifth configuration is formed to the upper portion of the memory unit 68, and functions as the gate electrode for applying the negative electric potential to the memory unit 68. Also, in the same way, the gate insulating film 222 of the lower portion of the gate electrode 221 is formed such that the gate insulating film 85 in FIG. 13 is integrated with the gate insulating film 202. Thereby, the control line for applying the negative electric potential to the gate electrode 201 is omitted in FIG. 13.

Note that, in the pixel structure illustrated in FIG. 15, the shading film 181 for shading the memory unit 68 may be located in the layer in which the flattening film 90 is formed, in the same way as FIG. 11.

Figure 16:
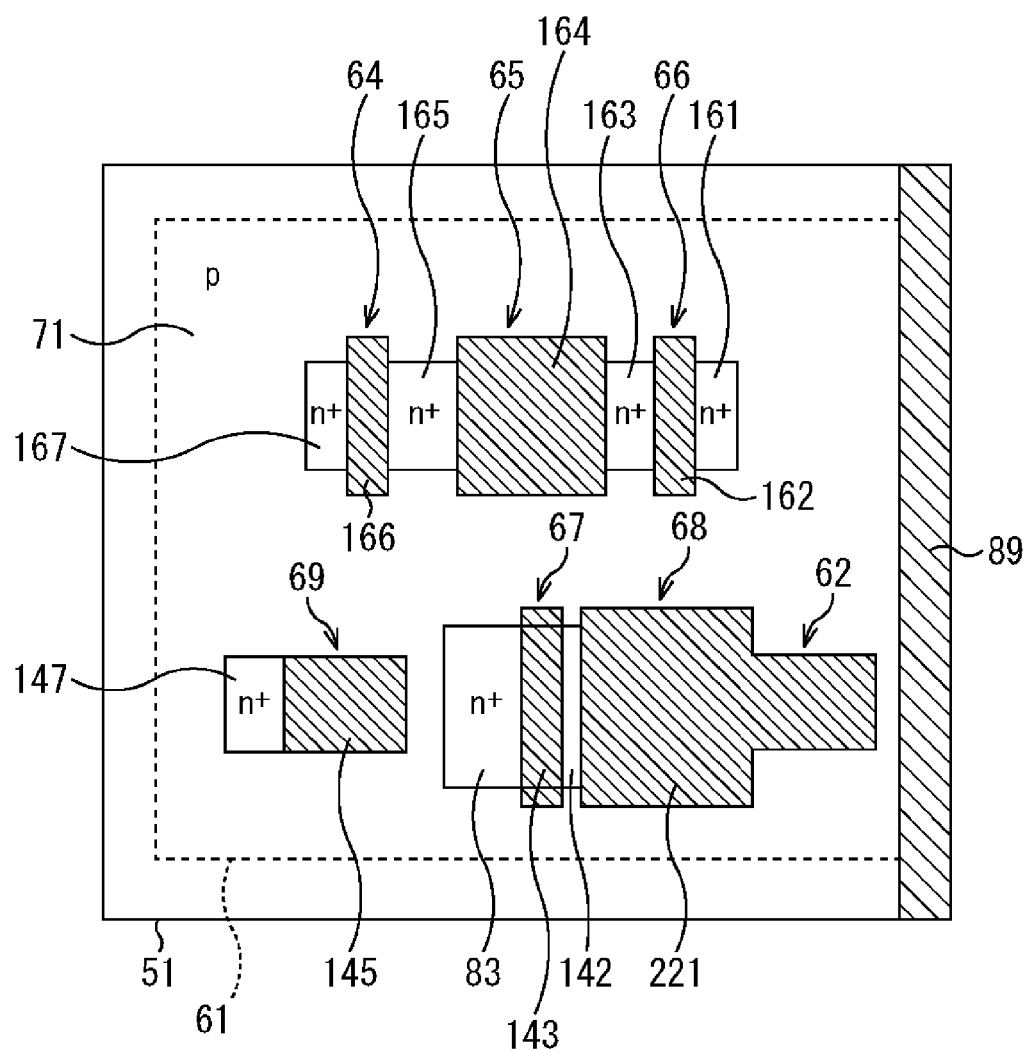
FIG. 16 is a plan view illustrating a structure of a pixel of a fifth configuration.

FIG. 16 is a plan view of the pixel 51 of the fifth configuration, illustrated in the same way as FIG. 14.

When the pixel 51 of the fifth configuration is seen from the plan view direction, the gate electrode 221 of the transfer transistor 62 is located to the upper portion of the memory unit 68, as illustrated in FIG. 16.

Thereby, while the memory unit 68 is accumulating the electric charge, the negative electric potential is applied to the gate electrode 221, to reduce the dark current that occurs in the memory unit 68.

<Sixth Configuration of Pixel 51>

Figure 17:
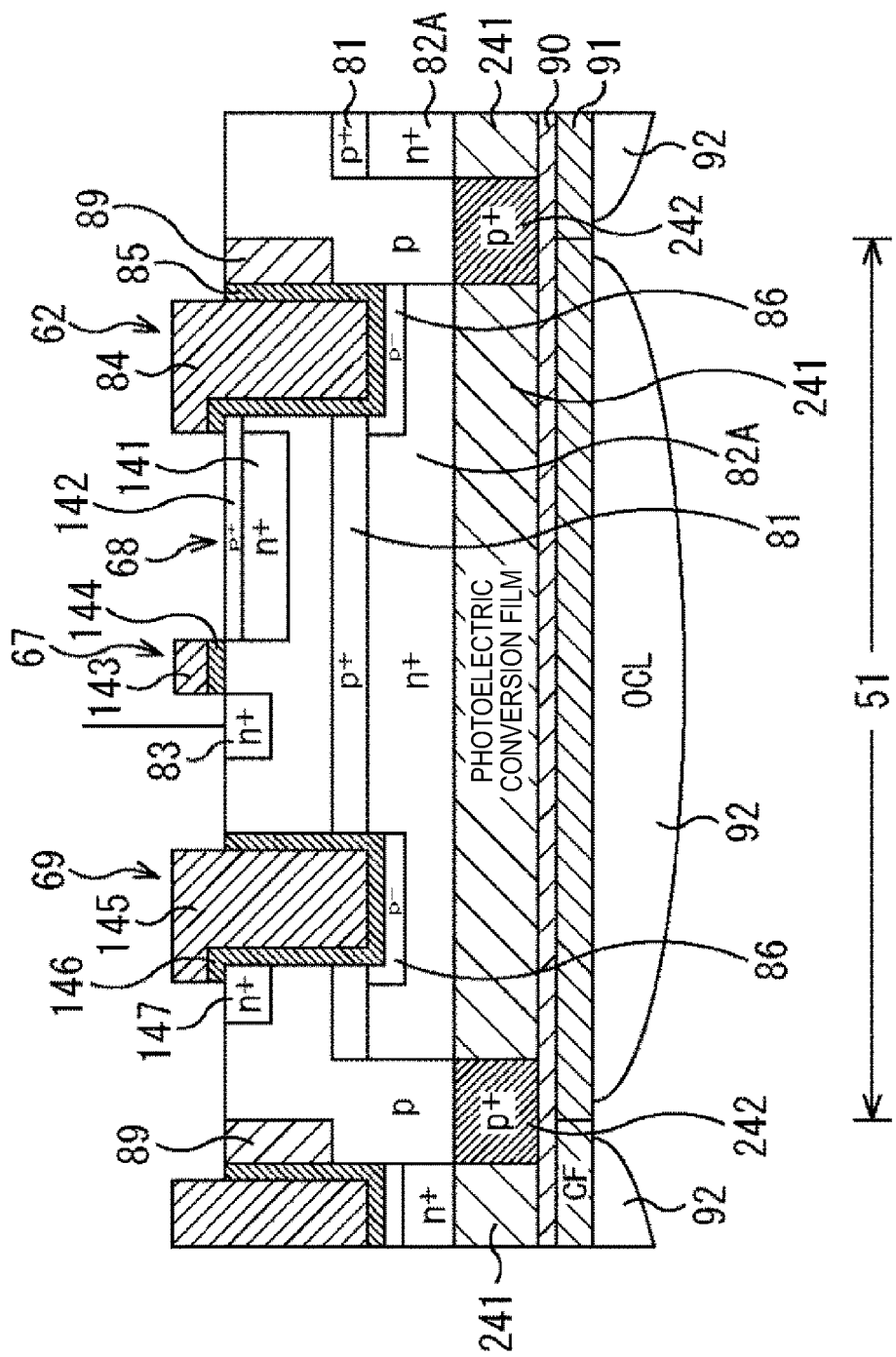
FIG. 17 is a cross-sectional view illustrating a structure of a pixel of a sixth configuration.

FIG. 17 is a cross-sectional view illustrating the sixth configuration of the pixel 51.

The pixel structure of the pixel 51 of the sixth configuration illustrated in FIG. 17 is such that the n region 82B in FIG. 11 is omitted, and a photoelectric conversion film 241 is newly formed in the substrate back side direction from and the n+ region 82A, as compared to the pixel structure of the third configuration illustrated in FIG. 11. Also, the photoelectric conversion film 241 of each pixel 51 is separated by a p-type semiconductor region (the p+ region) 242 of the high impurity concentration.

The photoelectric conversion film 241 may be compound semiconductor of Chalcopyrite structure or organic material. The compound semiconductor of the Chalcopyrite structure is, for example, CuInSe2, the one made of Cu—Al—Ga—In—S—Se based mixed crystal, and the one made of Cu—Al—Ga—In—S—Se based mixed crystal. Also, a group III or group IV compound semiconductor layer may be formed. Also, as the organic material, a quinacridone based or coumarin based material may be used, for example. The above materials just illustrate examples of the material that can be used for the photoelectric conversion film 241, and is not limited thereto, as long as having a larger light absorption coefficient than the semiconductor substrate 71 (silicon). The photoelectric conversion film 241 having a larger light absorption coefficient than the semiconductor substrate 71 functions as a shading film for shading the visible light.

The n-type semiconductor region (the n+ region) 82A of the high impurity concentration accumulates the electric charge obtained by the photoelectric conversion of the photoelectric conversion film 241.

Figure 18:
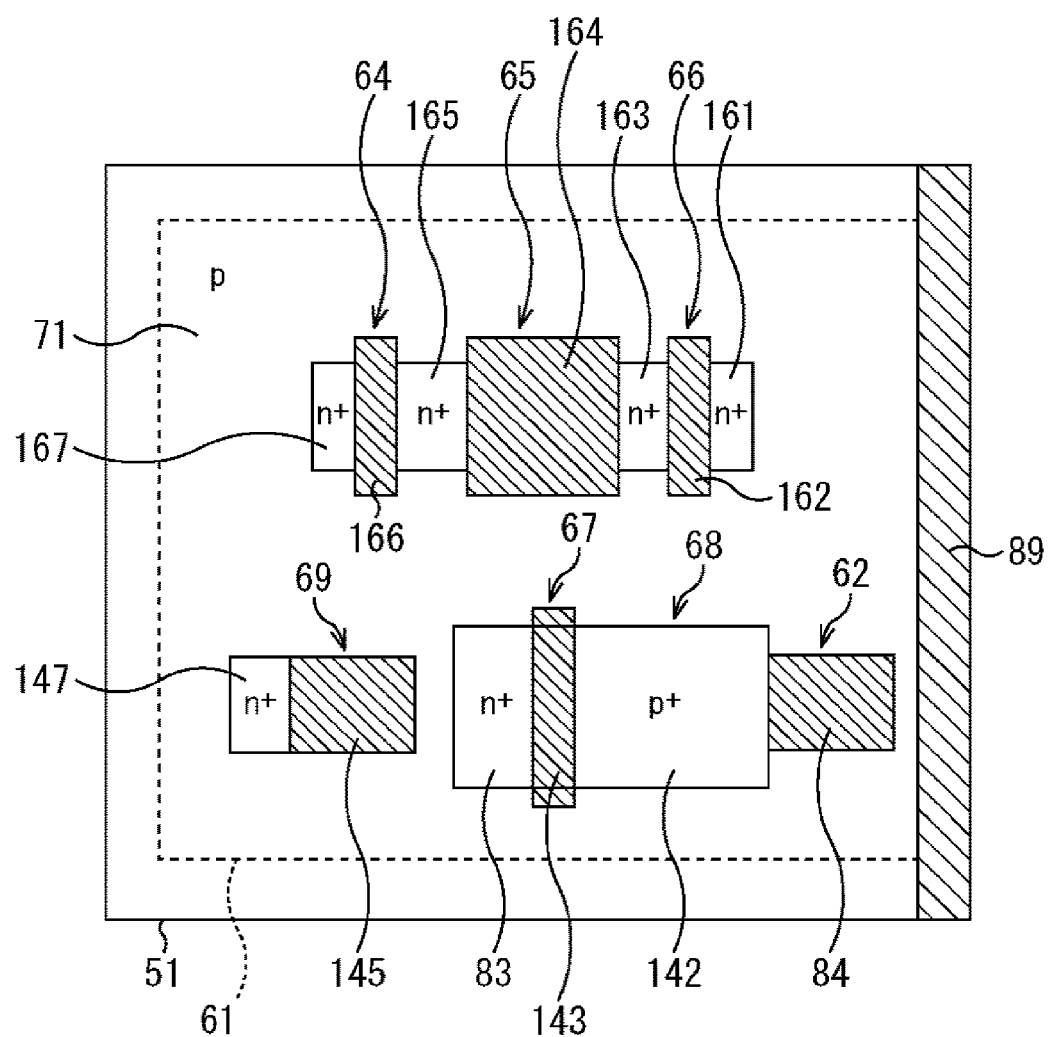
FIG. 18 is a plan view illustrating a structure of a pixel of a sixth configuration.

FIG. 18 illustrates a plan view of the pixel 51 of the sixth configuration, and is same as the plan view illustrated in FIG. 12, except that the shading film 181 is not located.

<Manufacturing Method of Pixel 51 of Third Configuration>

Next, with reference to FIG. 19 to FIG. 21, the manufacturing method of the pixel 51 of the third configuration illustrated in FIG. 11 will be described.

Figure 19:
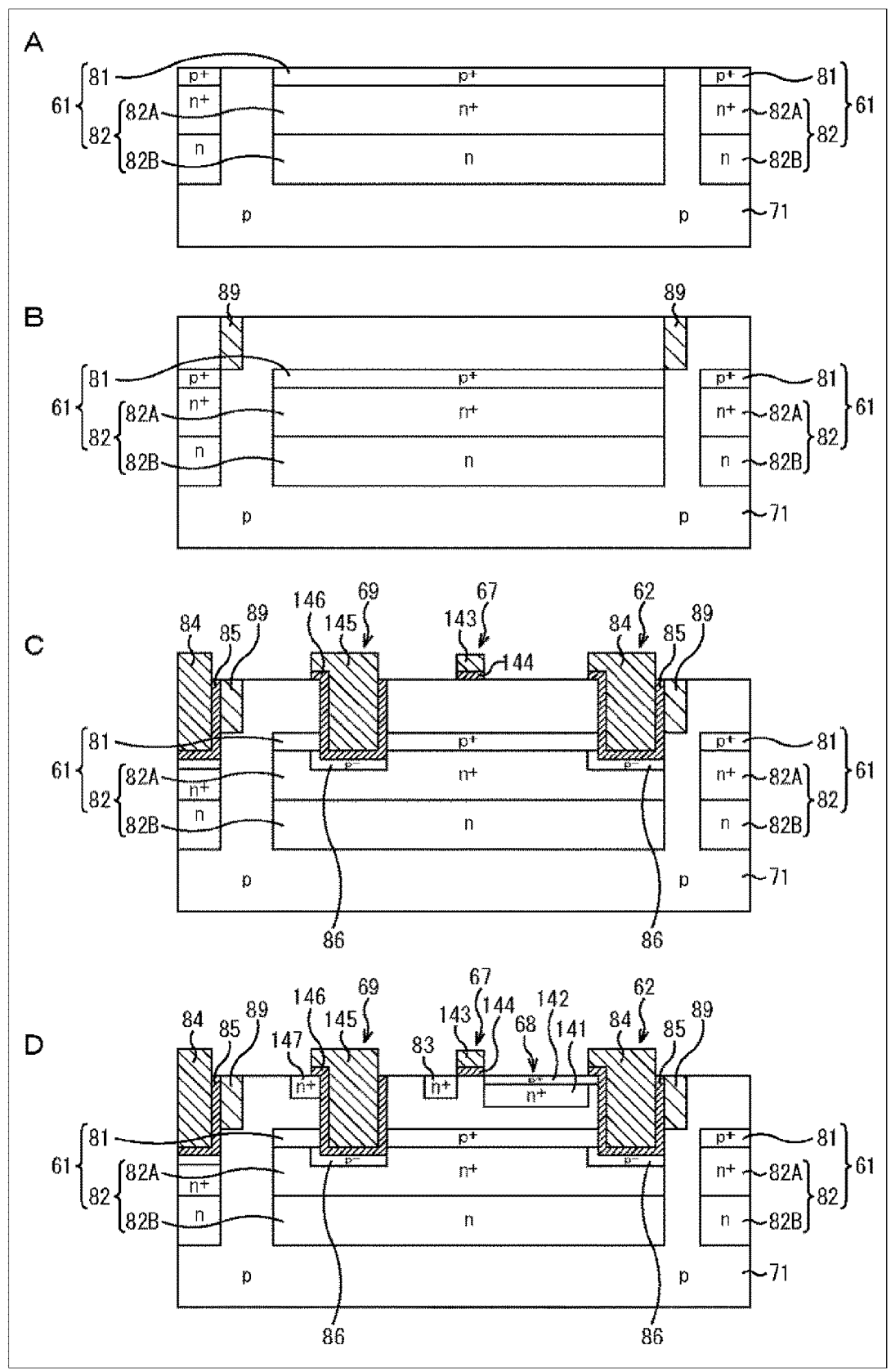
FIG. 19 is a diagram for describing a manufacturing method of a pixel of a third configuration.

First, as illustrated in FIG. 19 A, the photo diode 61 consisting of the p+ region 81 and the n-type semiconductor region 82 is formed in the p-type semiconductor substrate 71. The n-type semiconductor region 82 is configured by the n+ region 82A that is close to the p+ region 81 and the n region 82B that is close to the back side of the semiconductor substrate 71.

Although, in the present embodiment, the p-type semiconductor substrate 71 is used, it may be such that a p-type well region (P-Well) is formed in the n-type semiconductor substrate, using the n-type semiconductor substrate, and the photo diode 61 is formed in the well region.

Thereafter, as illustrated in FIG. 19 B, after the p-type silicon layer of approximately 0.5 to 1.5 μm is formed on the photo diode 61 by epitaxial growth, the separation region 89 is formed by an insulator, such as oxide silicon at a predetermined position which forms the boundary of each pixel 51.

Thereafter, as illustrated in FIG. 19 C, respective gate electrodes of the first transfer transistor 62, the second transfer transistor 67, and the discharge transistor 69 are formed on the substrate surface.

Specifically, the p-type layer of the upper side than the photo diode 61 in the region in which the first transfer transistor 62 and the discharge transistor 69 are formed is etched by the dry etching method to be removed. Then, ion of p-type, such as boron, for example is doped, at the part which forms the bottom face of the removed region, to form the p− region 86. Further, after the gate insulating film 85 and the gate insulating film 146 are formed with a silicon dioxide film or the like on the inner wall of the etched and removed region, the polysilicon is embedded to form the gate electrode 84 of the first transfer transistor 62 and the gate electrode 145 of the discharge transistor 69.

Also, the gate electrode 143 of the second transfer transistor 67 and others are formed simultaneously.

Thereafter, as illustrated in FIG. 19 D, for example, the source-drain region of each transistor such as the n+ region 147 of the discharge transistor 69, the n+ region 83 as the FD 63, the n+ region 141 as the memory unit 68, and the p-type layer 142 on the top face of the n+ region 141 are formed on the surface of the semiconductor substrate 71.

Figure 20:
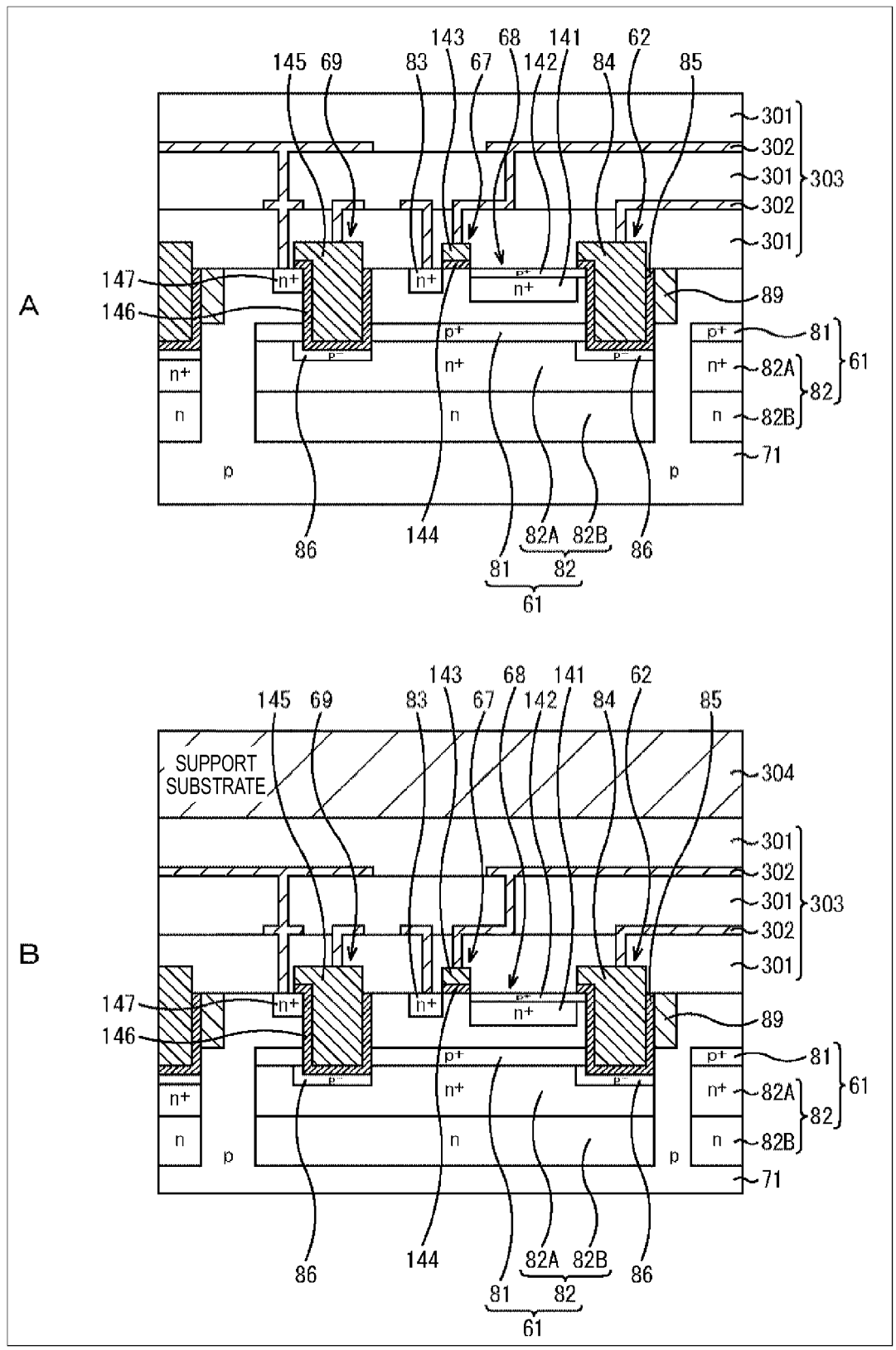
FIG. 20 is a diagram for describing a manufacturing method of a pixel of a third configuration.

Thereafter, as illustrated in FIG. 20 A, a connection wire layer 303 including a plurality of interlayer films 301 and a plurality of metal lines 302 made of tungsten, aluminium, or the like is formed at the front side of the semiconductor substrate 71.

Then, as illustrated in FIG. 20 B, after a support substrate 304 is pasted at the upper portion of the connection wire layer 303, the back side of the semiconductor substrate 71 is polished to make the depth to the photo diode 61 at approximately 1 μm to 5 μm, in order to make it a thin film.

Figure 21:
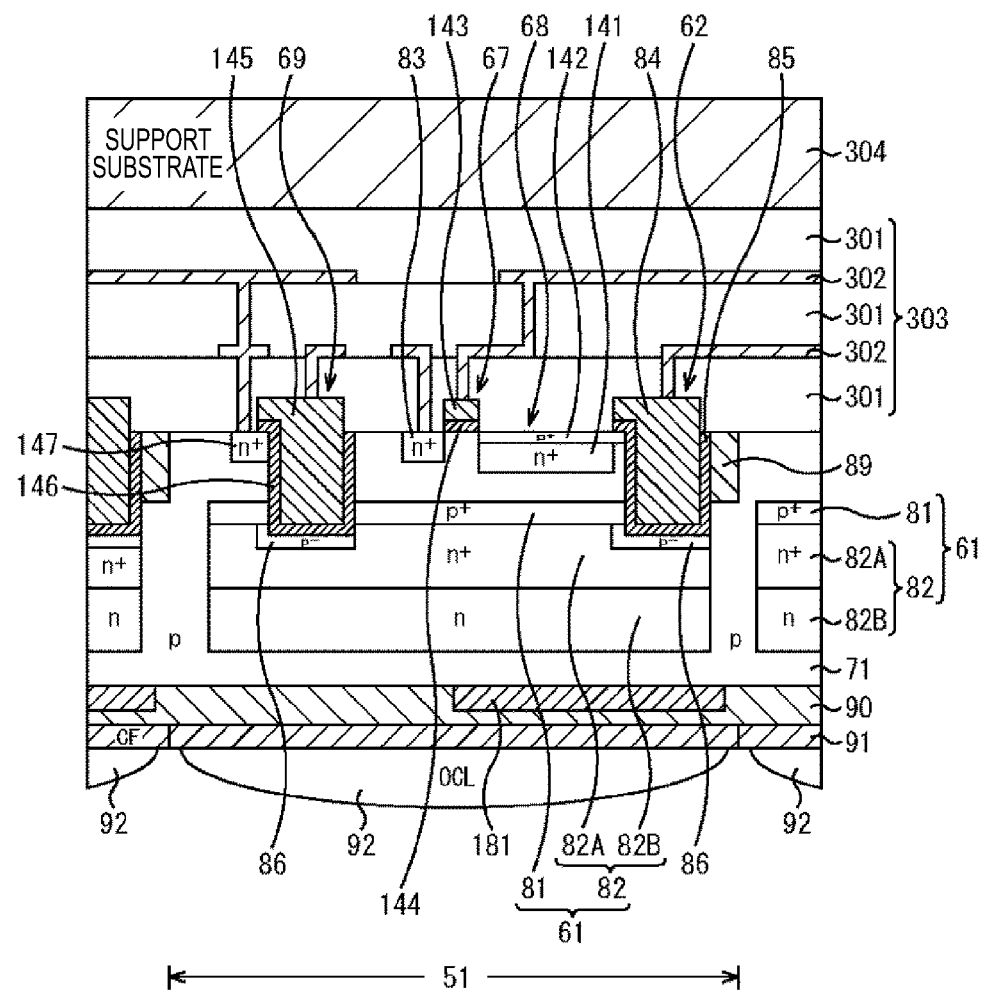
FIG. 21 is a diagram for describing a manufacturing method of a pixel of a third configuration.

Thereafter, as illustrated in FIG. 21, the shading film 181, the flattening film 90, the color filter 91, and the on-chip lens (OCL) 92 are formed in this order, at the thinned back side of the semiconductor substrate 71.

The pixel 51 of the third configuration is produced by the above processes.

<Another Manufacturing Method of Pixel 51 of Third Configuration>

Figure 22:
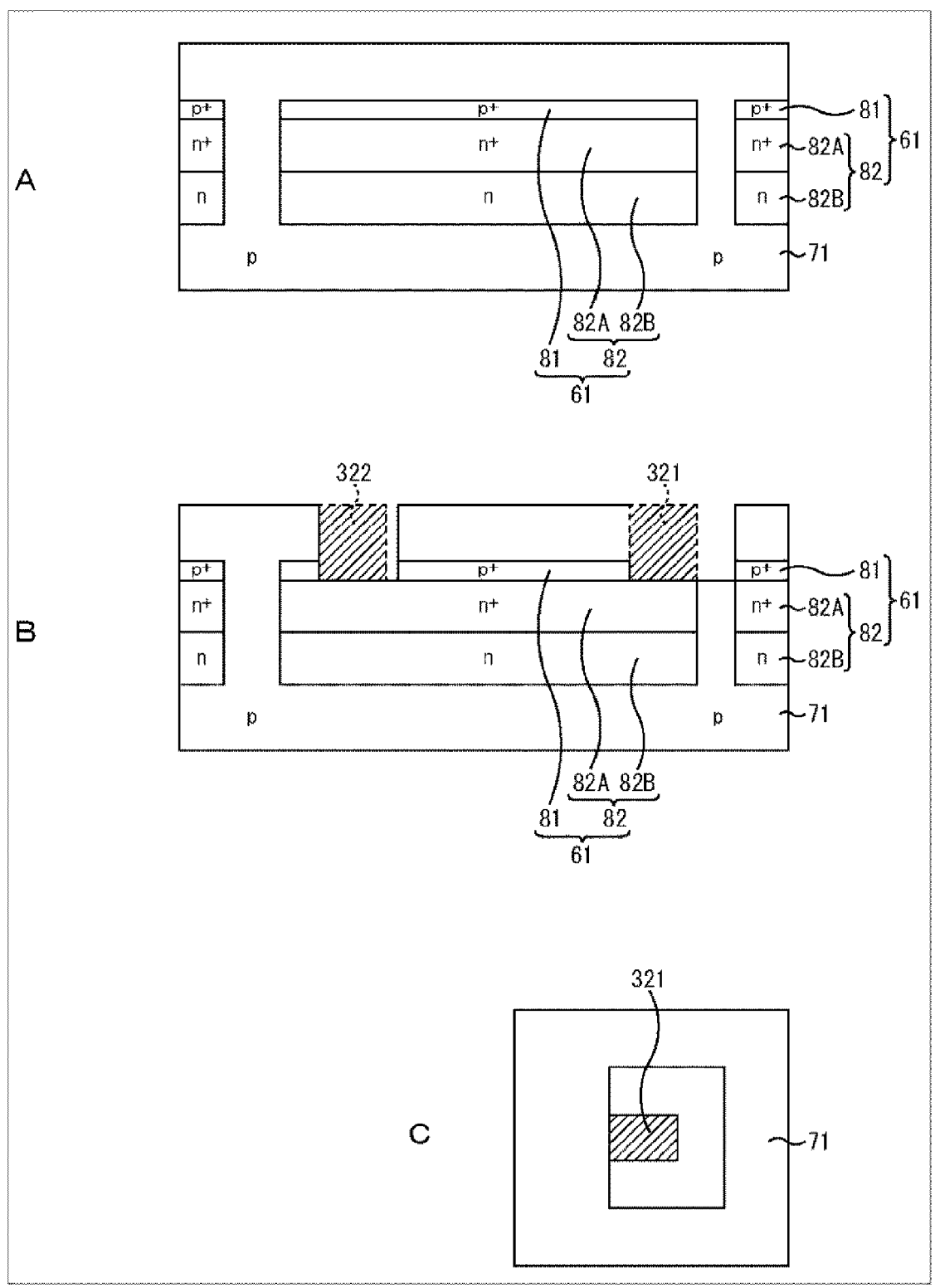
FIG. 22 is a diagram for describing another manufacturing method of a pixel of a third configuration.
Figure 23:
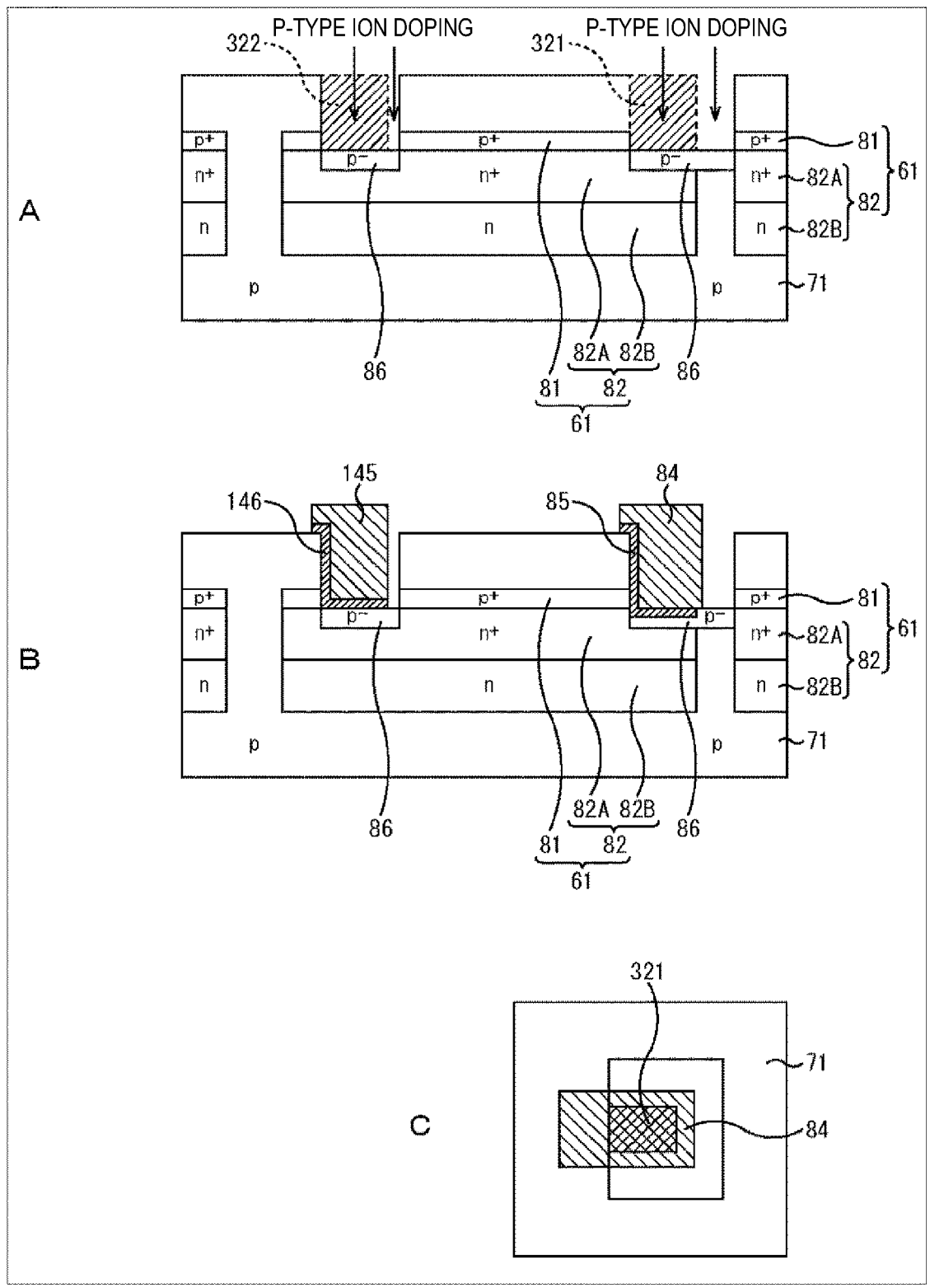
FIG. 23 is a diagram for describing another manufacturing method of a pixel of a third configuration.

With reference to FIGS. 22 and 23, another manufacturing method of the gate electrode 84 of the first transfer transistor 62 and the gate electrode 145 of the discharge transistor 69, which are embedded gate electrodes in the pixel, 51 will be described.

First, in the same way as the above manufacturing method, as illustrated in FIG. 22 A, the photo diode 61 is formed in the p-type semiconductor substrate 71, and thereafter the p-type silicon layer is formed by the epitaxial growth.

Thereafter, as illustrated in FIG. 22 B, the p-type layer of the region in which the first transfer transistor 62 and the discharge transistor 69 are formed is etched by the dry etching method to be removed. In this case, as illustrated in the plan view of FIG. 22 C, the p-type layer of the semiconductor substrate 71 is etched to the p-n junction plane of the photo diode 61 to form a U shape with an unremoved channel part 321 of the first transfer transistor 62. In the same way, the discharge transistor 69 is etched to the p-n junction plane of the photo diode 61 to form a U shape with an unremoved channel part 322.

Subsequently, as illustrated in FIG. 23 A, the ion of p-type, such as boron for example, is doped in the region etched in the U shape at the part corresponding to the first transfer transistor 62 and the discharge transistor 69, in order to form the p− region 86. In this case, a photoresist is used in the region other than the part where the ion is doped, without doping the ion d.

Thereafter, as illustrated in FIG. 23 B, the gate insulating film 85 and the gate insulating film 146 are formed on the surface of the channel part 321 of the first transfer transistor 62 and the surface of the channel part 322 of the discharge transistor 69, using the thermal oxidation method or the deposition method, and thereafter the gate electrode 84 of the first transfer transistor 62 and the gate electrode 145 of the discharge transistor 69, which are made of polysilicon, are further formed.

As illustrated in the plan view of FIG. 23 C, the channel part 321 of the first transfer transistor 62, and the polysilicon other than the part surrounding the channel part 322 of the discharge transistor 69 are removed by the dry etching, to completely form the gate electrode 84 of the first transfer transistor 62 and the gate electrode 145 of the discharge transistor 69.

As described above, the gate electrode 84 of the first transfer transistor 62 and the gate electrode 145 of the discharge transistor 69, which are the embedded gate electrodes, are produced. Other manufacturing method of the pixel 51 is same as the method described with reference to FIG. 19 to FIG. 21.

Each of the first to sixth configurations of the pixel 51 in the above solid state image sensor 41 is shaped such that the accumulating portion of the electric charge transfer destination is open in one direction, and the potential controllability of other three directions is more enhanced than the opening side. For example, the gate electrode 84 of the first transfer transistor 62 forms a U shape that opens the n+ region 83 which is the FD 63, and is embedded in the depth direction. This configures the solid state image sensor tolerant to misalignment during manufacturing and having a high conversion efficiency of photoelectric conversion.

<Another Problem of Solid State Image Sensor>

In the meantime, when the pixel structure has two transfer routes of the electric charge accumulated in the photo diode 61, the next problem is concerned.

In general, the transfer transistor needs to be located at a position where the energy is lowest for the carrier. Thus, when the pixel 51 includes the discharge transistor 69 as the transfer transistor that reads the electric charge from the photo diode 61 in addition to the first transfer transistor 62, each of the first transfer transistor 62 and the discharge transistor 69 needs to be located at a position where the energy is lowest for the carrier, i.e., at a position where the electric potential is highest in the configuration of the above photo diode 61.

<Cross-Sectional View of Pixel 51 of Seventh Configuration>

Figure 24:
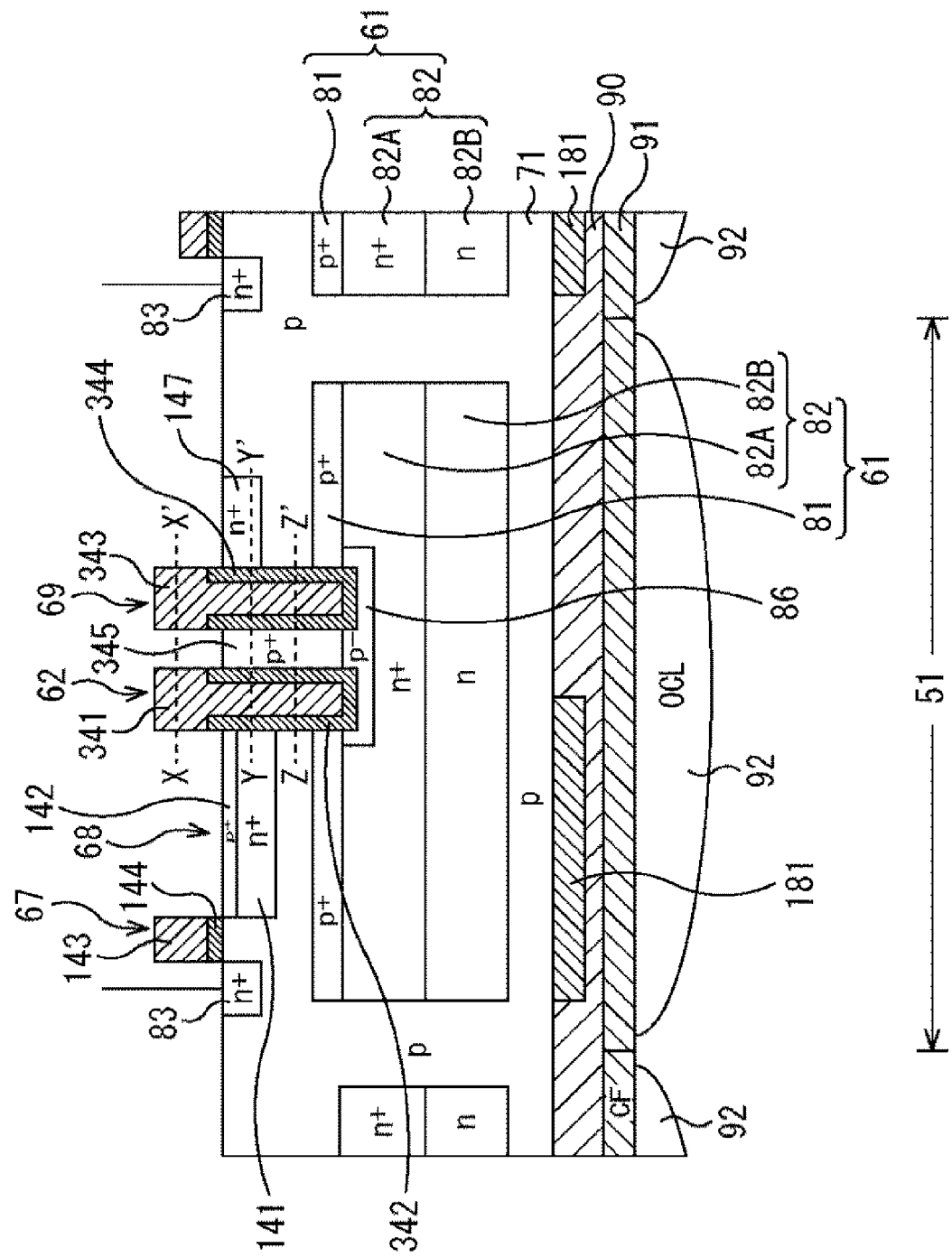
FIG. 24 is a cross-sectional view illustrating a structure of a pixel of a seventh configuration.

Thus, FIG. 24 is a cross-sectional view illustrating the seventh configuration of the pixel 51 which is the structure in view of the carrier energy.

In the drawings in or after FIG. 24, parts corresponding to the above configuration are denoted with the same reference signs, and their description will be omitted as appropriate.

In the pixel 51 of FIG. 24, the location and the shape of the gate electrodes of the first transfer transistor 62 and the discharge transistor 69 are different from the above configuration.

More specifically, the gate electrode 341 of the first transfer transistor 62 is embedded to the same depth as the p-n junction plane of the photo diode 61 via the gate insulating film 342, like a rod. Also, the gate electrode 343 of the discharge transistor 69, is embedded to the same depth as the p-n junction plane of the photo diode 61 via the gate insulating film 344, like a rod. Then, the gate electrode 341 of the first transfer transistor 62 and the gate electrode 343 of the discharge transistor 69 are located adjacent to the center portion of the photo diode 61.

In the process for forming the photo diode 61, the carrier energy becomes lowest around the p-n junction of the center portion of the photo diode 61, when the ion is doped uniformly in the creation region of the photo diode 61 in the plan view direction. Hence, in the seventh configuration illustrated in FIG. 24, the gate electrode 341 of the first transfer transistor 62 and the gate electrode 343 of the discharge transistor 69 are located at the center portion of the photo diode 61, adjacent to each other.

Then, the memory unit 68 as the electric charge transfer destination of the first transfer transistor 62 is formed at the left side of the first transfer transistor 62 in the drawing. On the other hand, the n+ region 147 as the electric charge transfer destination of the discharge transistor 69 is formed at the right side of the discharge transistor 69.

The p-type semiconductor region (the p+ region) 345 of the impurity concentration higher than the impurity region (p region) which forms the channel portion is formed between the gate electrode 341 of the first transfer transistor 62 and the gate electrode 343 of the discharge transistor 69, in order to prevent the electric charge from being exchanged between the two transistors.

<Plan View of Pixel 51 of Seventh Configuration>

Figure 25:
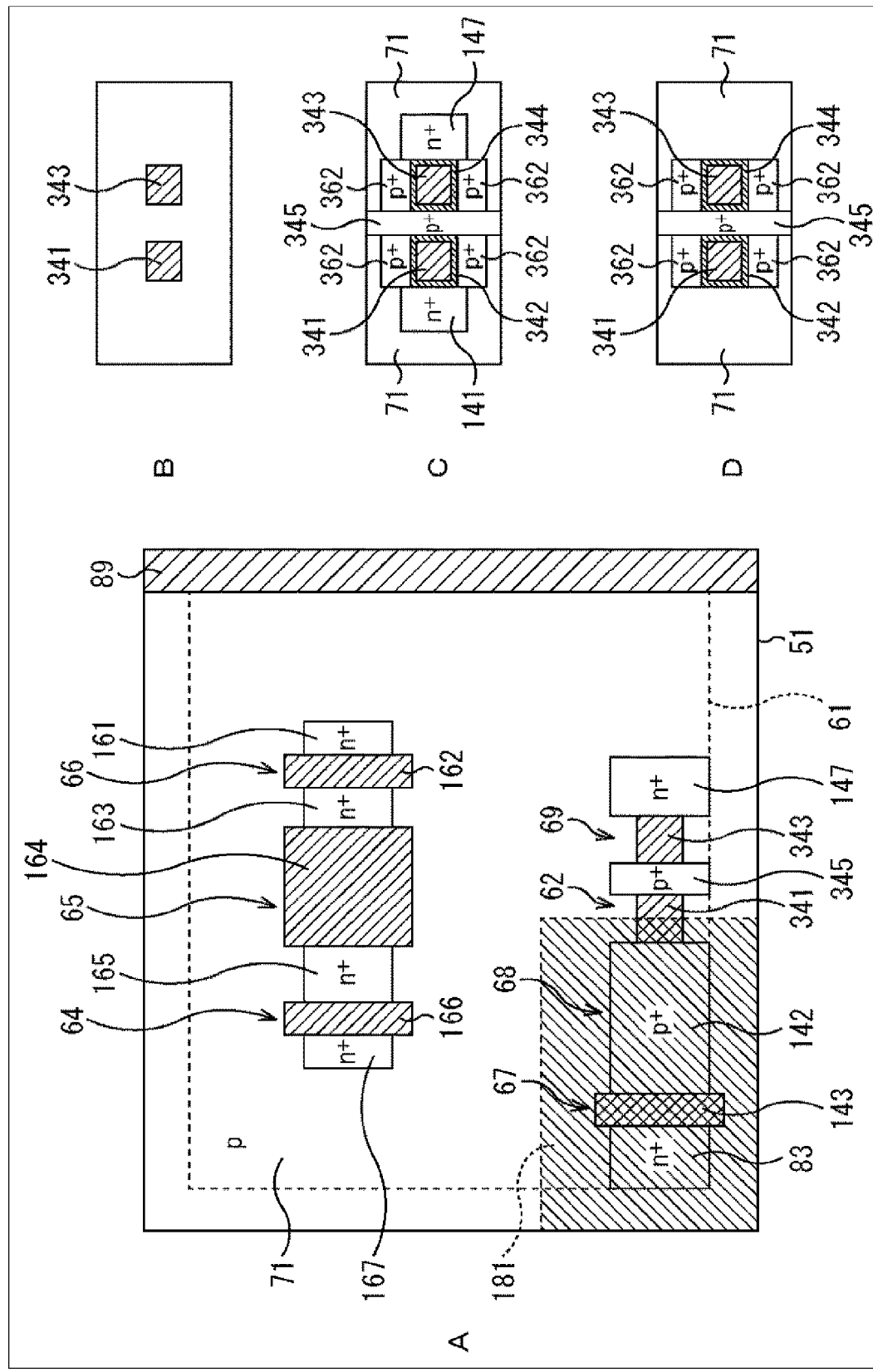
FIG. 25 is a plan view illustrating a structure of a pixel of a seventh configuration.

FIG. 25 A is a plan view of the substrate surface on which each transistor of the pixel 51 of the seventh configuration is formed, which is seen from upward.

As illustrated in FIG. 25 A, the gate electrode 341 of the first transfer transistor 62 and the gate electrode 343 of the discharge transistor 69 are located at the closest position in the plane in which the photo diode 61 is formed, so as to sandwich the p+ region 345.

As seen from (the n+ region 141 of) the memory unit 68 at the lower side of the p-type layer 142, the gate electrode 143 of the second transfer transistor 67 and the n+ region 83 as the source-drain region are located at the opposite side to the gate electrode 341 of the first transfer transistor 62. (the n+ region 141 of) the memory unit 68 and the n+ region 83 as one source-drain region of the second transfer transistor 67 are shaded by the shading film 181.

In another region of the pixel 51, the selection transistor 66, the amplification transistor 65, and the reset transistor 64 are located in juxtaposition, sharing one source-drain region with another adjacent transistor. More specifically, the selection transistor 66 is configured by the gate electrode 162, and the n+ region 161 and the n+ region 163 located at the both sides, and the amplification transistor 65 is configured by the gate electrode 164, and the n+ region 163 and the n+ region 165 located at the both sides, and the reset transistor 64 is configured by the gate electrode 166, and the n+ region 165 and the n+ region 167 located at the both sides.

Also, FIG. 25 B, FIG. 25 C, and FIG. 25 D are cross-sectional views of the vicinity of the first transfer transistor 62 and the discharge transistor 69 of the pixel 51, which are cut off by the X-X' line, the Y-Y' line, and the Z-Z' line of FIG. 24, respectively.

In the above first to sixth configuration, in contrast to the U shape of the gate electrode seen in the depth direction, the gate electrode 341 of the first transfer transistor 62 is formed in a rectangular shape and embedded in the depth direction, as understood from the cross-sectional views of FIG. 25 B, FIG. 25 C, and FIG. 25 D. The gate electrode 343 of the discharge transistor 69 is also formed in a rectangular shape and embedded in the depth direction in the same way.

As illustrated in FIG. 25 C, the p-type semiconductor region (the p+ region) 362 of the high impurity concentration is formed at the upper side and the lower side of the drawing of the gate electrode 341 of the first transfer transistor 62, via the gate insulating film 342. Also, the p-type semiconductor region (the p+ region) 362 of the high impurity concentration is formed at the upper side and the lower side of the drawing of the gate electrode 343 of the discharge transistor 69, via the gate insulating film 344.

As described above, in the seventh configuration, the gate electrode 341 of the first transfer transistor 62 and the gate electrode 343 of the discharge transistor 69, which are embedded like a rod, are located in parallel and adjacent to each other, at the part at which the carrier energy becomes lowest (the position at which the electric potential is highest in the present working example) in the flat surface region where the photo diode 61 is formed.

Thereby, the electric charge is transferred efficiently, when the electric charge is transferred to the memory unit 68 of the n+ region 141 by the first transfer transistor 62, and when transferred to the n+ region 147 by the discharge transistor 69.

Note that, in the configuration illustrated in FIG. 24, the p-type semiconductor region (the p+ region) 345 of the high impurity concentration is formed between the gate electrode 341 of the first transfer transistor 62 and the gate electrode 343 of the discharge transistor 69.

Figure 26:
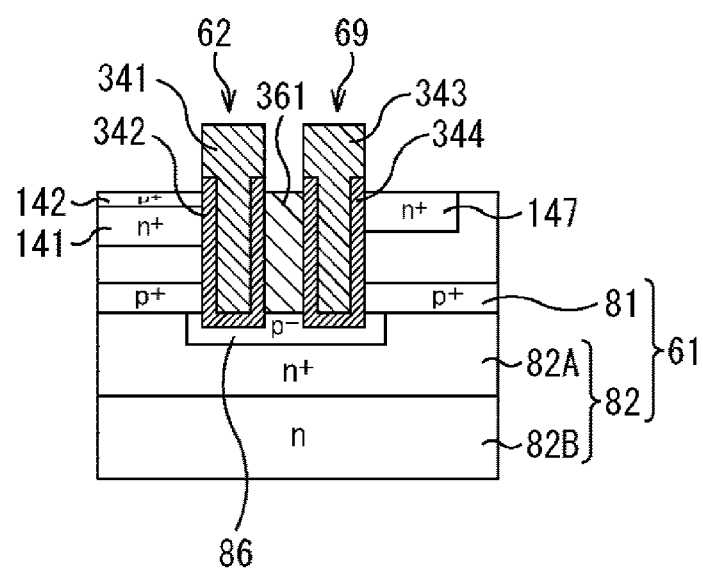
FIG. 26 is a cross-sectional view illustrating a structure of a pixel of a seventh configuration.

However, as illustrated in FIG. 26, instead of the p+ region 345, the separation region 361 made of an insulating film, such as a silicon dioxide film, may be formed between the gate electrode 341 of the first transfer transistor 62 and the gate electrode 343 of the discharge transistor 69.

<Exemplary Variant of Gate Electrode Shape>

Figure 27:
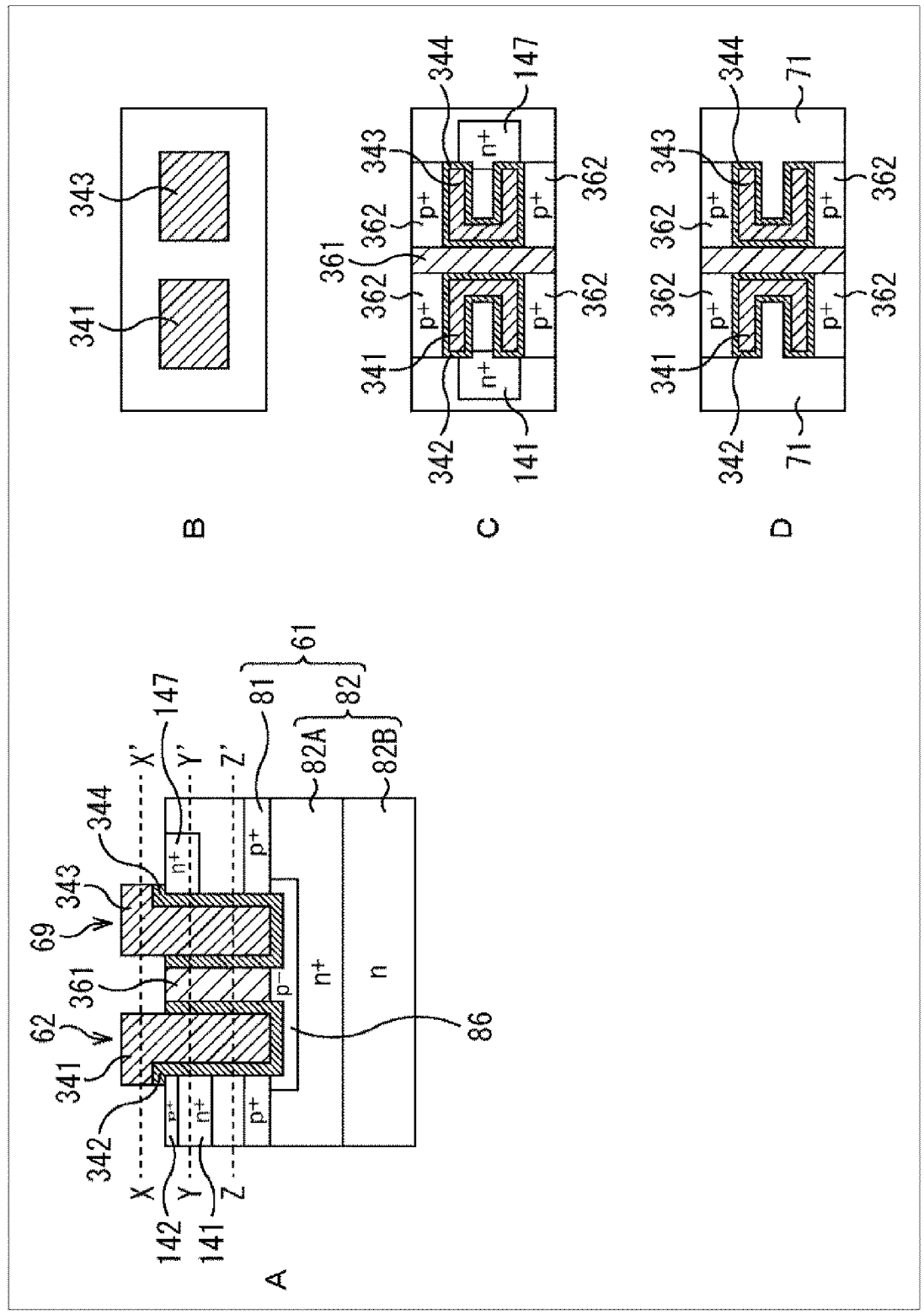
FIG. 27 is a diagram illustrating an exemplary variant of a gate electrode shape.

FIG. 27 illustrates an exemplary variant of the shapes of the gate electrode 341 of the first transfer transistor 62 and the gate electrode 343 of the discharge transistor 69.

Note that FIG. 27 A is a cross-sectional view near the first transfer transistor 62 and the discharge transistor 69 of the pixel 51, and FIG. 27 B to FIG. 27 D are cross-sectional views cut off by the X-X' line, the Y-Y' line, and the Z-Z' line of FIG. 27 A.

The shape of the gate electrode illustrated in FIG. 27 in the plan view direction is formed in a U shape in the same way as the above first to seventh configurations.

That is, the gate electrode 341 of the first transfer transistor 62 is formed in the U shape that opens toward the n+ region 141 of the left side in the drawing which is the transfer destination. The gate electrode 343 of the discharge transistor 69 is formed in the U shape that opens toward the n+ region 147 of the right side in the drawing which is the transfer destination.

By employing this configuration, the electric charge is transferred efficiently, when transferred to the memory unit 68 of the n+ region 141, and when transferred to the n+ region 147, and the solid state image sensor tolerant to misalignment during manufacturing and having a high conversion efficiency of photoelectric conversion is configured.

Note that the shapes of the gate electrode 341 of the first transfer transistor 62 and the gate electrode 343 of the discharge transistor 69 is not limited to the U shape, but may employ various types of shapes illustrated in FIG. 7. That is, the shapes of the gate electrode 341 of the first transfer transistor 62 and the gate electrode 343 of the discharge transistor 69 may employ a shape that opens toward one direction of the accumulating portion of the electric charge transfer destination to increase the potential controllability of other three directions relative to the opening side.

<Eighth Configuration of Pixel 51>

Figure 28:
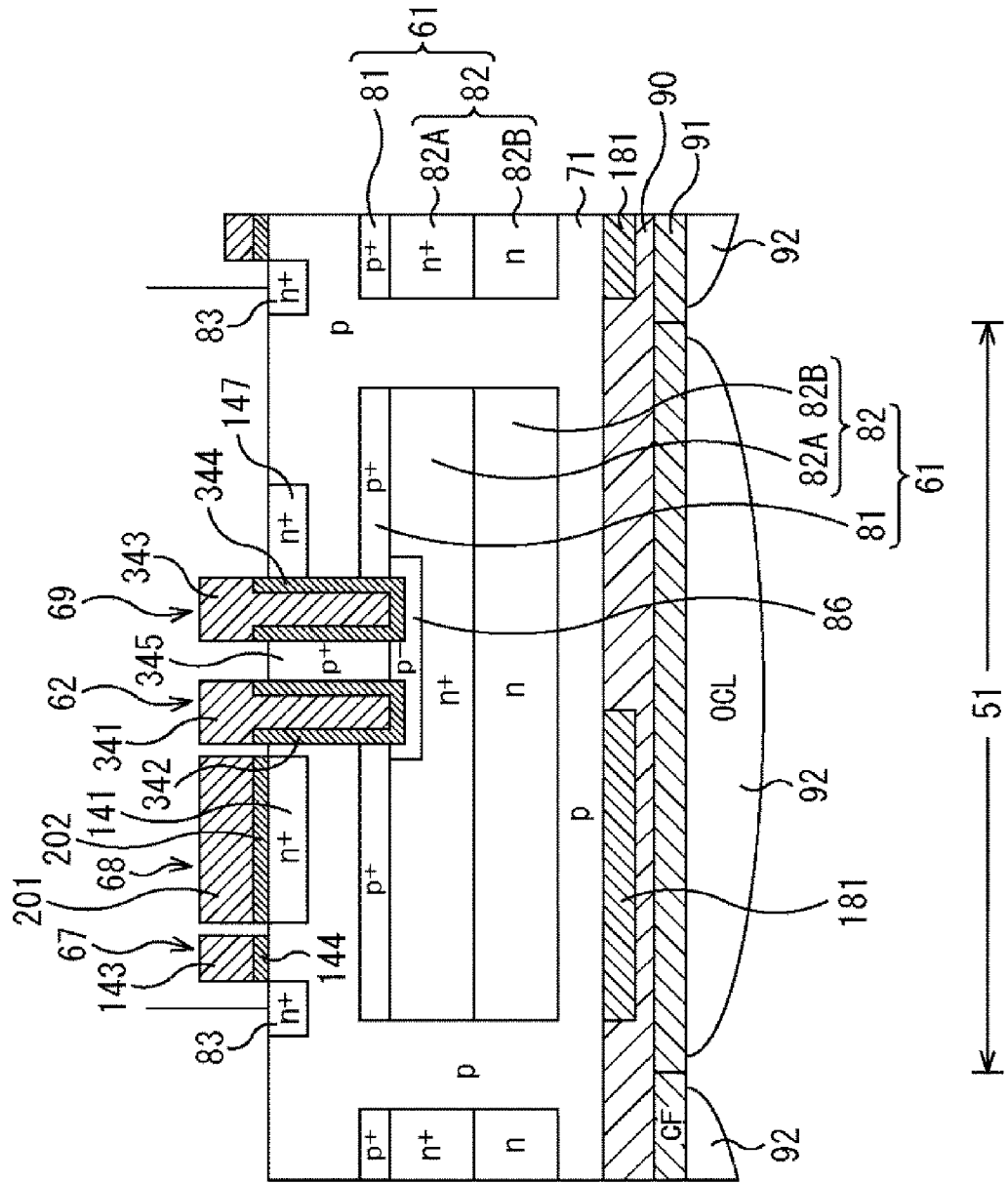
FIG. 28 is a cross-sectional view illustrating a structure of a pixel of an eighth configuration.
Figure 29:
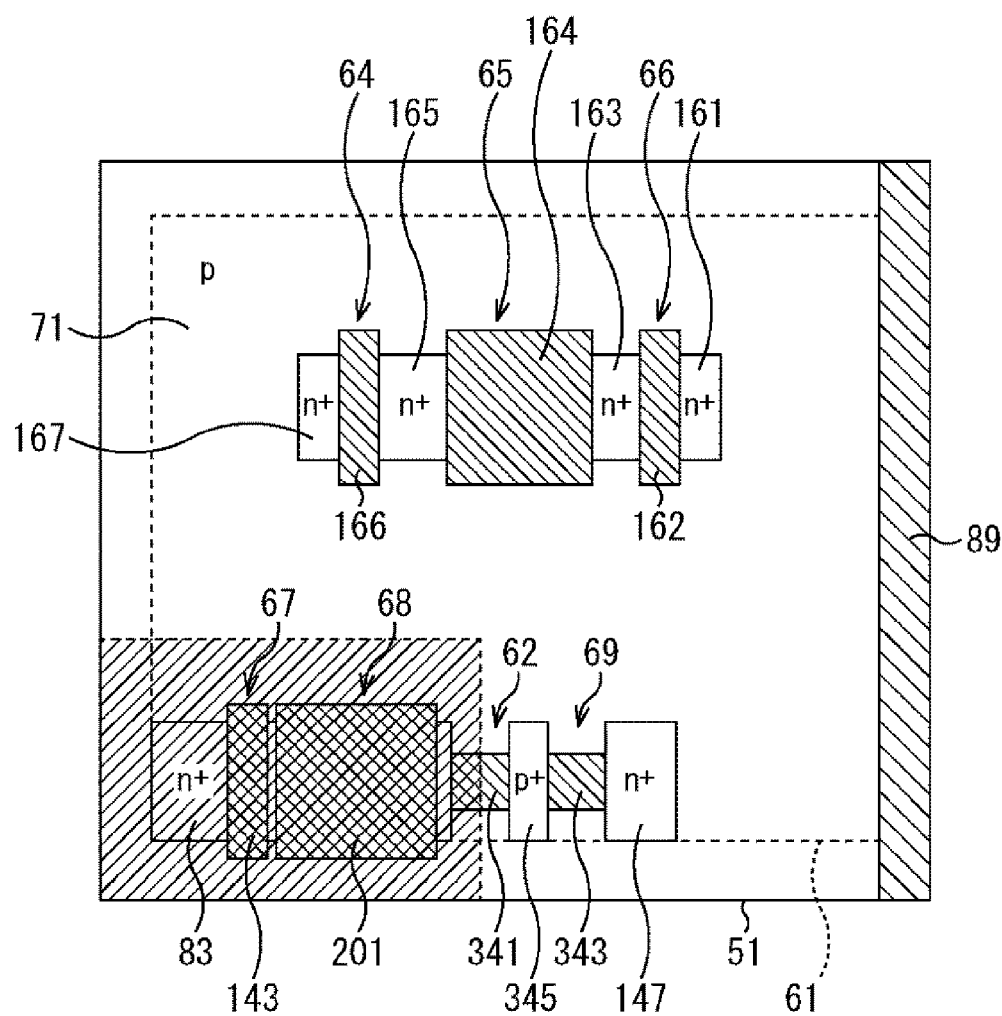
FIG. 29 is a plan view illustrating a structure of a pixel of an eighth configuration.

FIG. 28 is a cross-sectional view illustrating the eighth configuration of the pixel 51. Also, FIG. 29 is a plan view illustrating the eighth configuration of the pixel 51.

In the eighth configuration of the pixel 51, the p-type layer 142 formed at the upper portion of the n+ region 141 that functions as the memory unit 68 is omitted from the seventh configuration illustrated in FIGS. 24 and 25, and instead the gate electrode 201 made of polysilicon for example is formed via the gate insulating film 202, in the same way as FIG. 13.

While the memory unit 68 is accumulating the electric charge, the negative electric potential is applied to the gate electrode 201, to reduce the dark current that occurs in the memory unit 68.

<Ninth Configuration of Pixel 51>

Figure 30:
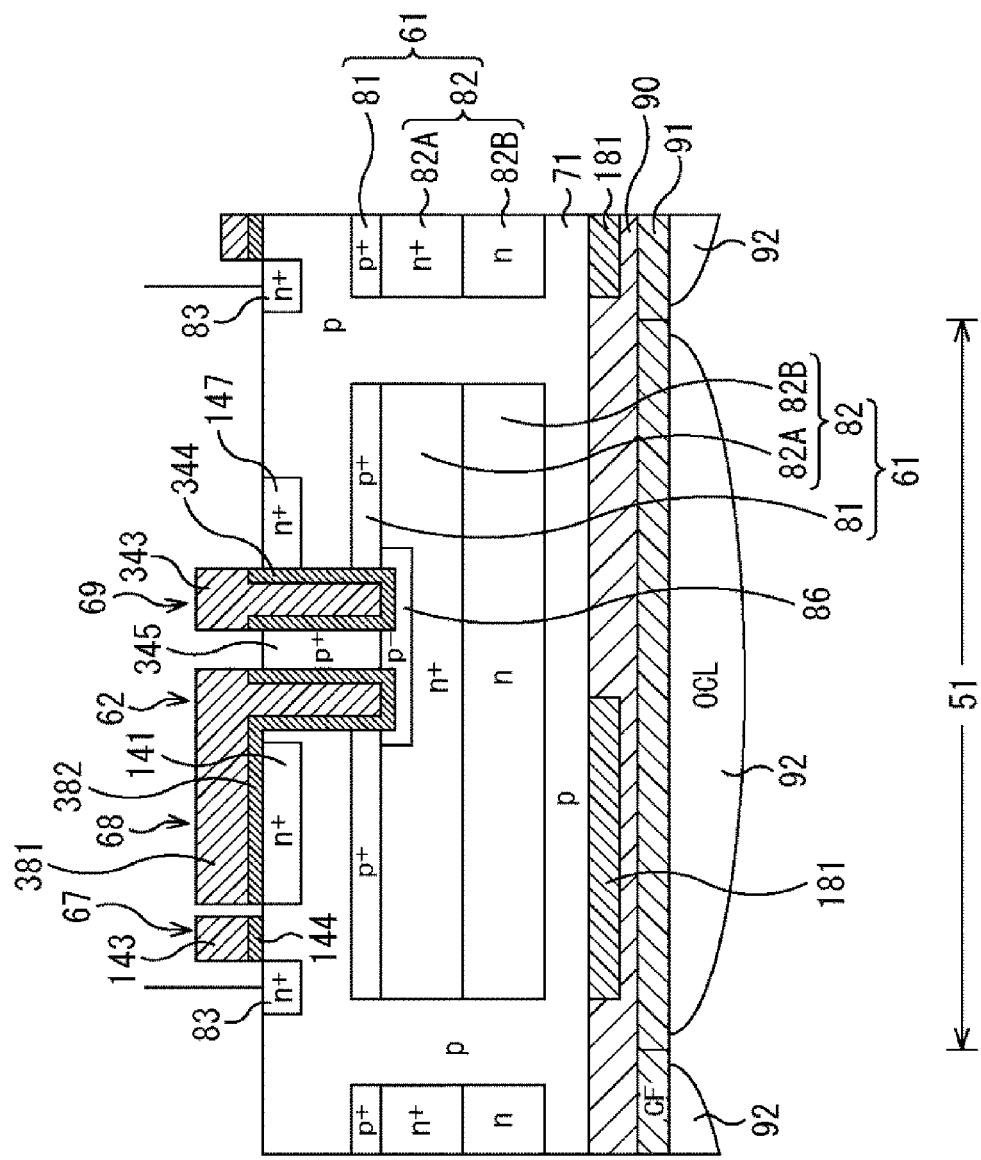
FIG. 30 is a cross-sectional view illustrating a structure of a pixel of a ninth configuration.

FIG. 30 is a cross-sectional view illustrating the ninth configuration of the pixel 51. Also, FIG. 31 is a plan view illustrating the ninth configuration of the pixel 51.

Figure 31:
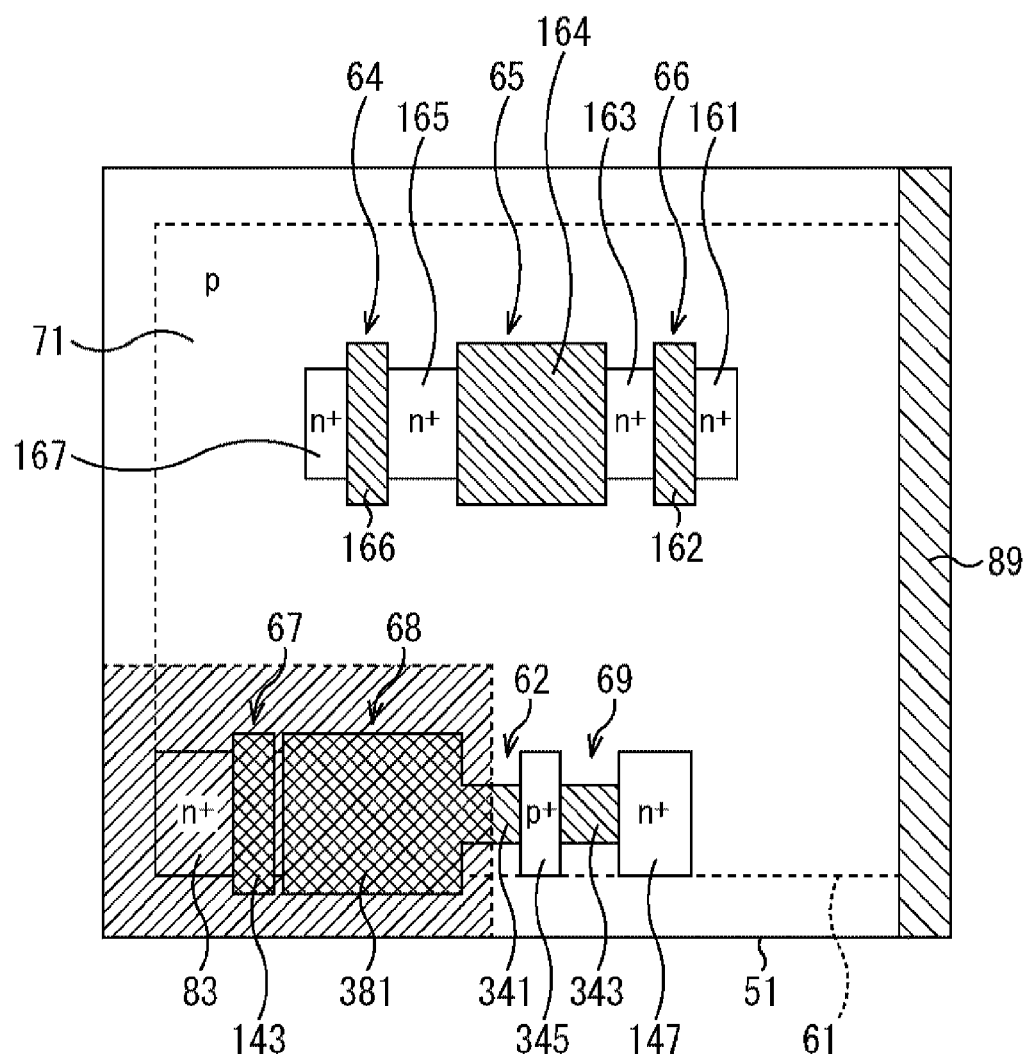
FIG. 31 is a plan view illustrating a structure of a pixel of a ninth configuration.

The pixel structure of the pixel 51 of the ninth configuration illustrated in FIGS. 30 and 31 is different in that the gate electrode 341 of the first transfer transistor 62 in FIG. 28 is integrated with the gate electrode 201 for applying the negative electric potential to the memory unit 68, as compared to the pixel structure of the eighth configuration illustrated in FIGS. 28 and 29. That is, the gate electrode 381 of the first transfer transistor 62 of the pixel 51 of the ninth configuration is formed to the upper portion of the memory unit 68, and functions as the gate electrode for applying the negative electric potential to the memory unit 68. Also, in the same way, the gate insulating film 382 located at the lower portion of the gate electrode 381 is formed such that the gate insulating film 342 in FIG. 28 is integrated with the gate insulating film 202. Thereby, the control line for applying the negative electric potential to the gate electrode 201 is omitted in FIG. 30.

<Tenth Configuration of Pixel 51>

Figure 32:
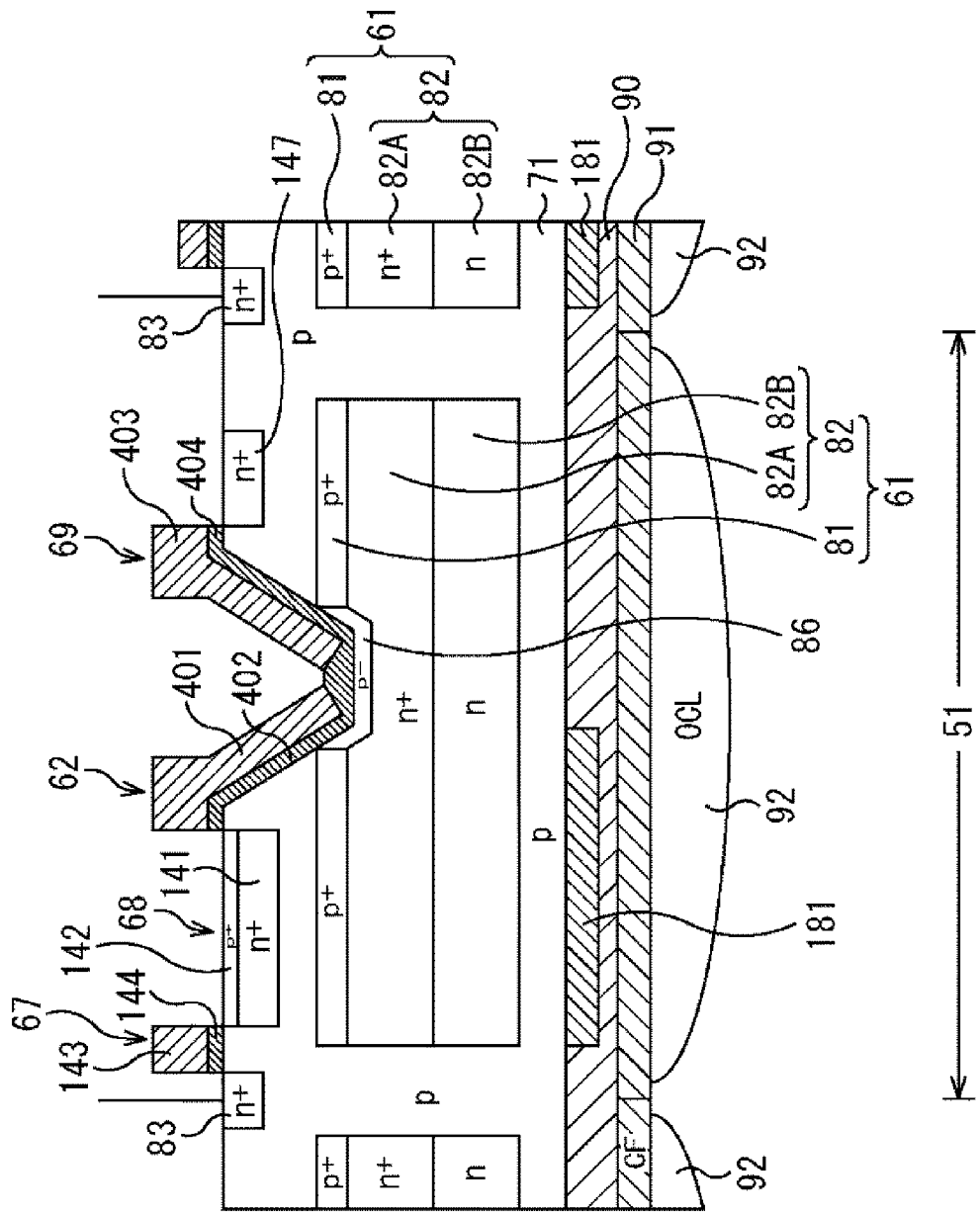
FIG. 32 is a cross-sectional view illustrating a structure of a pixel of a tenth configuration.

FIG. 32 is a cross-sectional view illustrating the tenth configuration of the pixel 51. Also, FIG. 33 is a plan view illustrating the tenth configuration of the pixel 51.

Figure 33:
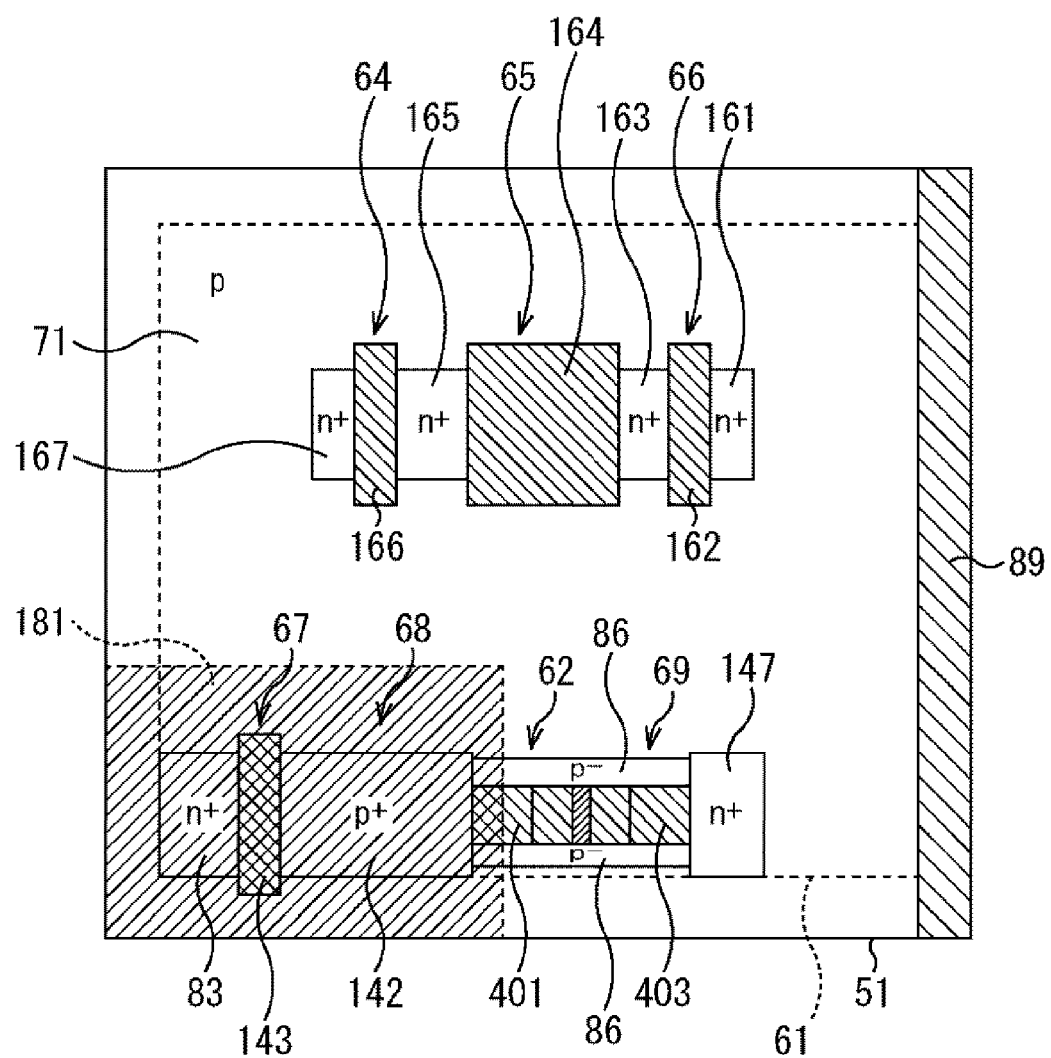
FIG. 33 is a plan view illustrating a structure of a pixel of a tenth configuration.

The pixel structure of the pixel 51 of the tenth configuration illustrated in FIGS. 32 and 33 is different in that the gate electrode 401 of the first transfer transistor 62 and the gate electrode 403 of the discharge transistor 69 are shaped in a V-shaped gate structure, as compared to the pixel structure of the seventh configuration illustrated in FIGS. 24 and 25. In more detail, the gate electrode 401 of the first transfer transistor 62 and the gate electrode 403 of the discharge transistor 69 are located at a same location at the bottom of the vicinity of the photo diode 61, but are formed diagonally so as to gradually get away as the depth becomes shallower from the surface of the semiconductor substrate 71.

The gate insulating film 402 located at the lower portion of the gate electrode 401 of the first transfer transistor 62, and the gate insulating film 40 located at the lower portion of the gate electrode 403 of the discharge transistor 69 4 are also formed diagonally in the same way.

In the plan view of FIG. 33, the p-type semiconductor region (the p+ region) 86 of the high impurity concentration is formed at the upper side and the lower side in the drawing of the gate electrode 401 of the first transfer transistor 62 and the gate electrode 403 of the discharge transistor 69.

According to this pixel structure, as understood from the plan view of FIG. 33, the gate electrode 401 and the film forming region of the gate insulating film 402 are arranged spaciously as seen from upward, and it is needless to form the gate insulating film 402 on the side face (the side wall) of a hole formed vertically and to embed the polysilicon (gate electrode 401), and therefore the manufacture of the pixel 51 is made easy.

<Eleventh Configuration of Pixel 51>

Figure 34:
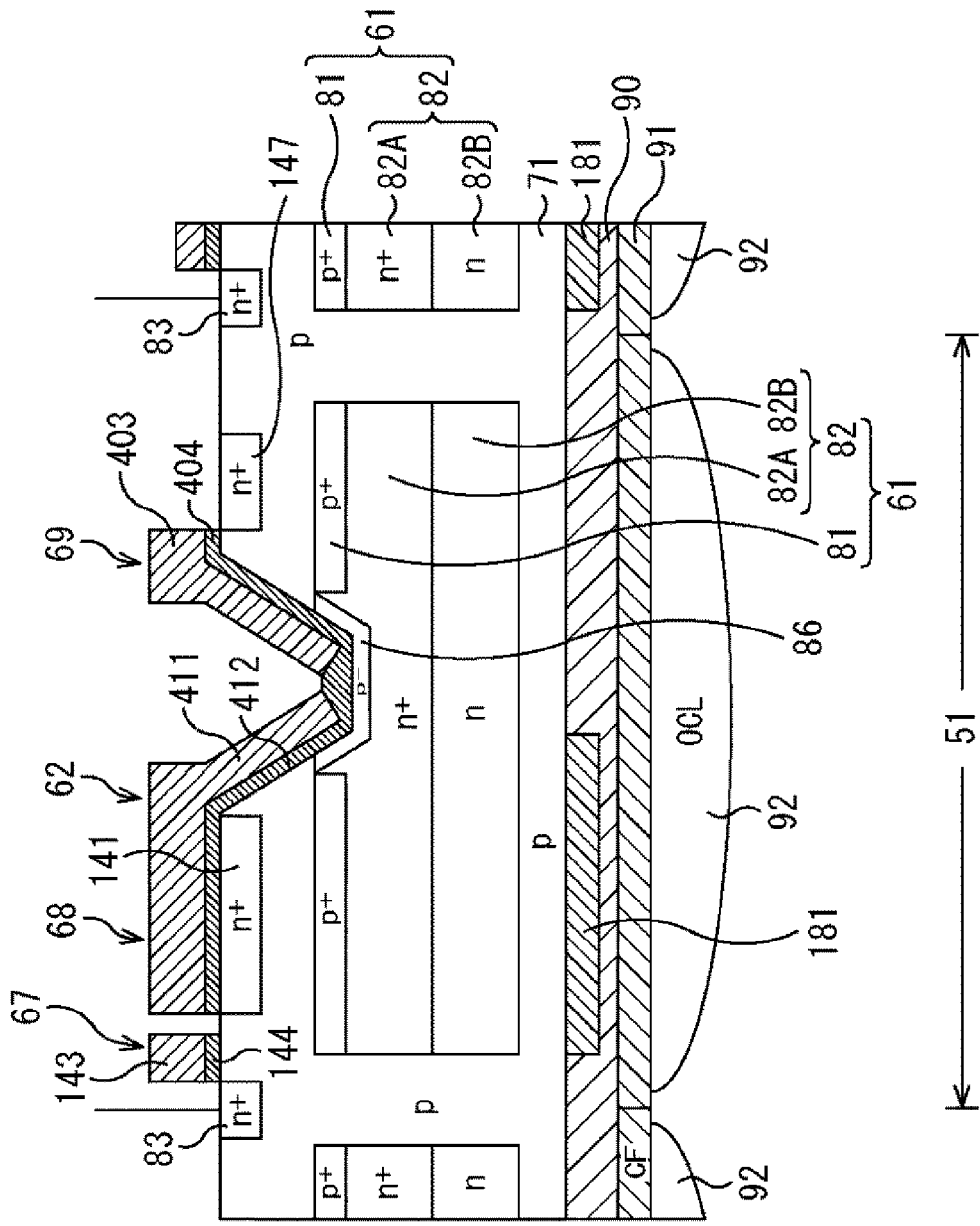
FIG. 34 is a cross-sectional view illustrating a structure of a pixel of an eleventh configuration.

FIG. 34 is a cross-sectional view illustrating the eleventh configuration of the pixel 51.

In the pixel structure of the pixel 51 of the eleventh configuration illustrated in FIG. 34, the gate electrode 411 of the first transfer transistor 62 is formed to the upper portion of the memory unit 68 and functions as the gate electrode for applying the negative electric potential to the memory unit 68, as compared to the tenth configuration illustrated in FIG. 32.

Also, the gate insulating film 412 located at the lower portion of the gate electrode 411 is formed to the upper portion of the memory unit 68 in the same way. Thereby, while the memory unit 68 is accumulating the electric charge, the negative electric potential is applied to the gate electrode 411, to reduce the dark current that occurs in the memory unit 68.

<Twelfth Configuration of Pixel 51>

Figure 35:
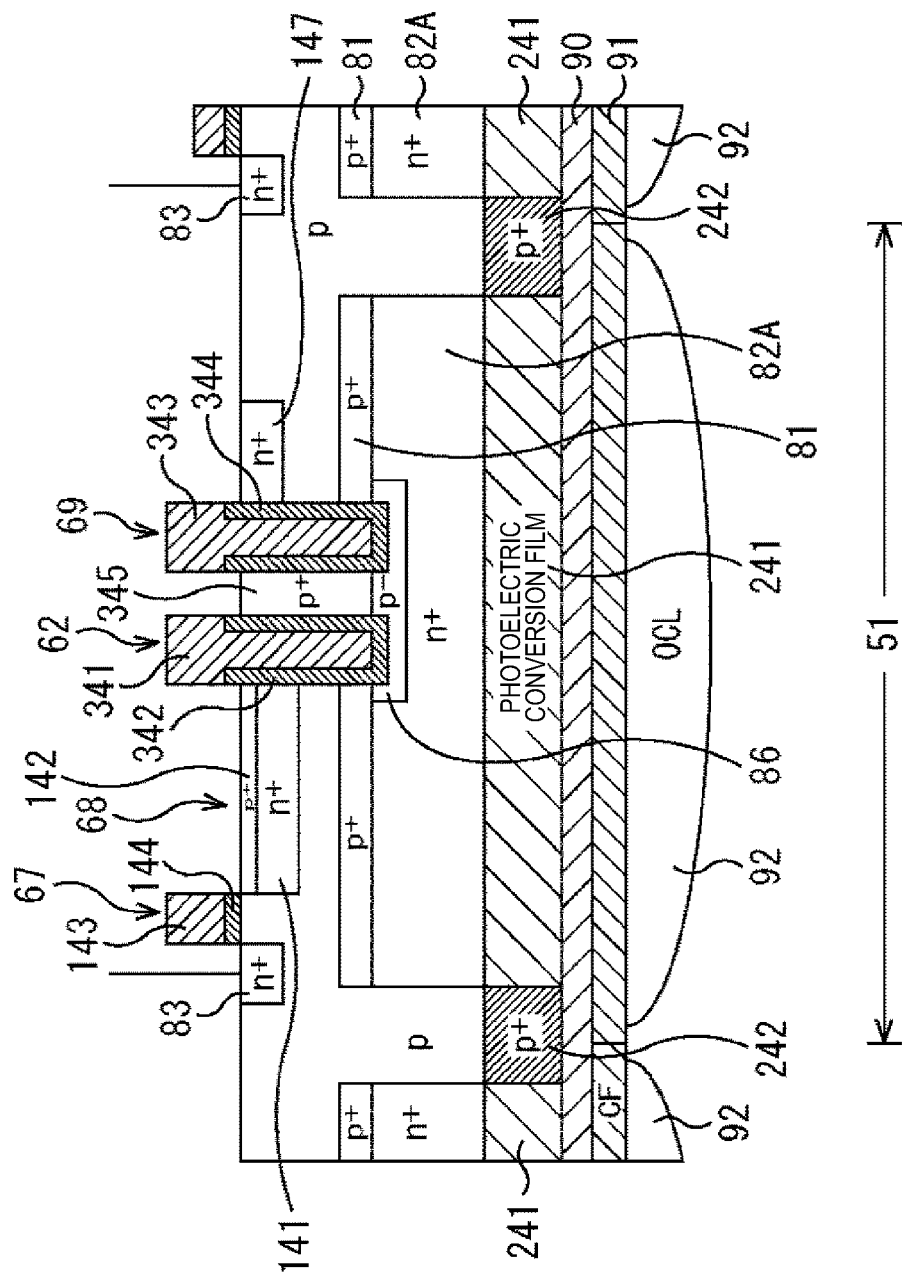
FIG. 35 is a cross-sectional view illustrating a structure of a pixel of a twelfth configuration.

FIG. 35 is a cross-sectional view illustrating the twelfth configuration of the pixel 51.

The pixel 51 of the twelfth configuration illustrated in FIG. 35 is what the configuration of the pixel 51 illustrated in FIG. 24 is changed to the configuration using the photoelectric conversion film 241.

That is, in the pixel structure of the pixel 51 of the twelfth configuration illustrated in FIG. 35, the photoelectric conversion film 241 is newly formed at the substrate back side in the same way as the sixth configuration illustrated in FIG. 17, and the n region 82B of FIG. 24 is omitted. Also, as the photoelectric conversion film 241 functions as a shading film as well, the shading film 181 is omitted in the pixel 51 of the twelfth configuration illustrated in FIG. 35. Further, the photoelectric conversion film 241 of each pixel 51 is separated by the p+ region 242.

<Thirteenth Configuration of Pixel 51>

Figure 36:
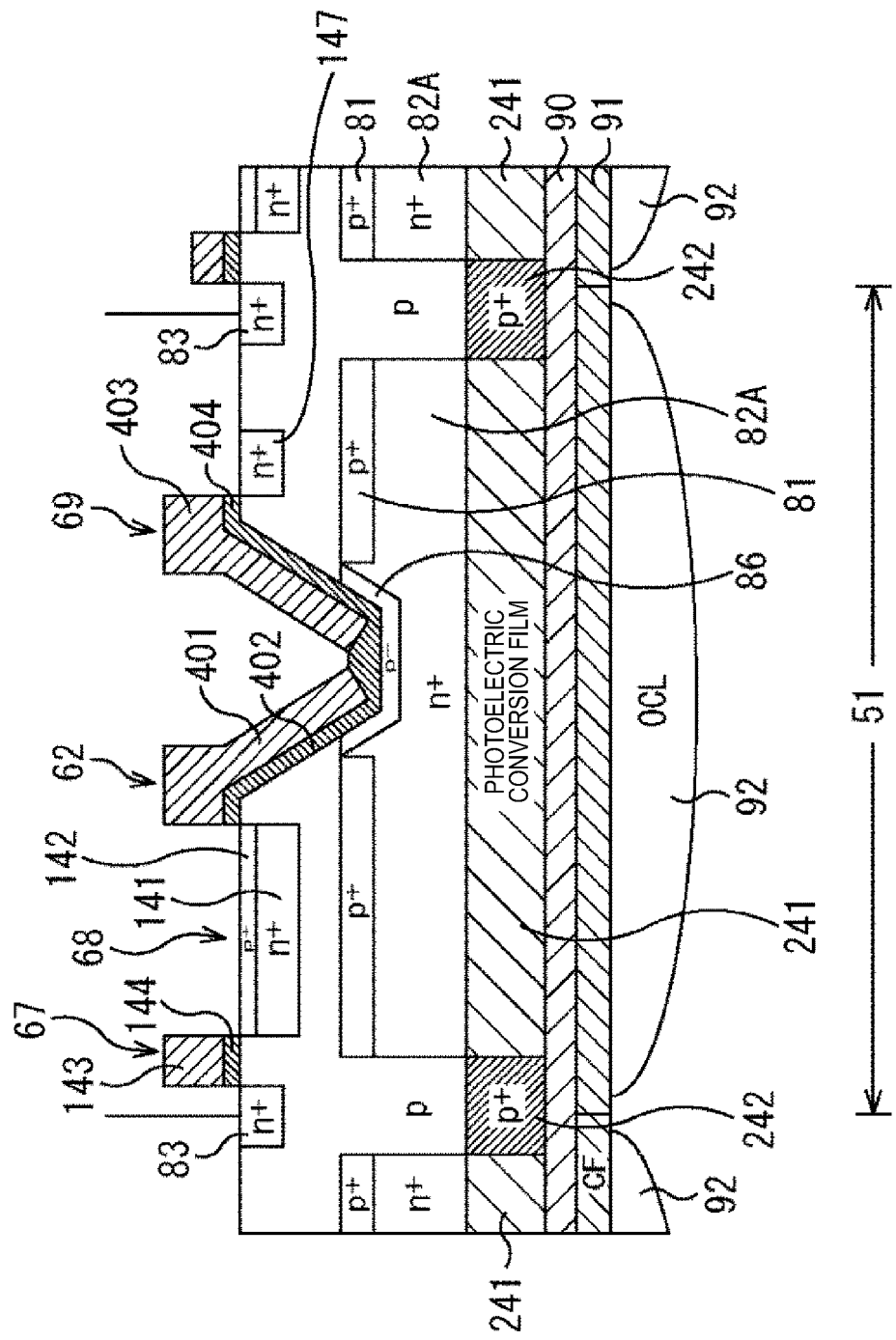
FIG. 36 is a cross-sectional view illustrating a structure of a pixel of a thirteenth configuration.

FIG. 36 is a cross-sectional view illustrating the thirteenth configuration of the pixel 51.

The pixel 51 of the thirteenth configuration illustrated in FIG. 36 is what the configuration of the pixel 51 illustrated in FIG. 32 is changed to the configuration using the photoelectric conversion film 241.

That is, in the pixel structure of the pixel 51 of the thirteenth configuration illustrated in FIG. 36, the photoelectric conversion film 241 is newly formed at the substrate back side, and the n region 82B of FIG. 32 is omitted. Also, as the photoelectric conversion film 241 functions as a shading film as well, the shading film 181 is omitted in the pixel 51 of the thirteenth configuration illustrated in FIG. 36. Further, the photoelectric conversion film 241 of each pixel 51 is separated by the p+ region 242.

<Manufacturing Method of Pixel 51 of Seventh Configuration>

Next, with reference to FIG. 37 to FIG. 39, the manufacturing method of the pixel 51 of the seventh configuration illustrated in FIG. 24 will be described.

Figure 37:
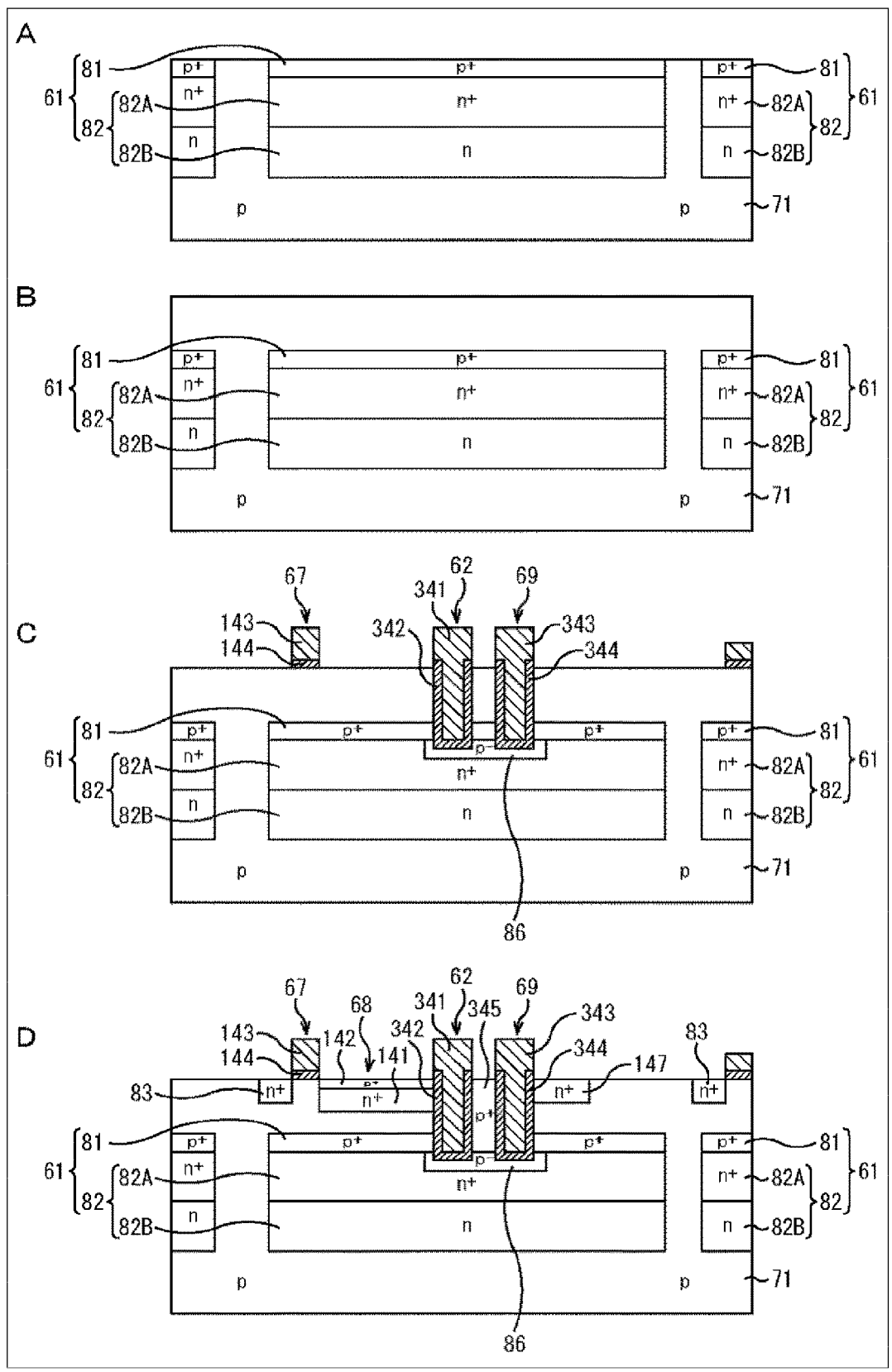
FIG. 37 is a diagram for describing a manufacturing method of a pixel of a seventh configuration.

First, as illustrated in FIG. 37 A, the photo diode 61 consisting of the p+ region 81 and the n-type semiconductor region 82 is formed in the p-type semiconductor substrate 71. The n-type semiconductor region 82 is configured by the n+ region 82A that is close to the p+ region 81 and the n region 82B that is close to the back side of the semiconductor substrate 71.

Although, in the present embodiment, the p-type semiconductor substrate 71 is used, it may be such that a p-type well region (P-Well) is formed in the n-type semiconductor substrate, using the n-type semiconductor substrate, and the photo diode 61 is formed in the well region.

Thereafter, as illustrated in FIG. 37 B, a p-type silicon layer of approximately 0.5 to 1.5 µm is formed by the epitaxial growth on the photo diode 61.

Thereafter, as illustrated in FIG. 37 C, respective gate electrodes of the first transfer transistor 62, the second transfer transistor 67, and the discharge transistor 69 are formed on the substrate surface.

Specifically, the p-type layer of the upper side than the photo diode 61 in the region in which the first transfer transistor 62 and the discharge transistor 69 are formed is etched by the dry etching method to be removed. Then, ion of p-type, such as boron, for example is doped, at the part which forms the bottom face of the removed region, to form the p− region 86. Further, after the gate insulating films 342 and 344 and the gate insulating film 146 are formed with a silicon dioxide film or the like on the inner wall of the etched and removed region, the polysilicon is embedded to form the gate electrode 341 of the first transfer transistor 62 and the gate electrode 343 of the discharge transistor 69 in parallel.

Also, the gate electrode 143 of the second transfer transistor 67 and others are formed simultaneously.

Thereafter, as illustrated in FIG. 37 D, for example, the p+ region 345 between the gate electrode 341 of the first transfer transistor 62 and the gate electrode 343 of the discharge transistor 69, and the source-drain region of each transistor such as the n+ region 147 of the discharge transistor 69 are formed on the surface of the semiconductor substrate 71. Also, the n+ region 141 as the memory unit 68 and the p-type layer 142 on the top face are formed.

Figure 38:
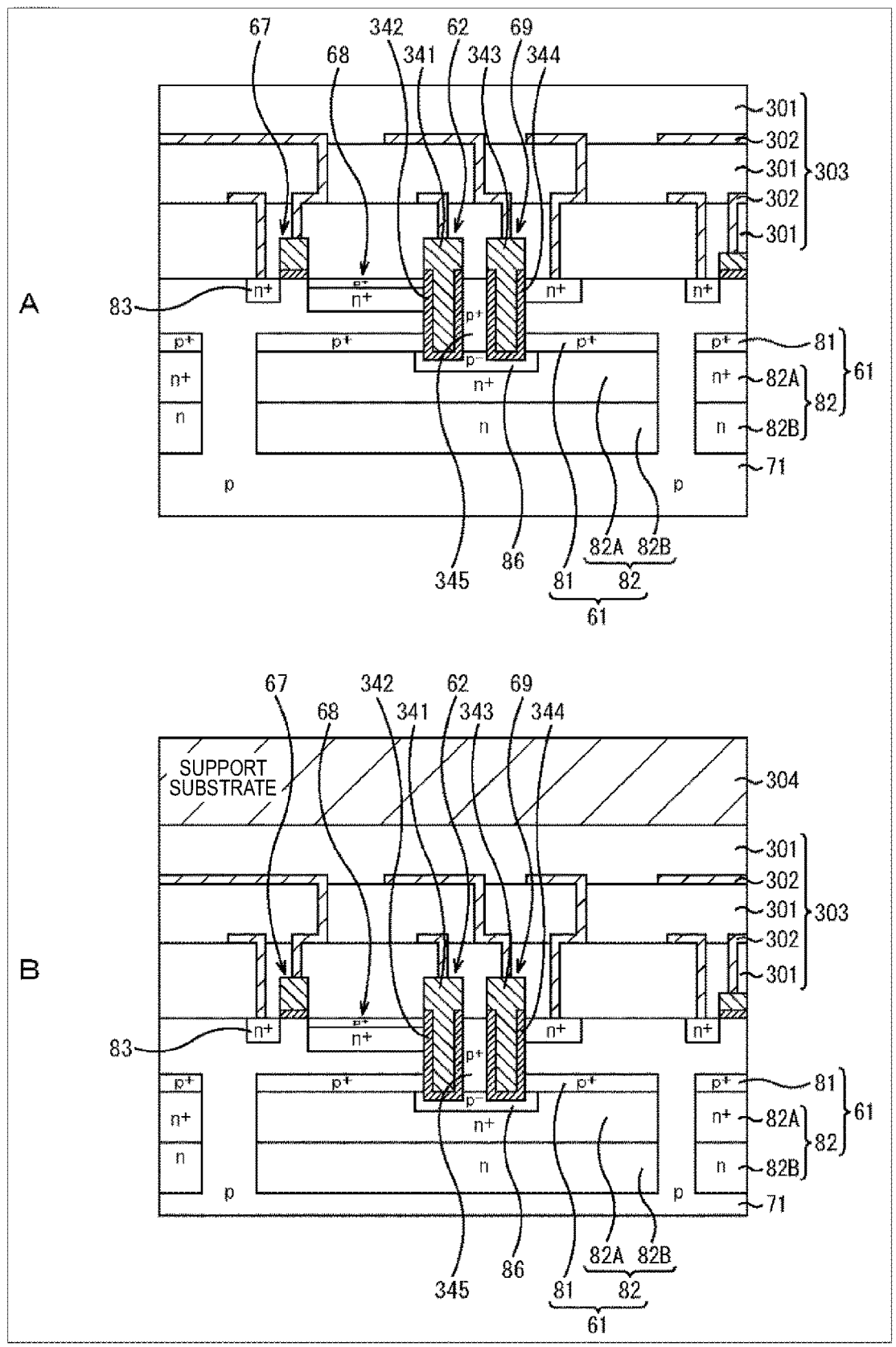
FIG. 38 is a diagram for describing a manufacturing method of a pixel of a seventh configuration.

Thereafter, as illustrated in FIG. 38 A, a connection wire layer 303 including a plurality of interlayer films 301 and a plurality of metal lines 302 made of tungsten, aluminium, or the like is formed at the front side of the semiconductor substrate 71.

Then, as illustrated in FIG. 38 B, after a support substrate 304 is pasted at the upper portion of the connection wire layer 303, the back side of the semiconductor substrate 71 is polished to make the depth to the photo diode 61 at approximately 1 µm to 5 µm, in order to make it a thin film.

Figure 39:
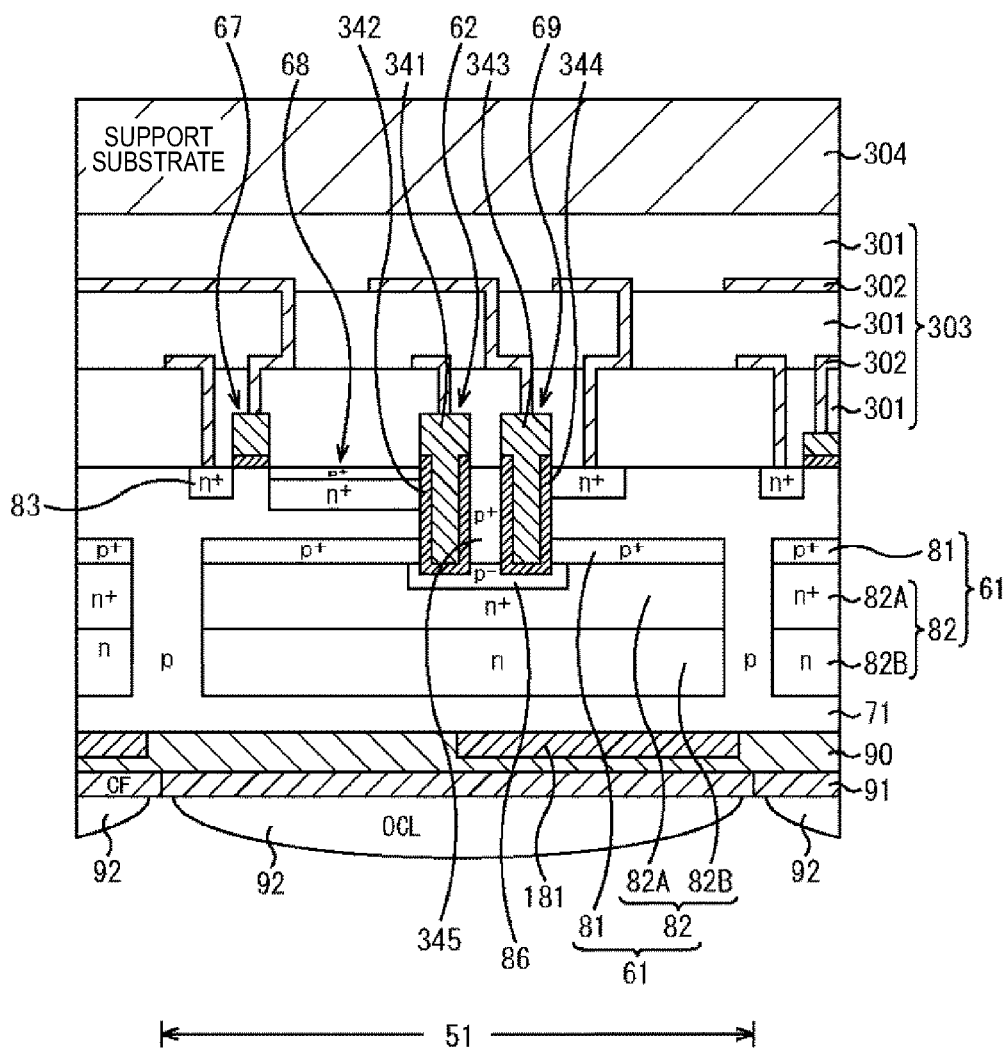
FIG. 39 is a diagram for describing a manufacturing method of a pixel of a seventh configuration.

Thereafter, as illustrated in FIG. 39, the shading film 181, the flattening film 90, the color filter 91, and the on-chip lens (OCL) 92 are formed in this order, at the thinned back side of the semiconductor substrate 71.

The pixel 51 of the seventh configuration is produced by the above processes.

<Manufacturing Method of Pixel 51 of Tenth Configuration>

Next, with reference to FIG. 40, the manufacturing method of the gate electrode of the pixel 51 of the tenth configuration of FIG. 32 which employs a V-shaped gate structure will be described.

Figure 40:
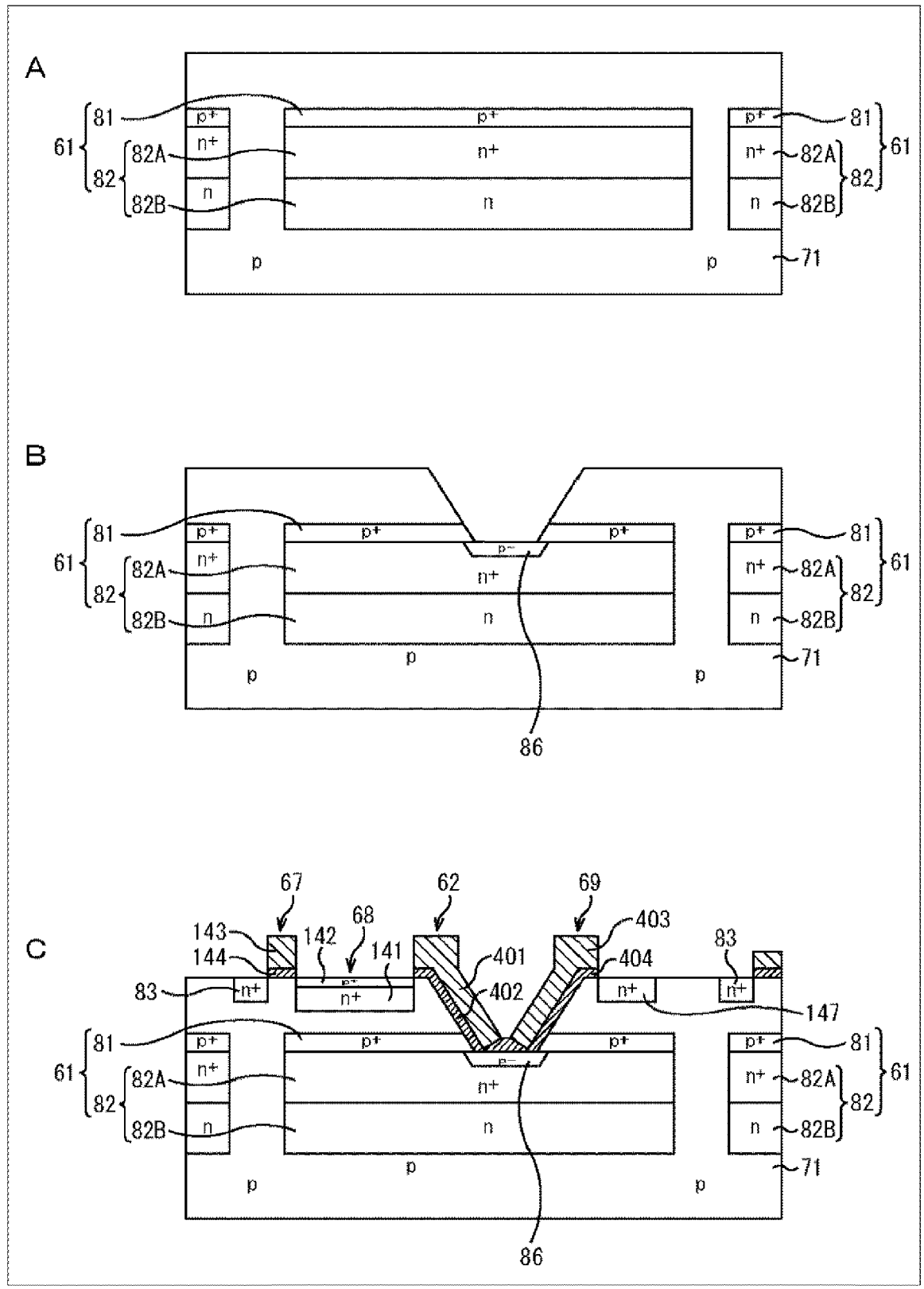
FIG. 40 is a diagram for describing a manufacturing method of a pixel of a tenth configuration.

First, as illustrated in FIG. 40 A, after the photo diode 61 consisting of the p+ region 81 and the n-type semiconductor region 82 are formed in the p-type semiconductor substrate 71, the p-type silicon layer of approximately 0.5 to 1.5 µm is formed on the photo diode 61 by the epitaxial growth.

Thereafter, as illustrated in FIG. 40 B, the p-type layer of the upper side than the photo diode 61 of the region in which the first transfer transistor 62 and the discharge transistor 69 are formed in a V-shaped and etched by the dry etching method to be removed. Then, ion of p-type, such as boron for example, is doped in the part which forms the bottom face of the removed region, to form the p− region 86.

Thereafter, as illustrated in FIG. 40 C, the gate insulating films 402 and 404 are formed in the removed V-shaped region of the semiconductor substrate 71, using the thermal oxidation method or the deposition method, and thereafter the gate electrode 401 of the first transfer transistor 62 and the gate electrode 403 of the discharge transistor 69 are further formed. The gate electrode 401 of the first transfer transistor 62 and the gate electrode 403 of the discharge transistor 69 are created by forming polysilicon which is the material, patterning in the gate electrode shape using the photolithography method, and dry etching.

Also, other transistors in which the polysilicon is formed on only the surface of the semiconductor substrate 71, such as the gate electrode 143 of the second transfer transistor 67, are formed simultaneously.

Thereafter, for example, the source-drain region of each transistor such as the n+ region 147 of the discharge transistor 69, and the n+ region 141 as the memory unit 68 and the p-type layer 142 on the top face, are formed on the surface of the semiconductor substrate 71.

The following manufacturing method is same as the method described with reference to FIGS. 38 and 39.

In the seventh to thirteenth configurations of the above pixel 51, the gate electrode 341 (or 401) of the first transfer transistor 62 and the gate electrode 343 (or 403) of the discharge transistor 69 are located at the part where the carrier energy of the photo diode 61 becomes lowest. Thereby, the electric charge accumulated in the photo diode 61 is transferred efficiently, when transferred to either one of the memory unit 68 and the n+ region 147.

Note that the part where the carrier energy of the photo diode 61 becomes lowest corresponds to the part where the electric potential becomes highest in the above structure of a solid state image sensor in which electron is signal electric charge, and corresponds to the part where the electric potential becomes lowest in the structure of a solid state image sensor in which electron hole (hole) is signal electric charge.

Also, in the above example, when the ion is doped uniformly in the creation region of the photo diode 61 in the plan view direction, the center portion of the photo diode 61 is the part where the carrier energy becomes lowest, and therefore the gate electrode 341 (or 401) of the first transfer transistor 62 and the gate electrode 343 (or 403) of the discharge transistor 69 are located at the position.

However, in the process for forming the photo diode 61, a predetermined position other than the center portion of the photo diode 61 may be set as the part where the carrier energy becomes lowest, by changing the concentration distribution of the impurity concentration of the n-type semiconductor region 82. Thus, the gate electrode 341 (or 401)

of the first transfer transistor 62 and the gate electrode 343 (or 403) of the discharge transistor 69 are located at desired positions.

Also, in the above example, the solid state image sensing device in which the first conductivity type is the p type, and the second conductivity type is n type, and the electron is the signal electric charge has been described, but the present technology may be applied to a solid state image sensing device in which the electron hole is the signal electric charge. That is, each aforementioned semiconductor region may be configured by the semiconductor region of the opposite conductivity type in which the first conductivity type is n type, and the second conductivity type is p type.

<Exemplary Configuration of Electronic Device Employing Present Technology>

Further, the present technology is not limited to the application to the solid state image sensor. That is, the present technology is generally applicable to an electronic device using a solid state image sensor in an image acquiring unit (photoelectric conversion unit), including an image sensing device such as a digital still camera and a video camera, a portable terminal device having an image sensing function, and a copy machine using a solid state image sensor in an image reading unit. The solid state image sensor may be formed as one chip, or may be formed in a module having an image sensing function in which the imaging unit and the signal processing unit or the optical system are packaged together.

Figure 41:
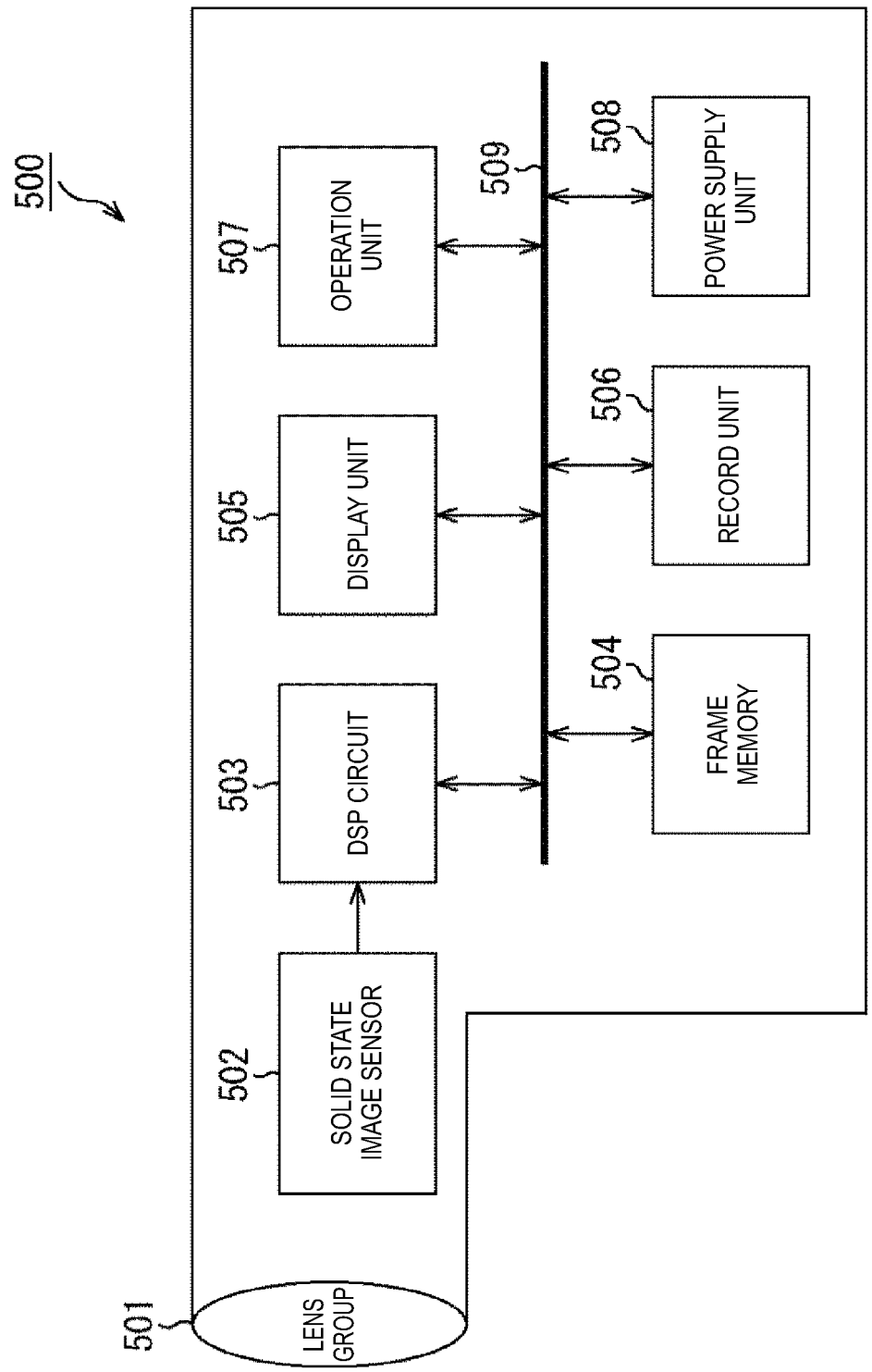
FIG. 41 is a block diagram illustrating an exemplary configuration of an image sensing device as an electronic device employing the present technology.

FIG. 41 is a block diagram illustrating the exemplary configuration of the image sensing device, as the electronic device employing the present technology.

An image sensing device 500 of FIG. 41 includes an optical unit 501 consisting of a lens group and others, a solid state image sensor (imaging device) 502 employing each configuration of the above pixel 51, and a digital signal processor (DSP) circuit 503 which is a camera signal processing circuit. Also, the image sensing device 500 includes a frame memory 504, a display unit 505, a record unit 506, an operation unit 507, and a power supply unit 508. The DSP circuit 503, the frame memory 504, the display unit 505, the record unit 506, the operation unit 507, and the power supply unit 508 are connected to each other via a bus line 509.

The optical unit 501 receives an incident light (image light) from a subject, and forms an image on the image capturing face of the solid state image sensor 502. The solid state image sensor 502 converts the light amount of the incident light for which an image is formed on the image capturing face by the optical unit 501, to the electrical signal for each pixel, and outputs it as a pixel signal. As this solid state image sensor 502, the solid state image sensor 41 of FIG. 3 may be used.

The display unit 505 is, for example, a panel display device, such as a liquid crystal panel and an organic electro luminescence (EL) panel, and displays a moving image or a still image captured by the solid state image sensor 502. The record unit 506 records the moving image or the still image captured by the solid state image sensor 502, in a recording medium, such as a hard disk and a semiconductor memory.

Under the operation by a user, the operation unit 507 issues an operation instruction with respect to various functions of the image sensing device 500. The power supply unit 508 provides various types of power supply as the operation power supply of the DSP circuit 503, the frame memory 504, the display unit 505, the record unit 506, and the operation unit 507, to these supply targets as appropriate.

Also, the present technology is not limited to the application to the solid state image sensor that detects and captures the distribution of the incident light amount of the visible light as an image, but may be generally applicable to solid state image sensors (physical quantity distribution detecting devices), such as a solid state image sensor that captures the image of the distribution of incident amount of infrared ray, X ray, particles, and the like, and a fingerprint detection sensor that detects and captures the distribution of other physical quantities such as pressure and electrostatic capacitance as an image, in a broad sense.

The embodiments of the present technology are not limited to the above embodiments, but may be variously changed in a scope not departing from the spirit of the present technology, e.g., parts of configurations of the above pixels may be combined as necessary as appropriate.

Additionally, the present technology may also be configured as below.

(1)

A solid state image sensor including:

a photoelectric conversion unit formed and embedded in a semiconductor substrate;

an impurity region that retains an electric charge generated by the photoelectric conversion unit; and a transfer transistor that transfers the electric charge to the impurity region, wherein a gate electrode of the transfer transistor is formed in a depth direction toward the photoelectric conversion unit in the semiconductor substrate, from a surface of the semiconductor substrate on which the impurity region is formed, and wherein a channel portion of the transfer transistor is surrounded by the gate electrode in two or more directions other than a direction of the impurity region, as seen from the depth direction.

(2)

The solid state image sensor according to (1), wherein the photoelectric conversion unit is a photo diode, and the gate electrode of the transfer transistor is formed to a position identical with a p-n junction plane of the photo diode or deeper than the p-n junction plane.

(3)

The solid state image sensor according to (1) or (2), wherein an impurity concentration of the channel portion of the transfer transistor surrounded by the gate electrode in two or more directions is lower than an impurity concentration at an outside of the gate electrode.

(4)

The solid state image sensor according to any of (1) to (3), wherein a separation region is formed by an insulator, in an opposite region to the impurity region, as seen from the gate electrode.

(5)

The solid state image sensor according to any of (1) to (4), wherein the gate electrode of the transfer transistor is formed in a U shape which opens in a direction of the impurity region, as seen from the depth direction.

(6)

The solid state image sensor according to any of (1) to (5), wherein the impurity region is a memory unit that temporarily retains the electric charge before transferring the electric charge to a floating diffusion region, and in an upper portion of the memory unit, a gate electrode to which a predetermined voltage is applied is formed, in addition to the gate electrode of the transfer transistor.

(7)

A manufacturing method of a solid state image sensor, the manufacturing method including the steps of:

forming a photoelectric conversion unit by embedding the photoelectric conversion unit in a semiconductor substrate;

forming a gate electrode of a transfer transistor that transfers an electric charge generated by the photoelectric conversion unit, in a depth direction toward the photoelectric conversion unit in the semiconductor substrate, from a surface of the semiconductor substrate; and forming an impurity region that retains the electric charge transferred by the transfer transistor, on the surface of the semiconductor substrate, wherein a channel portion of the transfer transistor is surrounded by the gate electrode in two or more directions other than a direction of the impurity region, as seen from the depth direction.

(8)

An electronic device including:

a solid state image sensor including a photoelectric conversion unit formed and embedded in a semiconductor substrate, an impurity region that retains an electric charge generated by the photoelectric conversion unit, and a transfer transistor that transfers the electric charge to the impurity region, wherein a gate electrode of the transfer transistor is formed in a depth direction toward the photoelectric conversion unit in the semiconductor substrate, from a surface of the semiconductor substrate on which the impurity region is formed, and wherein a channel portion of the transfer transistor is surrounded by the gate electrode in two or more directions other than a direction of the impurity region, as seen from the depth direction.

(9)

A solid state image sensor including:

a photoelectric conversion unit formed and embedded in a semiconductor substrate;

a memory unit that retains an electric charge generated by the photoelectric conversion unit;

a transfer transistor that transfers the electric charge to the memory unit; and a discharge transistor that discharges an unnecessary electric charge generated by the photoelectric conversion unit, wherein a gate electrode of the transfer transistor and a gate electrode of the discharge transistor are adjacent to each other in parallel in a depth direction of the semiconductor substrate, via an insulating film or an impurity region having a higher impurity concentration than a channel portion which forms an electrical current path.

(10)

The solid state image sensor according to (9), wherein the photoelectric conversion unit is a photo diode, and the gate electrodes of the transfer transistor and the discharge transistor are formed to a position identical with a p-n junction plane of the photo diode or deeper than the p-n junction plane.

(11)

The solid state image sensor according to (10), wherein the gate electrodes of the transfer transistor and the discharge transistor are connected to a part at which a carrier energy becomes lowest on a formation plane of the photodiode.

(12)

The solid state image sensor according to any of (9) to (11), wherein a photoelectric conversion film formed with a material having a larger light absorption coefficient than the semiconductor substrate is located at a back side of the semiconductor substrate.

(13)

A manufacturing method of a solid state image sensor, the manufacturing method including the steps of:

forming a photoelectric conversion unit by embedding the photoelectric conversion unit in a semiconductor substrate;

forming a gate electrode of a transfer transistor that transfers to a memory unit an electric charge generated by the photoelectric conversion unit, and a gate electrode of a discharge transistor that discharges an unnecessary electric charge generated by the photoelectric conversion unit, in parallel in a depth direction from a surface of the semiconductor substrate, toward the photoelectric conversion unit in the semiconductor substrate; and forming an insulating film or an impurity region having a higher impurity concentration than a channel portion which forms an electrical current path, between the gate electrode of the transfer transistor and the gate electrode of the discharge transistor.

(14)

An electronic device including:

a solid state image sensor including a photoelectric conversion unit formed and embedded in a semiconductor substrate, a memory unit that retains an electric charge generated by the photoelectric conversion unit, a transfer transistor that transfers the electric charge to the memory unit, and a discharge transistor that discharges an unnecessary electric charge generated by the photoelectric conversion unit, wherein a gate electrode of the transfer transistor and a gate electrode of the discharge transistor are adjacent to each other in parallel in a depth direction of the semiconductor substrate, via an insulating film or an impurity region having a higher impurity concentration than a channel portion which forms an electrical current path.

(15)

A solid state image sensor including:

a photoelectric conversion unit formed and embedded in a semiconductor substrate;

a memory unit that retains an electric charge generated by the photoelectric conversion unit;

a transfer transistor that transfers the electric charge to the memory unit; and a discharge transistor that discharges an unnecessary electric charge generated by the photoelectric conversion unit, wherein end portions, close to the photoelectric conversion unit, of a gate electrode of the transfer transistor and a gate electrode of the discharge transistor are located at adjacent positions in a formation plane of the photoelectric conversion unit, and wherein as a depth from a surface of the semiconductor substrate becomes shallower, the gate electrode of the transfer transistor and the gate electrode of the discharge transistor gradually get away from each other.

(16)

The solid state image sensor according to (15), wherein the photoelectric conversion unit is a photo diode, and the gate electrodes of the transfer transistor and the discharge transistor are formed to a position identical with a p-n junction plane of the photo diode or deeper than the p-n junction plane.

(17)

The solid state image sensor according to (16), wherein the gate electrodes of the transfer transistor and the discharge transistor are connected to a part at which a carrier energy becomes lowest on a formation plane of the photodiode.

(18)

The solid state image sensor according to any of (15) to (17), wherein a photoelectric conversion film formed with a material having a larger light absorption coefficient than the semiconductor substrate is located at a back side of the semiconductor substrate.

(19)

A manufacturing method of a solid state image sensor, the manufacturing method including the steps of:

forming a photoelectric conversion unit by embedding the photoelectric conversion unit in a semiconductor substrate; and forming a gate electrode of a transfer transistor that transfers to a memory unit an electric charge generated by the photoelectric conversion unit, and a gate electrode of a discharge transistor that discharges an unnecessary electric charge generated by the photoelectric conversion unit, in a depth direction from a surface of the semiconductor substrate, toward the photoelectric conversion unit in the semiconductor substrate, wherein end portions, close to the photoelectric conversion unit, of the gate electrode of the transfer transistor and the gate electrode of the discharge transistor are located at adjacent positions in a formation plane of the photoelectric conversion unit, and wherein as a depth from the surface of the semiconductor substrate becomes shallower, the gate electrode of the transfer transistor and the gate electrode of the discharge transistor gradually get away from each other.

(20)

An electronic device including:

a solid state image sensor including a photoelectric conversion unit formed and embedded in a semiconductor substrate, a memory unit that retains an electric charge generated by the photoelectric conversion unit, a transfer transistor that transfers the electric charge to the memory unit, and a discharge transistor that discharges an unnecessary electric charge generated by the photoelectric conversion unit, wherein end portions, close to the photoelectric conversion unit, of a gate electrode of the transfer transistor and a gate electrode of the discharge transistor are located at adjacent positions in a formation plane of the photoelectric conversion unit, and wherein as a depth from a surface of the semiconductor substrate becomes shallower, the gate electrode of the transfer transistor and the gate electrode of the discharge transistor gradually get away from each other.

REFERENCE SIGNS LIST 41 solid state image sensor
44 pixel array unit
51 pixel
61 photo diode
62 transfer transistor
63 FD (floating diffusion region)
64 reset transistor
68 memory unit (MEM)
69 discharge transistor
71 semiconductor substrate
83 n+ region
84 gate electrode
89 separation region
121 p+ region
201 gate electrode
241 photoelectric conversion film
343 gate electrode
361 separation region
500 image sensing device
502 solid state image sensor

The invention claimed is:

1. A solid state image sensor, comprising:
a photoelectric conversion unit configured to generate an electric charge, wherein the photoelectric conversion unit is embedded in a semiconductor substrate;
a first impurity region of a first conductivity type configured to retain the generated electric charge;
a separation region;
a transfer transistor configured to transfer the generated electric charge to the first impurity region of the first conductivity type, wherein:
the transfer transistor comprises a gate electrode and a channel portion,
the gate electrode is embedded in a depth direction from a top surface of the semiconductor substrate to the photoelectric conversion unit in the semiconductor substrate,
the first impurity region of the first conductivity type is on a first side of the gate electrode,
the channel portion is surrounded by three sides of the gate electrode,
the three sides include a second side of the gate electrode, a third side of the gate electrode, and a fourth side of the gate electrode opposite to the third side,
the second side, the third side, and the fourth side of the gate electrode are covered by a gate insulating film,
the separation region is on the second side of the gate electrode opposite to the first side of the gate electrode,
the separation region is in direct contact with the gate insulating film on the second side of the gate electrode,
the separation region is not in direct contact with the gate insulating film on each of the third side and the fourth side of the gate electrode,
the separation region is not in direct contact with the first side of the gate electrode, and
the gate electrode of the transfer transistor is embedded to a position corresponding to a p-n junction plane of the photoelectric conversion unit; and second impurity regions of a second conductivity type on both the third side and the fourth side of the gate electrode, wherein the separation region is in direct contact with the second impurity regions on the third side and the fourth side of the gate electrode.

2. The solid state image sensor according to claim 1, wherein
the photoelectric conversion unit is a photo diode, and
the gate electrode of the transfer transistor is embedded at the position that is one of identical with the p-n junction plane of the photo diode or deeper than the p-n junction plane of the photo diode.

3. The solid state image sensor according to claim 1, wherein the separation region corresponds to an insulator.

4. The solid state image sensor according to claim 1, wherein
the gate electrode of the transfer transistor is in a U shape which opens on the first side of the gate electrode on opposite to the photoelectric conversion unit, and
the first impurity region of the first conductivity type serves as a floating diffusion in an opening direction of the U shape of the gate electrode.

5. The solid state image sensor according to claim 1, wherein
the first impurity region is a memory unit that temporarily retains the electric charge before transferring the electric charge to a floating diffusion region, and
in an upper portion of the memory unit, a gate electrode to which a predetermined voltage is applied is formed, in addition to the gate electrode of the transfer transistor.

6. The solid state image sensor according to claim 1, wherein
a first impurity concentration of the channel portion is lower than a second impurity concentration of the second impurity regions, and
the second impurity regions are in contact with the gate insulating film on the third side and the fourth side of the gate electrode.

7. The solid state image sensor according to claim 1, wherein
the gate electrode of the transfer transistor has two plates in a funnel shape,
an interval between the two plates is wider on the first side of the gate electrode than the second side of the gate electrode, and
the first impurity region of the first conductivity type is in an opening direction of the funnel shape of the gate electrode.

8. The solid state image sensor according to claim 1, wherein the third side of the gate electrode is perpendicular to the first side of the gate electrode.

9. The solid state image sensor according to claim 7, wherein
a portion of the gate electrode that is not covered by the gate insulating film is in direct contact with the separation region on the second side of the gate electrode.

10. An electronic device, comprising:
a solid state image sensor including:
a photoelectric conversion unit configured to generate an electric charge, wherein the photoelectric conversion unit is embedded in a semiconductor substrate;
a first impurity region of a first conductivity type configured to retain the generated electric charge;
a separation region;
a transfer transistor configured to transfer the generated electric charge to the first impurity region of the first conductivity type, wherein:
the transfer transistor comprises a gate electrode and a channel portion,
the gate electrode is embedded in a depth direction from a top surface of the semiconductor substrate to the photoelectric conversion unit in the semiconductor substrate,
the first impurity region of the first conductivity type is on a first side of the gate electrode,
the channel portion is surrounded by three sides of the gate electrode,
the three sides include a second side of the gate electrode, a third side of the gate electrode, and a fourth side of the gate electrode opposite to the third side,
the second side, the third side, and the fourth side of the gate electrode are covered by a gate insulating film,
the separation region is on the second side of the gate electrode opposite to the first side of the gate electrode,
the separation region is in direct contact with the gate insulating film on the second side of the gate electrode,
the separation region is not in direct contact with the gate insulating film on each of the third side and the fourth side of the gate electrode,
the separation region is not in direct contact with the first side of the gate electrode, and
the gate electrode of the transfer transistor is embedded to a position corresponding to a p-n junction plane of the photoelectric conversion unit; and
second impurity regions of a second conductivity type at both the third side and the fourth side of the gate electrode, wherein the separation region is in direct contact with the second impurity regions on the third side and the fourth side of the gate electrode.

* * * * *